(12) United States Patent
Huang et al.

(10) Patent No.: US 11,489,018 B2
(45) Date of Patent: Nov. 1, 2022

(54) ELECTROLUMINESCENT DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yao Huang, Beijing (CN); Weiyun Huang, Beijing (CN); Yue Long, Beijing (CN); Chao Zeng, Beijing (CN); Meng Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 9 days.

(21) Appl. No.: 17/156,802

(22) Filed: Jan. 25, 2021

(65) Prior Publication Data
US 2021/0159284 A1 May 27, 2021

Related U.S. Application Data

(63) Continuation of application No. 16/954,924, filed as application No. PCT/CN2019/098731 on Jul. 31, 2019.

(51) Int. Cl.
*H01L 27/32* (2006.01)
*G09G 3/3225* (2016.01)
*G09G 3/3208* (2016.01)

(52) U.S. Cl.
CPC ....... *H01L 27/3218* (2013.01); *G09G 3/3208* (2013.01); *G09G 3/3225* (2013.01); *H01L 27/3216* (2013.01); *H01L 27/3276* (2013.01)

(58) Field of Classification Search
CPC ............ H01L 27/3218; H01L 27/3216; H01L 27/3276; H01L 51/5212; H01L 27/3262;
(Continued)

(56) References Cited

U.S. PATENT DOCUMENTS 7,355,342 B2  4/2008  Hayashi
7,420,212 B2  9/2008  Kim et al.
(Continued)

FOREIGN PATENT DOCUMENTS

CN   1622716 A   6/2005
CN   1832225 A   9/2006
(Continued)

OTHER PUBLICATIONS

Australian Office Action for corresponding application AU2019279939 dated Dec. 10, 2020.
(Continued)

*Primary Examiner* — Tracie Y Green
(74) *Attorney, Agent, or Firm* — ArentFox Schiff LLP; Michael Fainberg

(57) ABSTRACT

The present disclosure discloses an electroluminescent display panel and a display device. The electroluminescent display panel includes a plurality of repeat units, each of the plurality of repeat units includes a plurality of sub-pixels, and each of the plurality of sub-pixels includes: a first conductive layer, located on a substrate; a first insulation layer, located on the first conductive layer and including a first hole, in which the first hole exposes a portion of the first conductive layer; and an anode, located on the first insulation layer and including a main portion and an auxiliary portion which are electrically connected to each other. The auxiliary portion is electrically connected to the first conductive layer through the first hole. In at least one sub-pixel, an orthographic projection of the main portion on the
(Continued)

substrate does not overlap an orthographic projection of the first hole on the substrate.

41 Claims, 23 Drawing Sheets

(58) Field of Classification Search
CPC . H01L 27/3265; H01L 27/3213; H01L 51/56; G09G 3/3208; G09G 3/3225; G09G 3/3233; G02F 1/134309
See application file for complete search history.

(56) References Cited

U.S. PATENT DOCUMENTS

| | | | |
|---|---|---|---|
| 7,714,857 B2 | 5/2010 | Fukushima et al. | |
| 8,508,438 B2 | 8/2013 | Suh | |
| 8,981,364 B2 | 3/2015 | Hong | |
| 9,262,961 B2 | 2/2016 | Shih et al. | |
| 9,947,904 B2 | 4/2018 | Sonoda et al. | |
| 10,217,802 B2 | 2/2019 | Hwang | |
| 10,304,918 B2 | 5/2019 | Lee et al. | |
| 10,403,701 B2 | 9/2019 | Koshihara et al. | |
| 10,541,294 B2 | 1/2020 | Hong et al. | |
| 10,553,145 B2 | 2/2020 | Shi | |
| 10,707,285 B2 | 7/2020 | Kwon et al. | |
| 10,790,343 B2 | 9/2020 | Chen et al. | |
| 2004/0174375 A1* | 9/2004 | Credelle | G09G 3/3607 345/589 |
| 2005/0116232 A1 | 6/2005 | Kim et al. | |
| 2006/0202611 A1 | 9/2006 | Hayashi | |
| 2010/0096988 A1 | 4/2010 | Kitabayashi et al. | |
| 2010/0283931 A1 | 11/2010 | Horiuchi et al. | |
| 2012/0161620 A1 | 6/2012 | Song et al. | |
| 2012/0293471 A1 | 11/2012 | Yoshida et al. | |
| 2014/0138634 A1 | 5/2014 | Lee et al. | |
| 2014/0353600 A1 | 12/2014 | Hong | |
| 2014/0374703 A1 | 12/2014 | Jung | |
| 2016/0133679 A1 | 5/2016 | Jeon et al. | |
| 2016/0260781 A1 | 9/2016 | Yang et al. | |
| 2016/0260792 A1 | 9/2016 | Kim et al. | |
| 2017/0069271 A1 | 3/2017 | Kim et al. | |
| 2017/0125506 A1 | 5/2017 | Kim et al. | |
| 2017/0169760 A1 | 6/2017 | Kim et al. | |
| 2017/0269762 A1 | 9/2017 | Xu et al. | |
| 2017/0307948 A1 | 10/2017 | Zeng et al. | |
| 2017/0330927 A1 | 11/2017 | Lee et al. | |
| 2017/0345877 A1 | 11/2017 | Hwang | |
| 2017/0373131 A1 | 12/2017 | Sato et al. | |
| 2018/0062102 A1 | 3/2018 | Kim | |
| 2018/0069065 A1 | 3/2018 | Chen et al. | |
| 2018/0075809 A1 | 3/2018 | Chang et al. | |
| 2018/0076273 A1 | 3/2018 | Kim et al. | |
| 2018/0090553 A1 | 3/2018 | Rieutort-Louis et al. | |
| 2018/0130401 A1* | 5/2018 | Xiang | G09G 3/2074 |
| 2018/0138255 A1 | 5/2018 | Lee et al. | |
| 2018/0197474 A1 | 7/2018 | Jeon et al. | |
| 2018/0076272 A1 | 11/2018 | Koshihara et al. | |
| 2019/0011830 A1 | 1/2019 | Ji | |
| 2019/0019966 A1 | 1/2019 | Jiang et al. | |
| 2019/0140030 A1 | 5/2019 | Huangfu et al. | |
| 2019/0140303 A1 | 5/2019 | Musick | |
| 2020/0135085 A1* | 4/2020 | Tian | G09G 5/02 |
| 2020/0258441 A1 | 8/2020 | Zhang et al. | |
| 2020/0294446 A1 | 9/2020 | Long | |
| 2020/0343477 A1 | 10/2020 | Zeng et al. | |
| 2020/0402444 A1* | 12/2020 | Yang | G09G 3/2003 |
| 2021/0159284 A1 | 5/2021 | Huang et al. | |
| 2021/0183341 A1* | 6/2021 | Shi | G09G 3/20 |
| 2021/0320166 A1 | 10/2021 | Zhao et al. | |
| 2021/0358407 A1 | 11/2021 | Xu et al. | |
| 2021/0359249 A1 | 11/2021 | Zhang et al. | |
| 2021/0383761 A1* | 12/2021 | Kim | G09G 3/3266 |
| 2021/0408203 A1 | 12/2021 | Shi et al. | |
| 2022/0020827 A1 | 1/2022 | Liu et al. | |

FOREIGN PATENT DOCUMENTS

| | | |
|---|---|---|
| CN | 103715205 A | 4/2014 |
| CN | 105518863 A | 4/2016 |
| CN | 106298851 A | 1/2017 |
| CN | 106298865 A | 1/2017 |
| CN | 107369690 A | 11/2017 |
| CN | 107452773 A | 12/2017 |
| CN | 107808625 A | 3/2018 |
| CN | 107808892 A | 3/2018 |
| CN | 107819010 A | 3/2018 |
| CN | 108074950 A | 5/2018 |
| CN | 108281114 A | 7/2018 |
| CN | 108417608 A | 8/2018 |
| CN | 207781607 A | 8/2018 |
| CN | 208173203 U | 11/2018 |
| CN | 108933155 A | 12/2018 |
| CN | 109037287 A | 12/2018 |
| CN | 208753327 U | 4/2019 |
| CN | 110010058 A | 7/2019 |
| CN | 110034132 A | 7/2019 |
| CN | 110061042 A | 7/2019 |
| KR | 1020080022448 A | 3/2008 |
| RU | 2495498 C1 | 10/2013 |
| RU | 2669521 C1 | 10/2018 |
| RU | 2681670 C1 | 3/2019 |
| RU | 2721754 C1 | 5/2020 |
| RU | 2727938 C1 | 7/2020 |
| TW | 201135703 A | 10/2011 |
| TW | 201503354 A | 1/2015 |
| TW | 201740560 A | 11/2017 |

OTHER PUBLICATIONS

Australian Office Action for corresponding application AU2019279972 dated Oct. 29, 2020.
Chinese Office Action for corresponding CN201980001210.3 dated Sep. 28, 2021.
Chinese Office Action for corresponding CN202080001420.5 dated Sep. 3, 2021.
Chinese Office Action for corresponding CN202080001429.6 dated Apr. 20, 2022.
Indian Office Action for corresponding 201947051441 dated Mar. 29, 2022.
RU2019141645 Decision on Grant and Search Report dated May 20, 2020.
TW108142291 OA1 and Notification to Grant Patent Right.
TW110101411 Notification to Grant Patent Right.
U.S. Appl. No. 17/272,777 Notice of Allowance dated Feb. 23, 2022.
International Search Report for PCTCN2019098708 dated Apr. 27, 2020.
International Search Report for PCTCN2020106413 dated Nov. 6, 2020.
International Search Report for PCTCN2020106427 dated Jan. 4, 2021.
International Search Report for PCTCN2020106429 dated Nov. 9, 2020.
Indian Office Action for corresponding application 201947050354 dated Mar. 30, 2022.
Office Action for U.S. Appl. No. 16/954,924 dated Mar. 23, 2022.
Australian Office Action for corresponding application 2019279972 dated Jul. 21, 2020.
Tiawanese Office Action for corresponding application 108143771 dated Aug. 12, 2020.
Decision of Grant for corresponding Russian application 2019141642 dated Mar. 16, 2020.
Office Action for U.S. Appl. No. 16/771,454 dated Jun. 16, 2022.
Supplemental Notice of Allowance for U.S. Appl. No. 17/272,777 dated May 31, 2022.

* cited by examiner

ELECTROLUMINESCENT DISPLAY PANEL AND DISPLAY DEVICE

CROSS-REFERENCE TO RELATED APPLICATIONS

This application is a continuation of U.S. patent application Ser. No. 16/954,924, filed Jun. 17, 2020, which is a continuation of International Application No. PCT/CN2019/098731, filed Jul. 31, 2019. The afore-mentioned patent applications are hereby incorporated by reference in their entireties.

TECHNICAL FIELD

The embodiments of the present disclosure relate to a field of display technology, and in particular, to an electroluminescent display panel and a display device.

BACKGROUND

With continuous development of display technology, an organic light emitting diode (OLED) display panel has been increasingly used in various electronic devices due to their self-illumination, wide viewing angle, high contrast, low-power consumption, and high response speed. With the increasing of people's demands for the OLED display panel, in order to achieve high-resolution design in a display panel, the OLED display panel usually adopts a SPR pixel arrangement, that is, a pixel borrowing method.

SUMMARY

An embodiment of the present disclosure provides an electroluminescent display panel, the electroluminescent display panel comprises a plurality of repeat units, each of the plurality of repeat units comprises a plurality of sub-pixels, and each of the plurality of sub-pixels comprises: a first conductive layer, located on a substrate; a first insulation layer, located on the first conductive layer and comprising a first hole, in which the first hole exposes a portion of the first conductive layer; and an anode, located on the first insulation layer and comprising a main portion and an auxiliary portion which are electrically connected to each other, in which the auxiliary portion is electrically connected to the first conductive layer through the first hole; in at least one sub-pixel of the plurality of sub-pixels, an orthographic projection of the main portion on the substrate does not overlap an orthographic projection of the first hole on the substrate; and in the at least one sub-pixel of the plurality of sub-pixels, a size of the main portion in a first direction is larger than a size of the main portion in a second direction, and in the at least one sub-pixel of the plurality of sub-pixels, the first hole and the main portion are arranged in the second direction, and the first direction is different from the second direction.

Optionally, in an embodiment of the present disclosure, the first conductive layer comprises: a first power line and first connection lines that are spaced apart from each other, in each of the plurality of sub-pixels, the auxiliary portion is electrically connected to one of the first connection lines through the first hole.

Optionally, its an embodiment of the present disclosure, the first power line comprises: a plurality of sub-power lines arranged in the first direction and extending along the second direction, and a conduction line electrically connecting the plurality of sub-power lines.

Optionally, in an embodiment of the present disclosure, the plurality of sub-power lines and the conduction line form a structure of aids, one first connection line of the first connection lines is disposed inside each of the grids, a gap is located between the one first connection line and each of the plurality of sub-power lines and between the one first connection line and the conduction line.

Optionally, in an embodiment of the present disclosure, at least one repeat unit of the plurality of repeat units comprises: a first color sub-pixel, a second color sub-pixel pair, and a third color sub-pixel which are arranged in the second direction; and the second color sub-pixel pair comprises two second color sub-pixels arranged in the first direction; the plurality of repeat units are arranged in the second direction to form repeat unit groups, and the repeat unit groups are arranged in the first direction, and repeat units in one repeat unit group of two adjacent repeat units and repeat units in other repeat unit group of the two adjacent repeat units are misaligned.

Optionally, in an embodiment of the present disclosure, each of the plurality of sub-pixels further comprises: a pixel driving circuit located on a side of the first conductive layer facing the substrate; and pixel driving circuits of the plurality of sub-pixels are arranged in an array.

Optionally, in an embodiment of the present disclosure, a first angle is formed between an extending direction of the main portion of the first color sub-pixel and a length direction of a region where the pixel driving circuit of the first color sub-pixel is located, in which the first angle is between 45 degrees and 165 degrees; a second angle is formed between an extending direction of the main portion of the third color sub-pixel and a length direction of a region where the pixel driving circuit of the third color sub-pixel is located, in which the second angle is between 45 degrees and 165 degrees; and a third angle is formed between an extending direction of the second color sub-pixel pair and a length direction of a region where pixel driving circuits of the second color sub-pixel pair are located, in which the third angle is between 45 degrees and 165 degrees.

Optionally, in an embodiment of the present disclosure, a size of a region where each layer pattern in each of the pixel driving circuits is located in the second direction is larger than a size of the region where each layer pattern in each of the pixel driving circuits is located in the first direction.

Optionally, in an embodiment of the present disclosure, one second color sub-pixel pair of two adjacent repeat unit groups are in a maximum span between a first color sub-pixel and a third color sub-pixel, which are adjacent, in other repeat unit group in the second direction.

Optionally, in an embodiment of the present disclosure, a size of the main portion of the first color sub-pixel in the second direction is smaller than a size of the main portion of the third color sub-pixel in the second direction; and a size of the main portion of the first color sub-pixel in the first direction is larger than a size of the main portion of the third color sub-pixel in the first direction.

Optionally, in an embodiment of the present disclosure, in the third color sub-pixel, an orthographic projection of the main portion on the substrate does not overlap an orthographic projection of the first hole on the substrate.

Optionally, in an embodiment of the present disclosure, in the third color sub-pixel, the main portion is an axisymmetric pattern, and the first hole is on a symmetry axis of the main portion along the second direction.

Optionally, in an embodiment of the present disclosure, in the third color sub-pixel, an orthographic projection of the main portion on the substrate does not overlap a driving transistor in the pixel driving circuit of the third color sub-pixel, the orthographic projection of the main portion on the substrate, overlaps with orthographic projections of a reset control signal line and a reset power signal line, which are electrically connected to pixel driving circuits in a next row adjacent to the pixel driving circuit of the third color sub-pixel, on the substrate, the orthographic projection of the main portion on the substrate overlaps with orthographic projections of two data lines on the substrate, and the orthographic projection of the main portion on the substrate overlaps with orthographic projections of two second power lines on the substrate.

Optionally, in an embodiment of the present disclosure, in the first color sub-pixel, an orthographic projection of the main portion on the substrate does not overlap an orthographic projection of the first hole on the substrate.

Optionally, in an embodiment of the present disclosure, in the first color sub-pixel, the main portion is an axisymmetric pattern, and the first hole is on a symmetry axis of the plain portion along the second direction.

Optionally, in an embodiment of the present disclosure, in the first color sub-pixel, the orthographic projection of the main portion on the substrate overlaps with a driving transistor in the pixel driving circuit of the first color sub-pixel, the orthographic projection of the main portion on the substrate overlaps with an orthographic projection of a light emitting control signal line, which is electrically connected to the pixel driving circuit of the first color sub-pixel, on the substrate, the orthographic projection of the main portion on the substrate overlaps with orthographic projections of two data lines on the substrate, and the orthographic projection of the main portion on the substrate overlaps with orthographic projections of two second power lines on the substrate.

Optionally, in an embodiment of the present disclosure, in each second color sub-pixel of the second color sub-pixel pair, an orthographic projection of the main portion on the substrate does not overlap an orthographic projection of the first hole on the substrate.

Optionally, in an embodiment of the present disclosure, the second color sub-pixel pair comprises a second color sub-pixel of number one and a second color sub-pixel of number two, in a same repeat unit, the first hole of the second color sub-pixel of number one is at a side of the second color sub-pixel of number one away from the third color sub-pixel; and in the same repeat unit, the first hole of the second color sub-pixel of number two is at as side of the second color sub-pixel of number two away from the third color sub-pixel.

Optionally, in an embodiment of the present disclosure, for the first color sub-pixel and the second color sub-pixel of number one in the same repeat unit, and for a third color sub-pixel that is closest to both the first color sub-pixel and the second color sub-pixel of number one in the same repeat unit, the first hole of the second color sub-pixel of number one is in a gap between the first color sub-pixel and the third color sub-pixel; and for the first color sub-pixel and the second color sub-pixel of number two in the same repeat unit, and for a third color sub-pixel that is closest to both the first color sub-pixel and the second color sub-pixel of number two in the same repeat unit, the first hole of the second color sub-pixel of number two is in a gap between, the first color sub-pixel and the third color sub-pixel.

Optionally, in an embodiment of the present disclosure, in the second color sub-pixel of number one, an orthographic projection of the main portion on the substrate does not overlap a driving, transistor in the pixel driving circuit of the second color sub-pixel of number one, and the orthographic projection of the main portion on the substrate overlaps with orthographic projections of a reset control signal line and a scan signal line, which are electrically connected to pixel driving circuits in a next row adjacent to the pixel driving circuit of the second color sub-pixel of number one, on the substrate; and in the second color sub-pixel of number two, an orthographic projection of the main portion on the substrate does not overlap a driving transistor in the pixel driving circuit of the second color sub-pixel of number two, and the orthographic projection of the main portion on the substrate overlaps with orthographic projections of a reset control signal line and a scan signal line, which are electrically connected to pixel driving circuits in a next row adjacent to the pixel driving circuit of the second color sub-pixel of number two, on the substrate.

Optionally, in an embodiment of the present disclosure, the pixel driving circuit in the third color sub-pixel, the pixel driving circuit in the second color sub-pixel of number one, the pixel driving circuit in the first color sub-pixel, and the pixel driving circuit in the second color sub-pixel of number two are sequentially arranged in the first direction.

Optionally, in an embodiment of the present disclosure, first holes in same color sub-pixels are located on same sides of the same color sub-pixels, respectively.

Optionally, in an embodiment of the present disclosure, in a same repeat unit, the first hole of the second color sub-pixel of number one, the first hole of the first color sub-pixel, and the first hole of the second color sub-pixel of number two are sequentially arranged on a same first sub-fold line along the first direction; and for the first color sub-pixel in one repeat unit group and the third color sub-pixel that is in an adjacent repeat unit group and is closest to the first color sub-pixel in the one repeat unit group, the first hole of the first color sub-pixel and the first hole of the third color sub-pixel are arranged on a same second sub-fold line along a third direction; iii which the third direction intersects the first direction.

Optionally, in an embodiment of the present disclosure, a fold line comprises the first sub-fold line and the second sub-fold line; in two repeat units in different columns, the first hole of the third color sub-pixel in a first repeat unit of the two repeat units, the first hole of the second color sub-pixel of number one in a second repeat fruit of the two repeat units, the first hole of the first color sub-pixel in the second repeat unit of the two repeat units, and the first hole of the second color sub-pixel of number two in the second repeat unit of the two repeat units are sequentially arranged on the fold line.

Optionally, in an embodiment of the present disclosure, the first hole of the third color sub-pixel and the first hole of the first color sub-pixel in a same repeat unit are arranged on a same straight line the second direction.

Optionally, in an embodiment of the present disclosure, in two repeat units which are in different columns and adjacent, the first hole of the second color sub-pixel of number one of one repeat unit of the two repeat units and the first hole of the second color sub-pixel of number two of other repeat unit of the two repeat units arranged on a same straight line in the second direction.

Optionally, in an embodiment of the present disclosure, in at least one selected from a group consisting of odd-numbered repeat unit groups and even-numbered repeat unit groups, in repeat units of a same row first holes of first color sub-pixels, first holes of second color sub-pixels of number one of second color sub-pixel pairs, and first holes of second color sub-pixels of number two of the second color sub-pixel pairs are arranged on a same straight line along the first direction; and in the at least one selected from the group consisting of the odd-numbered repeat unit groups and the even-numbered repeat unit groups, first holes of third color sub-pixels in the repeat units of the same row are arranged on a same straight line along the first direction.

Optionally, in an embodiment of the present disclosure, the electroluminescent display panel further comprises: a second conductive layer, located between the first conductive layer and the substrate and comprising: a second power line and second connection lines that are spaced apart from each other; and a second insulation layer, located between the second conductive layer and the first conductive layer and having second holes exposing the second connection lines and a third hole exposing a portion of the second power line. The first connection lines are electrically connected to the second connection lines through the second holes; and the first power line is electrically connected to the second power line through the third hole.

Optionally, in an embodiment of the present disclosure, for a first connection line and a second connection line which are electrically connected to each other, an orthographic projection of the first connection line on the substrate and an orthographic projection of the second connection line on the substrate at least partially overlap; and an orthographic projection of the first power line on the substrate and an orthographic projection of the second power line on the substrate at least partially overlap.

Optionally, in an embodiment of the present disclosure, in the third color sub-pixel, the first hole is disposed closer to a driving transistor in the pixel driving circuit of the third color sub-pixel than the second hole; in the first color sub-pixel, the first hole is disposed away from a driving transistor in the pixel driving circuit of the first color sub-pixel with respect to the second hole; and in the second color sub-pixel, the first hole is disposed away from a driving transistor in the pixel driving circuit of the second color sub-pixel with respect to the second hole.

Optionally, in an embodiment of the present disclosure, in a same sub-pixel, an orthographic projection of the first hole on the substrate and an orthographic projection of the second hole on the substrate do not overlap.

Optionally, in an embodiment of the present disclosure, each of the plurality of sub-pixels further comprises a fourth hole, in the third color sub-pixel, an orthographic projection of the fourth hole on the substrate and an orthographic projection of the second hole on the substrate overlap with each other; in the first color sub-pixel, an orthographic projection of the fourth bole on the substrate and an orthographic projection of the first hole on the substrate overlap with each other; and in each second color sub-pixel of the second color sub-pixel pair, an orthographic projection of the fourth hole on the substrate and an orthographic projection of the first hole on the substrate overlap with each other.

Optionally, in an embodiment of the present disclosure, fourth holes of the plurality of sub-pixels are arranged on a straight line in the first direction, and a spacing between any adjacent two fourth holes on a same straight line is substantially constant.

Optionally, in an embodiment of the present disclosure, a spacing between any adjacent two first holes in the first direction is substantially constant, and a spacing between any adjacent two first holes in the second direction is substantially constant; and a spacing between any adjacent two second holes in the first direction is substantially constant, and a spacing between any adjacent two second holes in the second direction is substantially constant.

Optionally, in an embodiment of the present disclosure, in the third color sub-pixel, an orthographic projection of the first hole on the substrate overlaps an orthographic projection of a light emitting control signal line electrically connected to the pixel driving circuit on the substrate, an orthographic projection of the second hole on the substrate does not overlap the orthographic projection of the light emitting control signal line electrically connected to the pixel driving circuit on the substrate, and an orthographic projection of the fourth hole on the substrate does not overlap the orthographic projection of the light emitting control signal line electrically connected to the pixel driving circuit on the substrate.

Optionally, in an embodiment of the present disclosure, in the first color sub-pixel, an orthographic projection of the first hole on the substrate does not overlap an orthographic projection of a light emitting control signal line electrically connected to the pixel driving circuit on the substrate, an orthographic projection of the second hole on the substrate overlaps the orthographic projection of the light emitting control signal line electrically connected to the pixel driving circuit on the substrate, and an orthographic projection of the fourth hole on the substrate does not overlap the orthographic projection of the light emitting control signal line electrically connected to the pixel driving circuit on the substrate.

Optionally, in an embodiment of the present disclosure, in each second color sub-pixel of the second color sub-pixel pair, an orthographic projection of the first hole on the substrate does not overlap an orthographic projection of a light emitting control signal line electrically connected to the pixel driving circuit on the substrate, art orthographic projection of the second hole on the substrate overlaps the orthographic projection of the light emitting control signal line electrically connected to the pixel driving circuit on the substrate, and an orthographic projection of the fourth hole on the substrate does not overlap the orthographic projection of the light emitting control signal line electrically connected to the pixel driving circuit on the substrate.

Optionally, in an embodiment of the present disclosure, in the third color sub-pixel, an orthographic projection of the main portion on the substrate and an orthographic projection of the second hole on the substrate at least partially overlap.

Optionally, in an embodiment of the present disclosure, in the third color sub-pixel, an orthographic projection of the main portion on the substrate and orthographic projections of two third holes on the substrate at least partially overlap.

Optionally, in an embodiment of the present disclosure, in the third color sub-pixel, the first hole is disposed adjacent to a side of a center line of the two third holes which overlap the orthographic projection of the main portion on the substrate, and the second hole is disposed adjacent to the other side of the center line of the two third holes which overlap the orthographic projection of the main portion on the substrate.

Optionally, in an embodiment of the present disclosure, in the third color sub-pixel, the main portion is an axisymmetric pattern, and the second hole is on a symmetry axis of the main portion along the second direction.

Optionally, in an embodiment of the present disclosure, in the first color sub-pixel, an orthographic projection of the rain portion on the substrate and an orthographic projection of the second hole on the substrate at least partially overlap.

Optionally, in an embodiment of the present disclosure, in the first color sub-pixel, the orthographic projection of the main portion on the substrate and orthographic projections of two third holes on the substrate in least partially overlap.

Optionally, in an embodiment of the present disclosure, in the first color sub-pixel, the first hole is disposed adjacent to a side of a center line of the two third holes which overlap the orthographic projection of the main portion on the substrate, and the second hole is disposed adjacent to the other side of the center line of the two third holes which overlap the orthographic projection of the main portion on the substrate.

Optionally, in an embodiment of the present disclosure, in the first color sub-pixel, the main portion is an axisymmetric pattern, and the second hole is on a symmetry axis of the main portion along the second direction.

Optionally, in an embodiment of the present disclosure, for the first color sub-pixel and the second color sub-pixel of number one in a same repeat unit, and for a third color sub-pixel that is closest to both the first color sub-pixel and the second color sub-pixel of number one in the same repeat unit, the second hole of the second color sub-pixel of number one is in a gap between the first color sub-pixel and the third color sub-pixel; and for the first color sub-pixel and the second color sub-pixel of number two in the same repeat unit, and for a third color sub-pixel that is closest to both the first color sub-pixel and the second color sub-pixel of number two in the same repeat unit, the second hole of the second color sub-pixel of number two is in a gap between the first color sub-pixel and the third color sub-pixel.

Optionally, in an embodiment of the present disclosure, in the second color sub-pixel of number one, the first hole and the second hole are arranged on a same straight line in the second direction; in the second color sub-pixel of number two, the first hole and the second hole are arranged on a same straight line in the second direction.

Optionally, in an embodiment of the present disclosure, in the second color sub-pixel of number one, the second hole is located on a side of the first hole away from the main portion; in the second color sub-pixel of number two, the second hole is located on a side of the first hole away from the main portion.

Optionally, in an embodiment of the present disclosure, the second hole of the third color sub-pixel in an odd-numbered repeat unit group, and the first hole of the first color sub-pixel, the first hole of the second color sub-pixel of number one, and the first hole of the second color sub-pixel of number two in an even-column repeat unit group are arranged on a same straight line in the first direction.

Optionally, in an embodiment of the present disclosure, in the third color sub-pixel, an orthographic projection of the main portion on the substrate covers orthographic projections of two sub-power lines on the substrate; and the two sub-power lines overlapping, the orthographic projection of the main portion on the substrate are disposed in parallel on both sides of a center of the main portion.

Optionally, in an embodiment of the present disclosure, in the first color sub-pixel, an orthographic projection of the main portion on the substrate covers orthographic projections of two sub-power lines on the substrate; and the two sub-power lines overlapping the orthographic projection of the main portion on the substrate are disposed in parallel on both sides of a center of the main portion.

Optionally, in an embodiment of the present disclosure, in each second color sub-pixel of the second color sub-pixel pair, an orthographic projection of the main portion on the substrate at least partially overlaps an orthographic projection of one sub-power line and an orthographic projection of a conduction line electrically connected to the one sub-power line on the substrate.

Optionally, in an embodiment of the present disclosure, the first conductive layer comprises: a first power line, first connection lines, and a data line that are spaced apart from each other; in each of the plurality of sub-pixels, the auxiliary portion is electrically connected to a first connection line of the first connection lines through the first hole.

Optionally, in an embodiment of the present disclosure, the first power line and the data line are arranged in the first direction and extend along the second direction, and the first direction is different from the second direction.

Optionally, in an embodiment of the present disclosure, the first power line is configured to be a power line transmitting a driving voltage.

An embodiment of the present disclosure also provides a display device comprising the above electroluminescent display panel.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "electrically connect", etc., are not intended to define a physical connection or mechanical connection, but may include an electrical connection, directly or indirectly.

A typical OLED display panel comprises a base substrate, a pixel driving circuit disposed on the base substrate, a flat layer disposed on a side of the pixel driving circuit away from the base substrate, an anode disposed on a side of the Hat layer away from the base substrate, a light emitting layer disposed on a side of the anode away from the base substrate, and a cathode disposed on a side of the light emitting layer away from the base substrate.

Figure 1A:
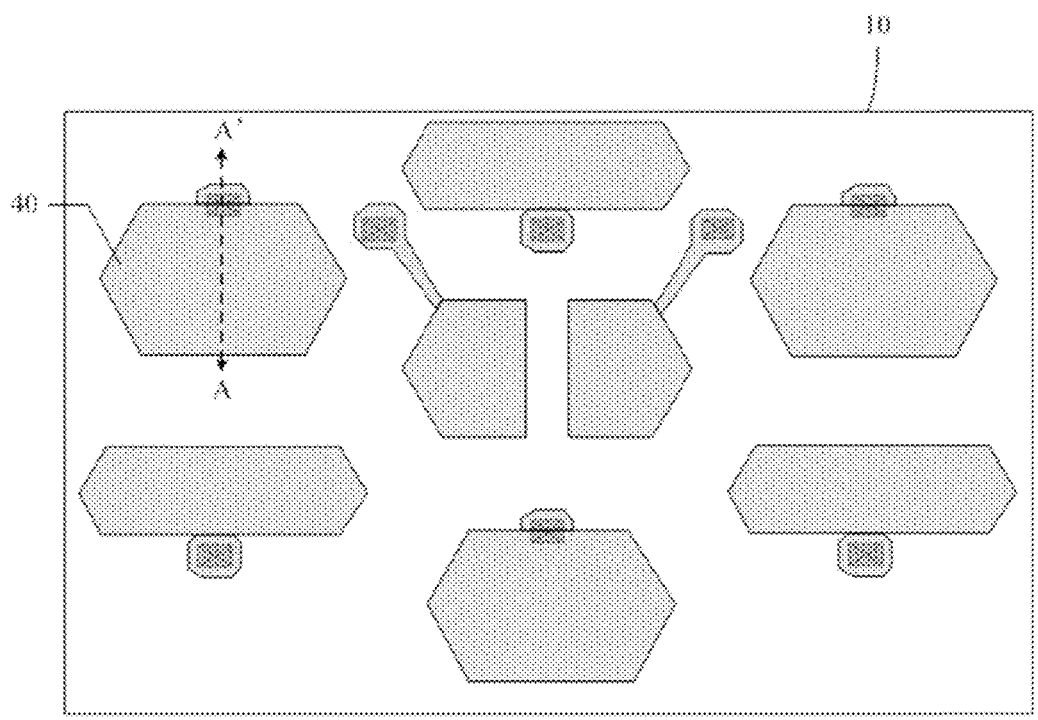
FIG. 1A is a schematic diagram showing a top structure of a display panel in a related art.
Figure 1B:
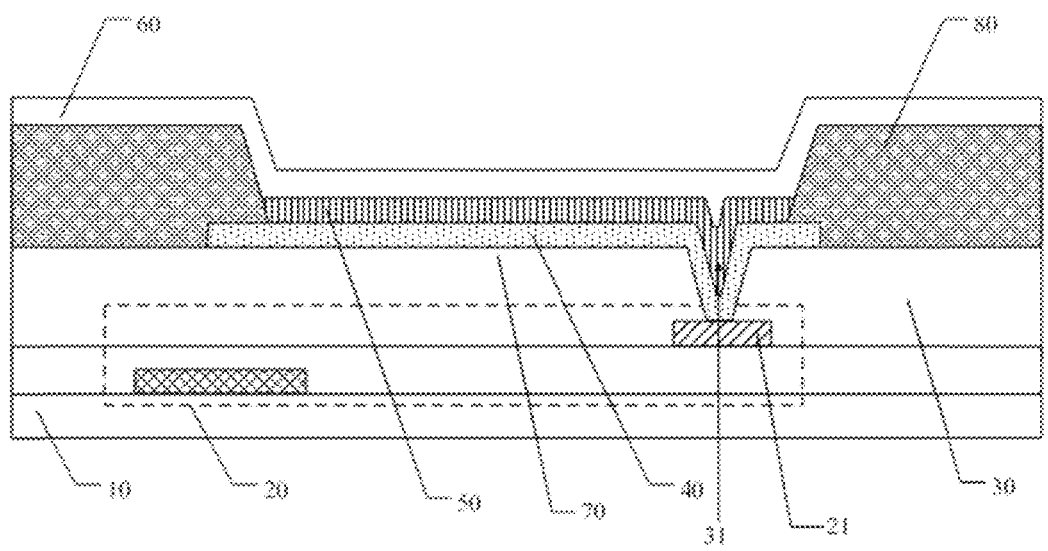
FIG. 1B is a schematic cross-sectional structural view of the display panel shown in FIG. 1A along an AA' direction.

FIG. 1A is a schematic diagram showing a top structure of a display panel. FIG. 1B is a schematic cross-sectional structural view of the display panel shown in FIG. 1A along an AA' direction. As shown in FIG. 1A and FIG. 1B, a display panel may comprise: a base substrate 10, a pixel driving circuit 20, a flat layer 30, an anode 40, a light emitting layer 50, a cathode 60, and a pixel defining layer 80; the pixel defining layer 80 has an opening, so as to define an effective light emitting region through the opening. The pixel driving circuit 20 has a transistor and a capacitor, and generates an electric signal by the interaction of the transistor and the capacitor, and the generated electric signal is input to the anode 40 through a connection line 21. The cathode 60 is loaded with a corresponding voltage, and the light emitting layer 50 can be driven to emit light. The flat layer 30 has a hole 31, and the anode 40 is electrically connected to the connection line 21 through the hole 31. However, because the hole 31 has a certain depth, the light emitting layer 50 on the anode 40 and the anode 40 are caused to having recesses in the region where the hole 31 exists, thereby causing the anode 40 to be uneven, and further thereby causing a color shift phenomenon in the display panel.

Figure 2A:
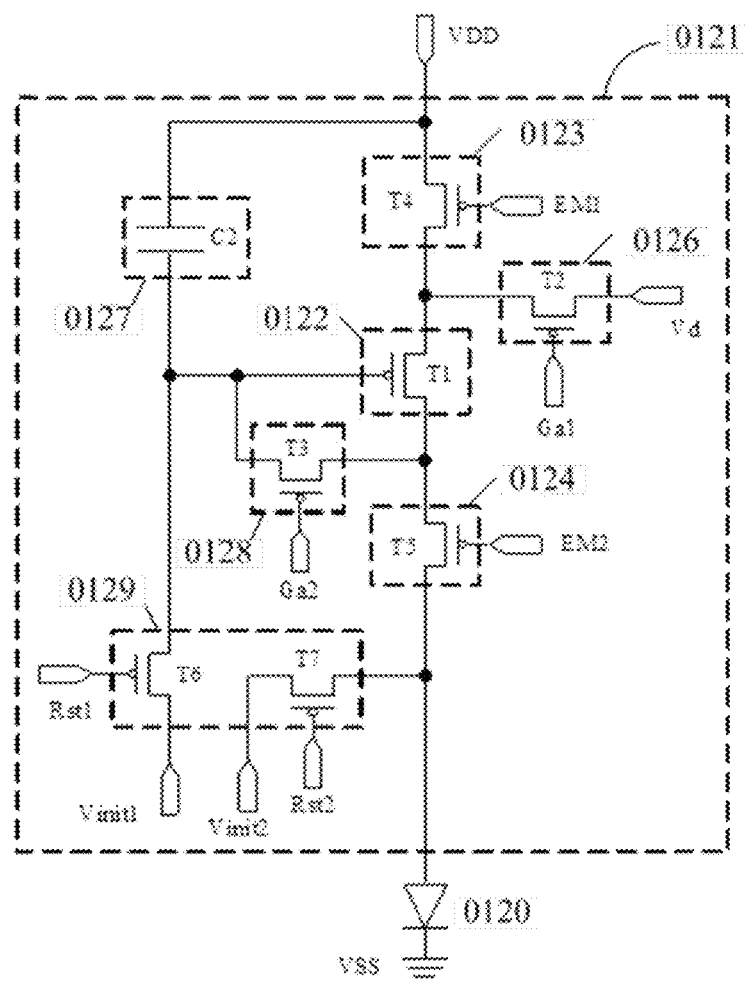
FIG. 2A is a schematic structural diagram of a pixel driving circuit provided by some embodiments of the present disclosure.

As shown in FIG. 2A, the pixel driving circuit 0121 may comprise: a pixel driving circuit 0122, a first light emitting control circuit 0123, a second light emitting control circuit 0124, a data writing circuit 0126, a storage circuit 0127, a threshold compensation circuit 0128, and a reset circuit 0129. The pixel driving circuit 0122 comprises a control end, a first end, and a second end, and is configured to provide a driving current for driving a light emitting element 0120 to emit light. For example, the first light emitting control circuit 0123 is connected to the first end of the pixel driving circuit 0122 and a first voltage terminal VDD, and is configured to cause the connection between the pixel driving circuit 0122 and the first voltage terminal VDD to be turned on or off. The second light emitting control circuit 0124 is electrically connected to the second end of the pixel driving circuit 0122 and a first light emitting voltage applying electrode of the light emitting element 0120, and is configured to cause the connection between the pixel driving circuit 0122 and the light emitting element 0120 to be turned on or off. The data writing circuit 0126 is electrically connected to the first end of the pixel driving circuit 0122, and is configured to write a data signal to the storage circuit 0127 under control of a scan signal; the storage circuit 0127 is electrically connected to the control end of the pixel driving circuit 0122 and the first voltage terminal VDD, and is configured to store the data signal; the threshold compensation circuit 0128 is electrically connected to the control end and the second end of the pixel driving circuit 0122, and is configured to perform threshold compensation on the pixel driving circuit 0122; the reset circuit 0129 is electrically connected to the control end of the pixel driving circuit 0122 and the first light emitting voltage applying electrode of the light emitting element 0120, and is configured to reset the control end of the pixel driving circuit 0122 and the first light emitting voltage applying electrode of the light emitting element 0120 under control of the reset control signal.

The light emitting element 0120 comprises an anode 40, a light emitting layer 50, and a cathode 60 which are stacked.

Illustratively, referring to FIG. 2A, the pixel driving circuit 0122 includes a driving transistor T1, and the control end of the pixel driving circuit 0122 includes a gate electrode of the driving transistor T1, the first end of the pixel driving circuit 0122 includes a first electrode of the driving transistor T1, and the second end of the pixel driving circuit 0122 includes a second electrode of the driving transistor T1.

Illustratively, referring to FIG. 2A, the data writing circuit 0126 includes a data writing transistor T2, the storage circuit 0127 includes a third capacitor C2, the threshold compensation circuit 0128 includes a threshold compensation transistor T3, the first light emitting control circuit 0123 includes a first light emitting control transistor T4, the second light emitting control circuit 0124 includes a second light emitting control transistor T5, the reset circuit 0129 includes a first reset transistor T6 and a second reset transistor T7, and the reset control signal may include a first sub-reset control signal and a second sub-reset control signal.

Specifically, a first electrode of the data writing transistor T2 is electrically connected to the first electrode of the driving transistor T1, a second electrode of the data writing transistor T2 is configured to be electrically connected to a data line Vd to receive the data signal, and a gate electrode of the data writing transistor T2 is configured to be electrically connected to a first scan signal line Ga1 to receive the scan signal; a first electrode of the third capacitor C2 is electrically connected to the first power terminal VDD, and a second electrode of the third capacitor C2 is electrically connected to the gate electrode of the driving transistor T1; a first electrode of the threshold compensation transistor T3 is electrically connected to the second electrode of the driving transistor T1, a second electrode of the threshold compensation transistor T3 is electrically connected to the gate electrode of the driving transistor T1, and a gate electrode of the threshold compensation transistor T3 is configured to be electrically connected to a second scan signal line Ga2 to receive a compensation control signal; a first electrode of the first reset transistor T6 is configured to be electrically connected to a first reset power terminal Vinit1 to receive a first reset signal, a second electrode of the first reset transistor T6 is electrically connected to the gate electrode of the driving transistor T1, and a gate electrode of the first reset transistor T6 is configured to be electrically connected to a first reset control signal line Rst1 to receive the first sub-reset control signal; a first electrode of the second reset transistor T7 is configured to be electrically connected to a second reset power terminal Vinit2 to receive a second reset signal, a second electrode of the second reset transistor T7 is electrically connected to the first light emitting voltage applying electrode of the light emitting element 0120, and a gate electrode of the second reset transistor T7 is configured to be electrically connected to a second reset control signal line Rst2 to receive the second sub-reset control signal; a first electrode of the first light emitting control transistor T4 is electrically connected to the first power terminal VDD, a second electrode of the first light emitting control transistor T4 is electrically connected to the first electrode of the driving transistor T1, and a gate electrode of the first light emitting control transistor T4 is configured to the electrically connected to a first light emitting control signal line EM1 to receive the first light emitting control signal; a first electrode of the second light emitting control transistor T5 is electrically connected to the second electrode of the driving transistor T1, a second electrode of the second light emitting control transistor T5 is electrically connected to the first light emitting voltage applying electrode of the light emitting element 120, and a gate electrode of the second light emitting control transistor T5 is configured to be electrically connected to a second light emitting control signal line EM2 to receive the second light emitting control signal; a second light emitting voltage applying electrode of the light emitting element 120 is electrically connected to a second power terminal VSS. The first electrode and the second electrode may be determined as a source electrode or a drain electrode according to an actual application, which is not limited herein.

Illustratively, one of the first power terminal VDD and the second power terminal VSS is a high voltage terminal, and the other of the first power terminal VDD and the second power terminal VSS is a low voltage terminal. For example, in the embodiment shown in FIG. 2A, the first power terminal VDD is a voltage source to output a constant first voltage, and the first voltage is a positive voltage; and the second power terminal VSS may be a voltage source to output a constant second voltage, and the second voltage is a negative voltage, and so on. For example, in some examples, the second power terminal VSS can be grounded.

It should be noted that, in the embodiments of the present disclosure, the pixel driving circuit of the sub-pixel may be a structure including other numbers of transistors other than the structure shown in FIG. 2A, and the embodiments of the present disclosure are not limited thereto.

FIG. 2B to FIG. 2G are schematic diagrams of layers of a pixel driving circuit according to some embodiments of the present disclosure. A positional relationship of respective circuits of a pixel driving circuit on a substrate will be described below with reference to FIGS. 2b to 2g, and examples shown in FIGS. 2b to 2g are exemplified by a pixel driving circuit of one sub-pixel. FIGS. 2b to 2g also show a first scan signal line Ga1a, a second scan signal line Ga2a, a first reset control signal line Rst1a, a second reset control signal line Rst2a, a first reset power signal line Init1a of the first reset power terminal Vinit1a, a second reset power signal line Init2a of the second reset power terminal Vinit2a, a first light emitting control signal line EM1a, a second light emitting control signal line EM2a, a data line Vd, and a first power signal line VDD1 and a second power signal line VDD2 of the first power terminal VDD, which are connected to the pixel driving circuit 0121. The first power signal line VDD1 and the second power signal line VDD2 are electrically connected to each other. It should be noted that, in the examples shown in FIGS. 2b to 2g, the first scan signal line Ga1a and the second scan signal line Ga1a are the same signal line, the first reset power signal line find a and the second reset power signal line Init2a are the same signal line, the first reset control signal line Rst1a and the second reset control signal line Rst2a are the same signal line, and the first light emitting control signal line EM1a and the second light emitting control signal line EM2a are the same signal line.

Figure 2B:
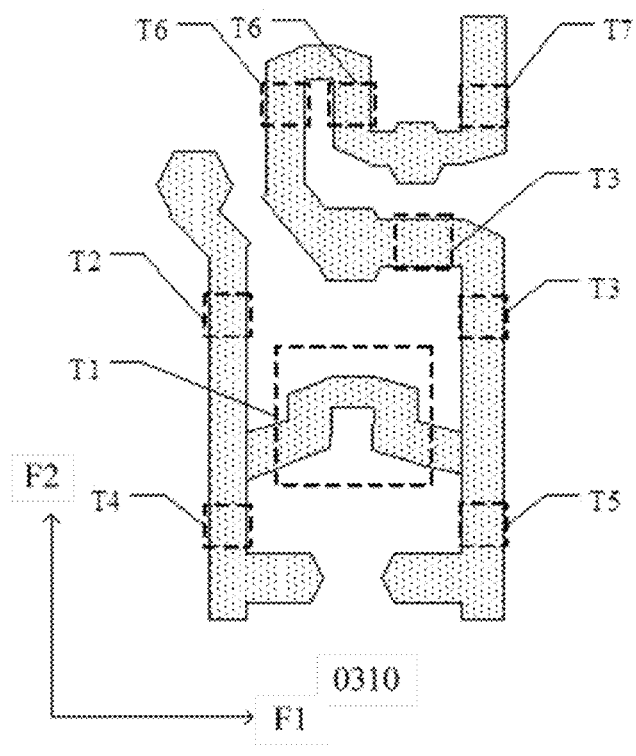
FIG. 2B is a schematic diagram showing a top structure of an active semiconductor layer provided by some embodiments of the present disclosure.

For example, FIG. 2B shows an active semiconductor layer 0310 of the pixel driving circuit 0121. The active semiconductor layer 0310 can be formed by patterning a semiconductor material. The active semiconductor layer 0310 can be used to form an active layer of the driving transistor T1, an active layer of the data writing transistor T2, an active layer of the threshold compensation transistor T3, an active layer of the first light emitting control transistor T4, an active layer of the second light emitting control transistor T5, an active layer of the first reset transistor T6, and an active layer of the second reset transistor T7. Each active layer may comprise a source region, a drain region, and a channel region between the source region and the drain region. For example, the active layers of the respective transistors are integrally disposed.

For example, the active semiconductor layer 0310 can be made of amorphous silicon, polysilicon, an oxide semiconductor material, or the like. It should be noted that the source region and the drain region described above may be regions doped with an n-type impurity or a p-type impurity.

Figure 2C:
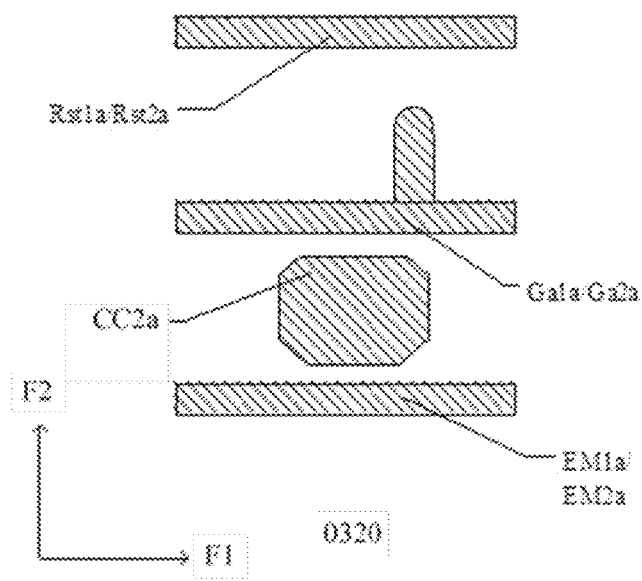
FIG. 2C is a schematic diagram showing a top structure of a gate conductive layer provided by some embodiments of the present disclosure.

For example, the gate metal layer of the pixel driving circuit 0121 may comprise a gate conductive layer 0320. A gate insulation layer (not shown) is formed on the active semiconductor layer 0310 described above, so as to protect the active semiconductor layer 0310 described above. FIG. 2C shows the gate conductive layer 0320 of the pixel driving circuit 0121, and the gate conductive layer 0320 is disposed on the gate insulation layer and is insulated from the active semiconductor layer 0310. The gate conductive layer 0320 may comprise a second electrode CC2a of the third capacitor C2, the first scan signal line Ga1a, the second scan signal line Ga2a, the first reset control sigma Rst1a, the second reset control signal line Rst2a, the first light emitting control Signal line EM1a, the second light emitting control signal line EM2a, a gate electrode of the driving transistor T1, a gale electrode of the data writing transistor T2, a gate electrode of the threshold compensation transistor T3, a gale electrode of the first light emitting control transistor T4, a gate electrode of the second light emitting control transistor T5, a gate electrode of the first reset transistor T6, and a gate electrode of the second reset transistor T7.

For example, as shown in FIG. 2C, the gate electrode of the data writing transistor T2 may be a portion where the first scan signal line Ga1a overlaps the active semiconductor layer 0310, the gate electrode of the first light emitting control transistor T4 may be a first portion where the first light emitting control signal line EM1a/the second light emitting control signal line EM2a overlaps the active semiconductor layer 0310, the gate electrode of the second light emitting control transistor T5 may be a second portion where the first light emitting control signal line EM1a/the second light emitting control signal line EM2a overlaps the active semiconductor layer 0310, the gate electrode of the first reset transistor T6 is a first portion where the first reset control signal line Rst1a/the second reset control signal line Rst2a overlaps the active semiconductor layer 0310, the gate electrode of the second reset transistor T7 is a second portion where the first reset control signal line Rst1a/the second reset control signal line Rst2a overlaps the active semiconductor layer 0310, the threshold compensation transistor T3 can be a thin film transistor of a double gate structure, a first gate electrode of the threshold compensation transistor T3 may be a portion where the second scan signal line Ga2a overlaps the active semiconductor layer 0310, and a second gate electrode of the threshold compensation transistor T3 may be a portion where a protrusion part protruding from the second scan signal line Ga2a overlaps the active semiconductor layer 0310. As shown in FIGS. 2a and 2c, the gate electrode of the driving transistor T1 may be the second electrode CC2a of the third capacitor C2.

It should be noted that dotted rectangular frames in FIG. 2B show portions where the gate conductive layer 0320 overlaps the active semiconductor layer 0310.

For example, as shown in FIG. 2C, the first scan signal line Ga1a/the second scan signal line Ga2a, the first reset control signal line Rst1a/the second reset control signal line Rst2a, and the first light emitting control signal line EM1a/the second light emitting control signal line EM2a are arranged in a second direction F2. The first scan signal line Ga1a/the second scan signal line Ga2a is located between the first reset control signal line Rst1a/the second reset control signal line Rst2a and the first light emitting control signal line EM1a/the second light emitting control signal line EM2a.

For example, in the second direction F2, the second electrode CC2a of the third capacitor C2 is located between the first scan signal line Ga1a/the second scan signal line Ga2a and the first light emitting control signal line EM1a/the second light emitting control signal line EM2a. The protrusion part protruding from the second scan signal line Ga2a is located on a side of the second scan signal line Ga2a away from the first light emitting control signal line EM1a/the second light emitting control signal line EM2a.

For example, as shown in FIG. 2B, in the second direction F2, the gate electrode of the data writing transistor T2, the gate electrode of the threshold compensation transistor T3, the gate electrode of the first reset transistor T6, and the gate electrode of the second reset transistor T7 are all located on a first side of the gate electrode of the driving transistor T1, and the gate electrode of the first light emitting control transistor T4 and the gate electrode of the second light emitting control transistor T5 are both located on a second side of the gate electrode of the driving transistor T1.

For example, in some embodiments, as shown in FIGS. 2b to 2g, in a first direction F1, the gate electrode of the data writing transistor T2 and the gate electrode of the first light emitting control transistor T4 are both located on a third side of the gate electrode of the driving transistor T1, and the first gate electrode of the threshold compensation transistor T3, the gate electrode of the second light emitting control transistor T5, and the gate electrode of the second reset transistor T7 are located on a fourth side of the gate electrode of the driving transistor T1. The third side and the fourth side of the gate electrode of the driving transistor T1 are opposite sides of the gate electrode of the driving transistor T1 in the first direction F1.

Figure 2D:
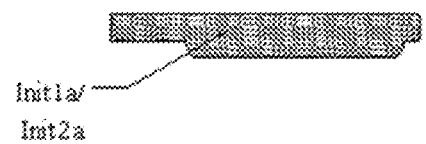
FIG. 2D is a schematic diagram showing a top structure of a reference conductive layer provided by some embodiments of the present disclosure.
Figure 2D:
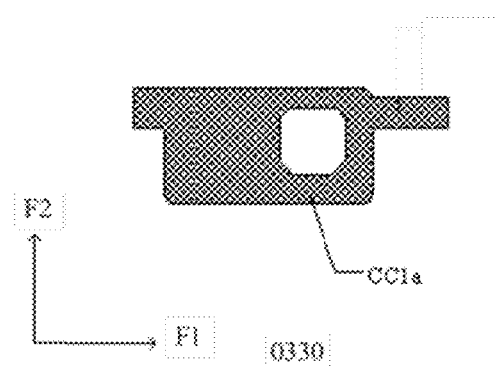

For example, a first interlayer insulation layer (not shown) is formed on the gate conductive layer 0320 described above for protecting the gate conductive layer 0320 described above. FIG. 2D shows a reference conductive layer 0330 of the pixel driving circuit 120a, and the reference conductive layer 0330 comprises a first electrode CC1a of the third capacitor C2, the first reset power signal line Init1a, and the second reset power signal line Init2a. The first electrode CC1a of the third capacitor C2 and the second electrode CC2a of the third capacitor C2 at least partially overlap to form the third capacitor C2.

Figure 2E:
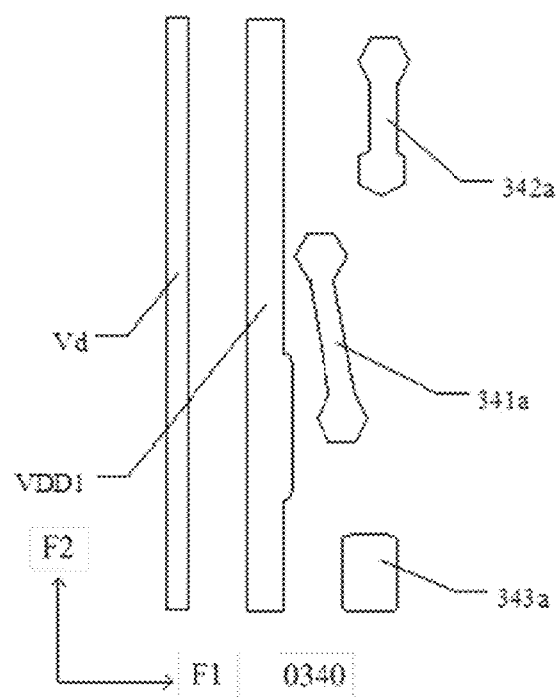
FIG. 2E is a schematic diagram showing a top structure of a source-drain metal layer provided by some embodiments of the present disclosure.

For example, a second interlayer insulation layer (not shown) is conned on the above-described reference conductive layer 0330 for protecting the above-described reference conductive layer 0330. FIG. 2E shows a source-drain metal layer 0340 of the pixel driving circuit 0121, and the source-drain metal layer 0340 comprises the data line Vd and the first power signal line VDD1.

Figure 2F:
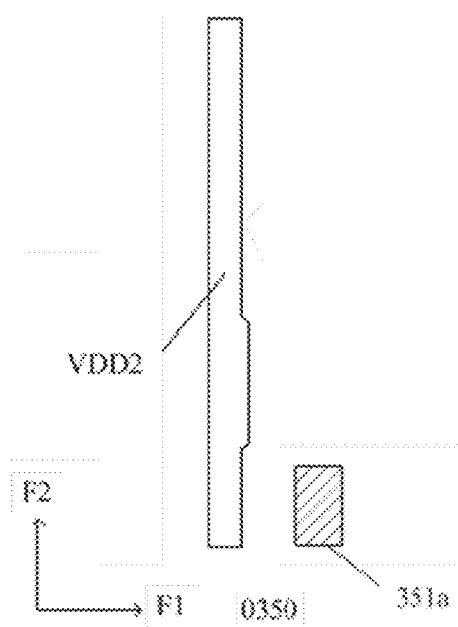
FIG. 2F is a schematic diagram showing a top structure of an auxiliary metal layer provided by some embodiments of the present disclosure.

For example, a third interlayer insulation layer (not shown) is formed on the source-drain metal layer 0340 described above for protecting the source-drain metal layer 0340 described above. FIG. 2F shows an auxiliary metal layer 0350 of the pixel driving circuit 0121, and the auxiliary metal layer 0350 comprises the second power signal line VDD2.

Figure 2G:
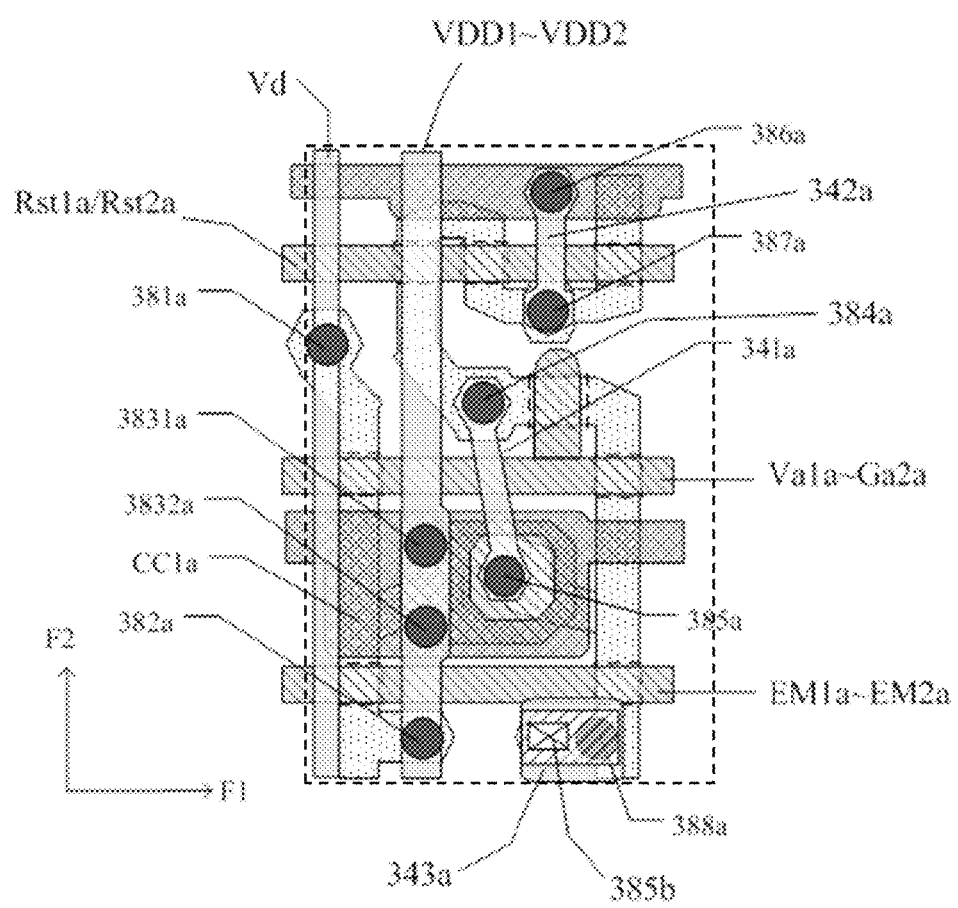
FIG. 2G is a schematic diagram showing a stacked positional relationship of an active semiconductor layer, a gate conductive layer, a reference conductive layer, a source-drain metal layer, and an auxiliary metal layer provided by some embodiments of the present disclosure.

FIG. 2G is a schematic diagram showing a stacked positional relationship of an active semiconductor layer 0310, a gate conductive layer 0320, a reference conductive layer 0330, and a source-drain metal layer 0340, and an auxiliary metal layer 0350 described above. As shown in FIGS. 2e to 2g, the data line Vd is electrically connected to a source region of the data writing transistor T2 in the active semiconductor layer 0310 through at least one hole (for example, hole 381*a*) in the gate insulation layer, the first interlayer insulation layer, and the second interlayer insulation layer. The first power signal line VDD1 is electrically connected to the corresponding source region of the first light emitting control transistor T4 in the active semiconductor layer 0310 through at least one hole (for example, hole 382*a*) in the gate insulation layer, the first interlayer insulation layer, and the second interlayer insulation layer. The first power signal line VDD1 is electrically connected to the first electrode CC1*a* of the third capacitor C2 in the reference conductive layer 0330 through at least one hole (for example, hole 3832*a*) in the second insulation layer. The first power signal line VDD1 is also electrically connected to the second power signal line VDD2 in the auxiliary metal layer 0350 through at least one hole (for example, hole 3831*a*) in the second insulation layer.

For example, as shown in FIG. 2E and FIG. 2G the source-drain metal layer 0340 further comprises a connection portion 341*a*, a connection portion 342*a*, and a connection portion 343*a*. One end of the connection portion 341*a* is electrically connected to the corresponding drain region of the threshold compensation transistor T3 in the active semiconductor layer 0310 through at least one hole (for example, hole 384*a*) in the gate insulation layer, the first interlayer insulation layer, and the second interlayer insulation layer. The other end of the connection portion 341*a* is electrically connected to the gate electrode of the driving transistor T1 (that is, the second electrode of the third capacitor C2) in the gate conductive layer 0320 through at least one hole (for example, hole 385*a*) in the first interlayer insulation layer and the second interlayer insulation layer. One end of the connection portion 342*a* is electrically connected to the first reset power signal line Init1*a*/the second reset power signal line Init2*a* through one hole (for example, hole 386*a*) in the second insulation layer, and the other end of the connection portion 342*a* is electrically connected to the drain region of the second reset transistor T7 in the active semiconductor layer 0310 through at least one hole (for example, hole 387*a*) in the gate insulation layer, the first interlayer insulation layer, and the second interlayer insulation layer. The connection portion 343*a* is electrically connected to the drain region of the second light emitting control transistor T5 in the active semiconductor layer 0310 through at least one hole (for example, hole 388*a*) in the gate insulation layer, the first interlayer insulation layer, and the second interlayer insulation layer.

For example, as shown in FIGS. 2f and 2g, the auxiliary metal layer 0350 further comprises a connection portion 351*a*. The connection portion 351*a* is electrically connected to the connection portion 343*a* through a hole (for example, hole 385*b*) penetrating through the third interlayer insulation layer.

For example, as shown in FIG. 2B to FIG. 2G, in the second direction F2, the first scan signal line Ga1*a*, the second scan signal line Ga2*a*, the first reset control signal line Rst1*a*, the second reset control signal line Rst2*a*, the first reset power signal line Init1*a*, and the second reset power signal line Init2*a* are located on the first side of the gate electrode of the driving transistor T1, and the first light emitting control signal line EM1*a* and the second light emitting control signal line EM2*a* are both located on the second side of the gate electrode of the driving transistor T1.

For example, the first scan signal line Ga1*a*, the second scan signal line Ga2*a*, the first reset control signal line Rst1*a*, the second reset control signal line Rst2*a*, the first fight emitting control signal line EM1*a*, the second light emitting control signal line EM2*a*, the first reset power signal line Init1*a*, and the second reset power signal line Init2*a* all extend along the first direction F1, and the data line Vd extends along the second direction F2.

For example, the first power signal line VDD1 extends in the second direction F2, and the second power signal line VDD2 extends in the second direction F2. That is, on the entire display substrate, the first power signal line VDD1 and the second power signal line VDD2 are electrically connected to each other, so that signal lines of the first power terminal VDD have a small resistance and a low voltage drop, thereby improving the stability of a power voltage provided by the first power terminal VDD.

For example, the first scan signal line Ga1*a*, the second scan signal line Ga2*a*, the first reset control signal line Rst1*a*, the second reset control signal line Rst2*a*, the first fight emitting control signal line EM1*a*, and the second light emitting control signal line EM2*a* are located on the same layer, the first reset power signal line Init1*a*, the second reset power signal line Init2*a*, and the second power signal line VDD2*a* are located on the same layer. The first power signal line VDD1 and the data line Vd are located on the same layer.

It should be noted that the positional arrangement relationship of the pixel driving circuit, the first light emitting control circuit, the second light emitting control circuit, the data writing circuit, the storage circuit, the threshold compensation circuit, and the reset circuit in each pixel driving circuit is not limited to the examples shown in FIG. 2B to FIG. 2G, and according to actual application requirements, the positions of the pixel driving circuit, the first light emitting control circuit, the second light emitting control circuit, the data writing circuit, the storage circuit, the threshold compensation circuit, and the reset circuit may be specifically designed.

As shown in FIG. 3A to FIG. 8C, the electroluminescent display panel provided by the embodiment of the present disclosure may comprise a plurality of repeat units 001, each repeat unit 001 comprises a plurality of sub-pixels, and each sub-pixel may comprise: a first conductive layer 200 located on a substrate 100, a first insulation layer 300 located on the first conductive layer 200, and an anode 400 located on the first insulation layer 300. The first insulation layer 300 comprises a first hole 310, and the first hole 310 exposes a portion of the first conductive layer 200. The anode 400 comprises a main portion 410 and an auxiliary portion 420 which are electrically connected to each other, and the auxiliary portion 420 is electrically connected to the first conductive layer 200 through the first hole 310. In at least one sub-pixel of the plurality of sub-pixels, an orthographic projection of the main portion 410 on the substrate 100 does not overlap an orthographic projection of the first hole 310 on the substrate 100. Moreover, in at least one sub-pixel, a size of the main portion 410 in a first direction F1 is larger than a size of the main portion 410 in a second direction F2, in the at least one sub-pixel, the first hole 310 and the main portion 410 are arranged in the second direction F2, and the first direction F1 is different from the second direction F2.

In the electroluminescent display panel provided by the embodiments of the present disclosure, the anode comprises the main portion and the auxiliary portion that are electrically connected to each other, the auxiliary portion is electrically connected to the first conductive layer through the first hole, so as to electrically connect the anode to the pixel driving circuit through the first conductive layer. And, in at least one sub-pixel, the size of the main portion in the first direction is larger than the size of the main portion in the second direction, and in the at least one sub-pixel, the first hole and the main portion are arranged in the second direction, and the first direction F1 is different from the second direction F2. Because in the at least one sub-pixel, an orthographic projection of the main portion on the substrate does not overlap an orthographic projection of the first hole on the substrate, the first hole in the sub-pixel can be kept away from the main portion such that the main portion of the anode in the sub-pixel is not affected by the depth of the first hole, thereby avoiding the main portion of the anode from having recesses, avoiding the occurrence of the unevenness of the anode caused by the first hole, and thereby alleviating the color shift phenomenon of the display panel.

In a specific implementation, the first hole and the main portion being arranged in the second direction may indicate that, for example, the first hole and the main portion may be projected on a line parallel to the second direction, the projection of the first hole and the projection of the main portion do not completely overlap, for example, the projection of the first hole does not overlap the projection of the main portion, or the projection of the first hole and the projection of the main portion only overlap a portion; the first hole and the main portion are projected on it line parallel to the first direction, the projection of the first hole completely falls within the projection of the main portion. In a specific implementation, the first hole and the main portion being arranged in the second direction may indicate that, for example, the main portion may have a first edge substantially parallel to the first direction, and the first hole is located on a side of the first edge of the main portion away from the main portion. In a specific implementation, the first hole and the main portion being arranged in the second direction may indicate that, for example, there is an angle between a virtual line connecting a center of the first hole with any point of the main portion and the second direction is less than 90°, further, may be less than 60°, and further, may be less than 45°.

In a specific implementation, in the embodiments of the present disclosure, as shown in FIGS. 3a to 8c, the main portion and the auxiliary portion in the same sub-pixel are an integral structure. For example, the main portion and the auxiliary portion in the same sub-pixel are formed by one patterning process.

In a specific implementation, in the embodiments of the present disclosure, as shown in FIGS. 3a to 8c, the first conductive layer 200 may comprise: a first power line 210 and first connection lines 220 that are spaced apart from each other; in each sub-pixel, the auxiliary portion 420 is electrically connected to a first connection line 220 of the first connection lines 220 through the first hole 310. Illustratively, the first conductive layer 200 is, for example, the auxiliary metal layer 0350 described above. The first power line 210 is, for example, the second power signal line VDD2 described above, and the first connection line 220 is, for example, the connection portion 351a described above. Moreover, the correspondence among the holes is not described herein.

In a specific implementation, in the embodiments of the present disclosure, as shown in FIGS. 3a to 8c, the electroluminescent display panel may further comprise: a second conductive layer 600 between the first conductive layer 200 and the substrate 100, and a second insulation layer 500 between the second conductive layer 600 and the first conductive layer 200. The second conductive layer 600 has a second power line 610 and second connection lines 620 that are spaced apart from each other. The second insulation layer 500 has second holes 520 exposing the second connection lines 620 and a third hole 630 exposing a portion of the second power line 610. Moreover, the first power line 210 is electrically connected to the second power line 610 through the third hole 530 to achieve the effect of reducing the resistance. The first connection line 220 is electrically connected to the second connection line 620 through the second hole 520, and the second connection line 620 is electrically connected to a drain electrode of a transistor in the pixel driving circuit to achieve signal transmission. Illustratively, the second conductive layer 600 is, for example, the source-drain metal layer 0340 described above. The second power line 610 is, for example, the first power signal line VDD1 described above, and the second connection line 620 is, for example, the connection portion 343a described above. Moreover, for a corresponding relationship among the holes and the insulation layers as well as the remaining layers, reference may be made to the implementations of the active semiconductor layer 0310, the gate conductive layer 0320, and the reference conductive layer 0330, and the corresponding relationship is not described herein.

In a specific implementation, in the embodiments of the present disclosure, as shown in FIGS. 3a to 8c, for the first connection line 220 and the second connection line 620 that are electrically connected to each other, an orthographic projection of the first connection line 220 on the substrate 100 and an orthographic projection of the second connection line 620 on the substrate 100 at least partially overlap. Optionally, the orthographic projection of the first connection line 220 on the substrate 100 overlaps with the orthographic projection of the second connection line 620 on the substrate 100. Optionally, the orthographic projection of the first connection line 220 on the substrate 100 partially overlaps the orthographic projection portion of the second connection line 620 on the substrate 100. This can improve the effect of mutual electrical connection.

In a specific implementation, in the embodiments of the present disclosure, as shown in FIGS. 3a to 8c, the orthographic projection of the first power line 210 on the substrate 100 at least partially overlaps the orthographic projection of the second power line 610 on the substrate 100. Optionally, the orthographic projection of the first power line 210 on the substrate 100 overlaps the orthographic projection of the second power line 610 on the substrate 100. Optionally, the orthographic projection of the first power line 210 on the substrate 100 partially overlaps the orthographic projection portion of the second power line 610 on the substrate 100. This can improve the effect of mutual electrical connection.

Figure 3A:
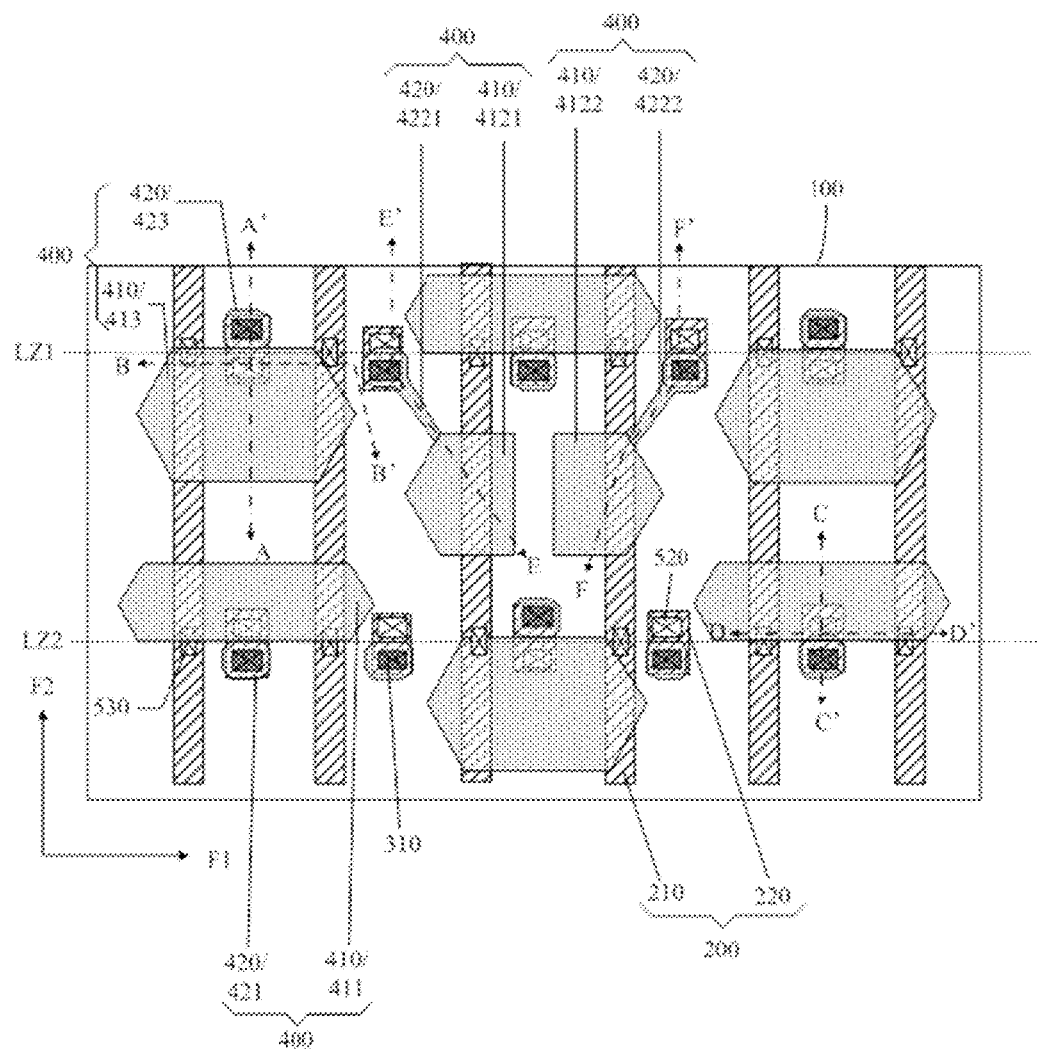
FIG. 3A is a schematic diagram showing a top structure of a display panel provided by some embodiments of the present disclosure.

In a specific implementation, in the embodiments of the present disclosure, as shown in FIG. 3A, the third holes 530 are arranged in an array on the substrate 100. Illustratively, a plurality of third boles 530 are evenly arranged in the first direction F1 and the second direction F2. Illustratively, the first power line 210 can be configured as a power line that transmits a driving voltage. In this case, the second power line 610 can also be configured as a power line that transmits a driving voltage, thereby reducing the adverse effect of the load on the transmitted drive voltage. Further, in a specific implementation, the second conductive layer 600 further has a data line and a bridge line which are spaced apart from the second power line 610 and the second connection line 620, respectively. The bridge line is configured to electrically connect two of the group consisting of a gate electrode, a source electrode, and a drain electrode of a part of the transistors in the pixel driving circuit. The data line is configured to transmit a data signal, and the setting manner of the data line and the bridge lisle can be substantially the same as the setting manner in the related art, and details are not described herein.

Figure 6A:
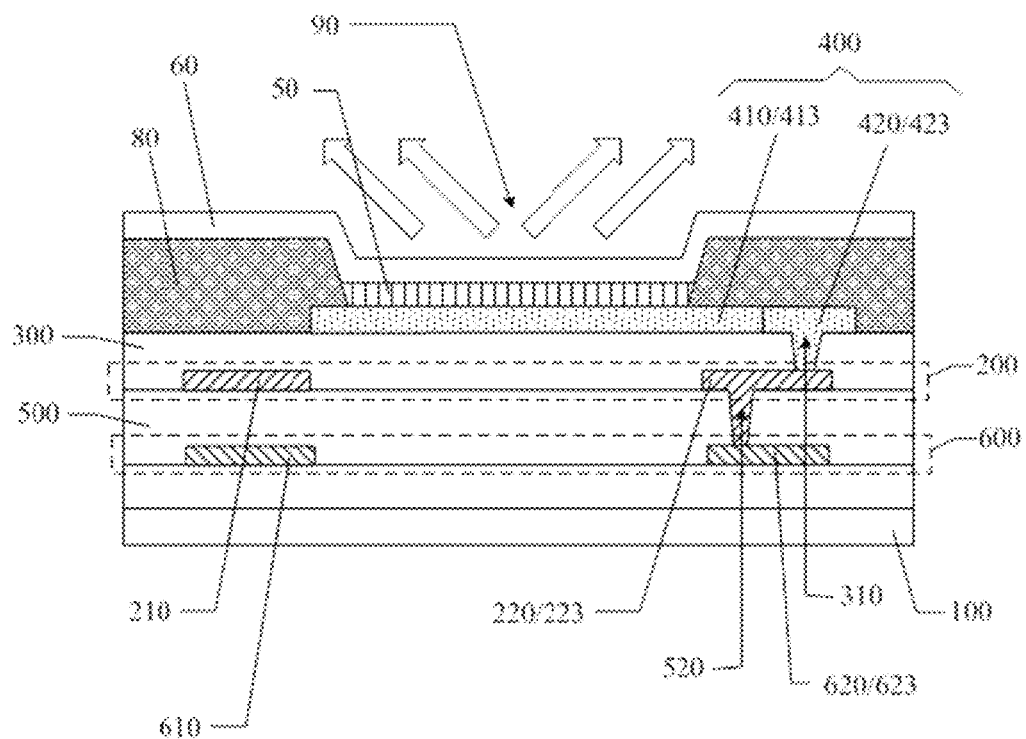
FIG. 6A is a schematic cross-sectional structural view of the display panel shown in FIG. 3A along an AA' direction.

In a specific implementation, in the embodiments of the present disclosure, as shown in FIG. 6A, each sub-pixel may further comprise a pixel defining layer 80 located on a side of the anode 400 away from the substrate 100, a light emitting layer 50 on the side of the anode 400 away from the substrate 100, and a cathode 60 located on the side of the anode 400 away from the light emitting layer 50. The pixel defining layer 80 has an opening, and the opening exposes at least a portion region of the main portion 410 of the anode 400, the light emitting layer 50 is located within the opening and is in contact with the portion region of the main portion 410 exposed by the opening, so the region of the light emitting layer 50 in the opening is used to emit light, so that an effective light emitting region 90 can be defined by the opening. That is, part regions where the openings of the pixel defining layer 80 overlap the main portions 410 of the anodes 400 are effective light emitting regions 90 of respective sub-pixels. Illustratively, a portion region of the light emitting layer 50 where an opening of the pixel defining layer 80 in a third color sub-pixel 030 overlaps the main portion 413 of the anode 400 of the third color sub-pixel 030 is an effective light emitting region 90-030 of the third color sub-pixel 030. A portion region of the light emitting layer 50 where an opening of the pixel defining layer 80 in a first color sub-pixel 010 overlaps the main portion 411 of the anode 400 of the first color sub-pixel 010 is an effective light emitting region 90-010 of the first color sub-pixel 010. A portion region of the light emitting layer 50 where an opening of the pixel defining layer 80 in a second color sub-pixel 021 overlaps the main portion 4121 of the anode 400 of the second color sub-pixel 021 is an effective light emitting region 90-021 of the second color sub-pixel 021. A portion region of the light emitting layer 50 where an opening of the pixel defining layer 80 in a second color sub-pixel 022 overlaps the main portion 4122 of the anode 400 of the second color sub-pixel 022 is an effective light emitting region 90-022 of the second color sub-pixel 022.

It should be noted that, in an embodiment of the present disclosure, each light emitting layer may comprise an electroluminescent layer itself and other common layers located on both sides of the electroluminescent layer, for example, the other common layers may comprise a hole injection layer, a hole transport layer, an electron injection layer, an electron transport layer, and the like, however, in the drawings of the present disclosure, only the electroluminescent layer in the light emitting layer is shown, and the other common layers are not shown. Illustratively, a material of the electroluminescent layer may comprise an organic electroluminescent material such that the electroluminescent display panel may be an OLED display panel. Alternatively, the material of the electroluminescent layer may also comprise: a quantum dot electroluminescent material, such that the electroluminescent display panel is a quantum dot light emitting diode (QLED) display panel.

Figure 4:
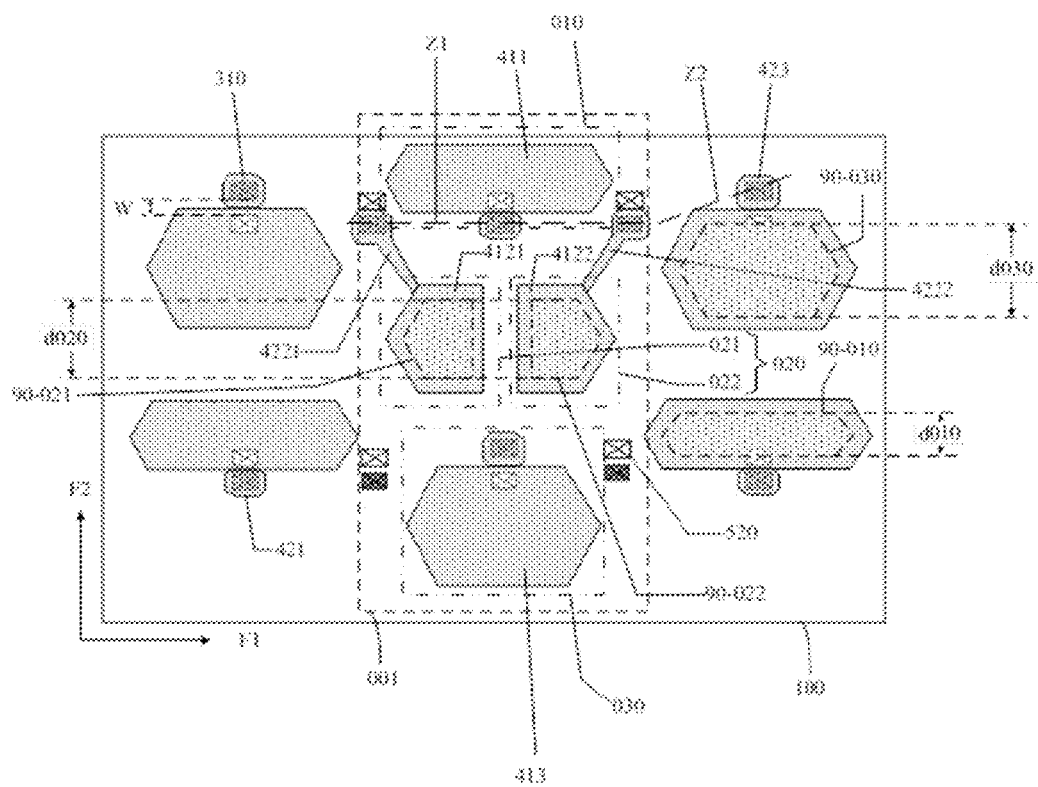
FIG. 4 is a schematic structural diagram of an anode, a first hole, and a second hole in a display panel provided by some embodiments of the present disclosure.

In a specific implementation, in the embodiments of the present disclosure, as shown in FIG. 3A and FIG. 4, in the same sub-pixel, the orthographic projection of the first hole 310 on the substrate 100 does not overlap the orthographic projection of the second hole 520 on the substrate 100, which can avoid the problem that the anode cannot be electrically connected to the second connection line due to the holes being too deep.

Figure 3B:
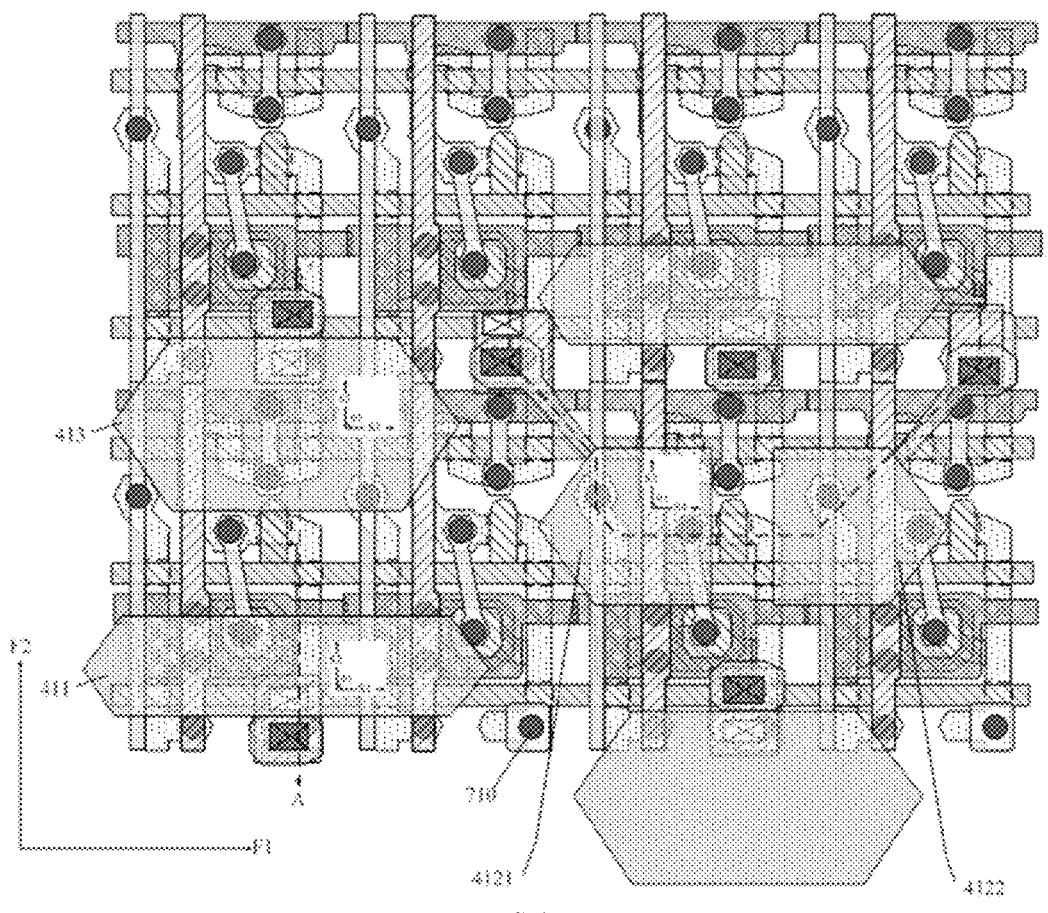
FIG. 3B is a schematic diagram showing a top structure of a display panel provided by other embodiments of the present disclosure.
Figure 5A:
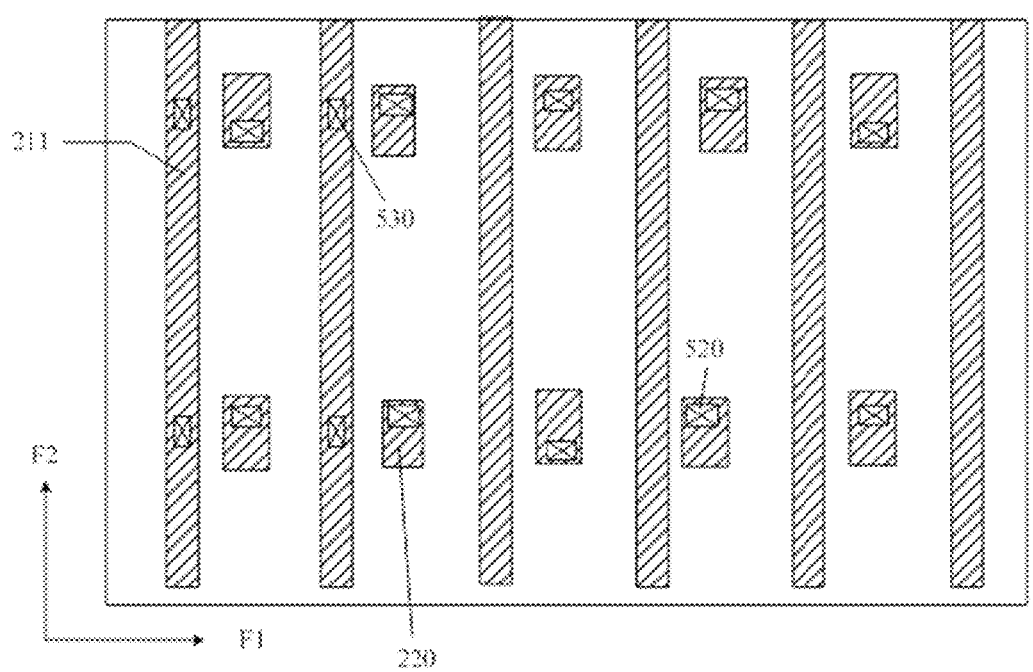
FIG. 5A is a schematic structural diagram of a first conductive layer, a second hole, and a third hole of a display panel provided by some embodiments of the present disclosure.

Illustratively, in a specific implementation, in the embodiments of the present disclosure, as shown in FIG. 3A, FIG. 3B, and FIG. 5A, the first power line 210 may comprise a plurality of sub-power lines 211 arranged in the first direction F1 and extending in the second direction F2. The first direction F1 is different from the second direction F2. Illustratively, the first direction F1 is perpendicular to the second direction F2. Illustratively, the first direction F1 may be a row direction of the display panel, that is, a direction in which the gate lines extend, the second direction F2 may be a column direction of the display panel, that is, a direction in which the data lines extend. Of course, the embodiments of the present disclosure comprise but are not limited thereto.

Figure 3C:
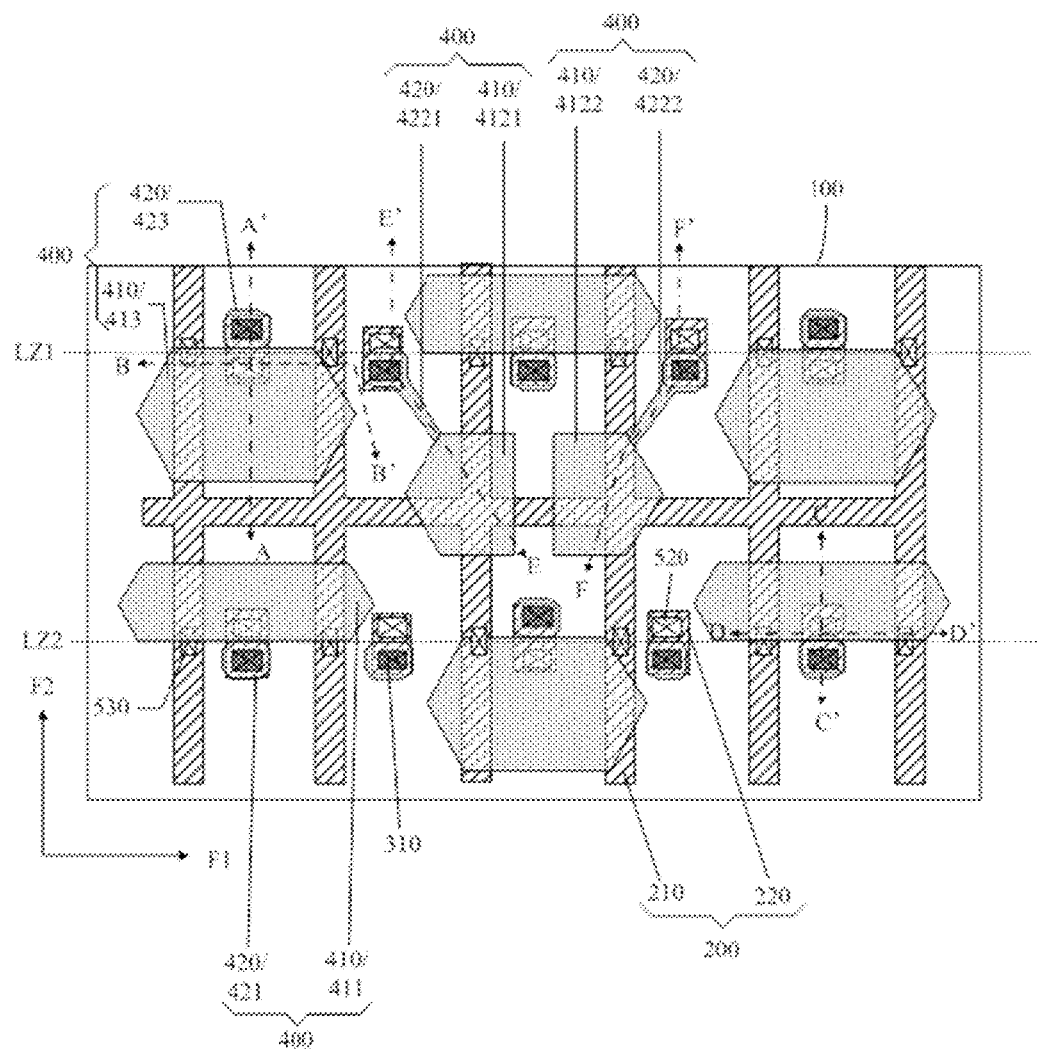
FIG. 3C is schematic diagram showing a top structure of a display panel provided by still other embodiments of the present disclosure.
Figure 5B:
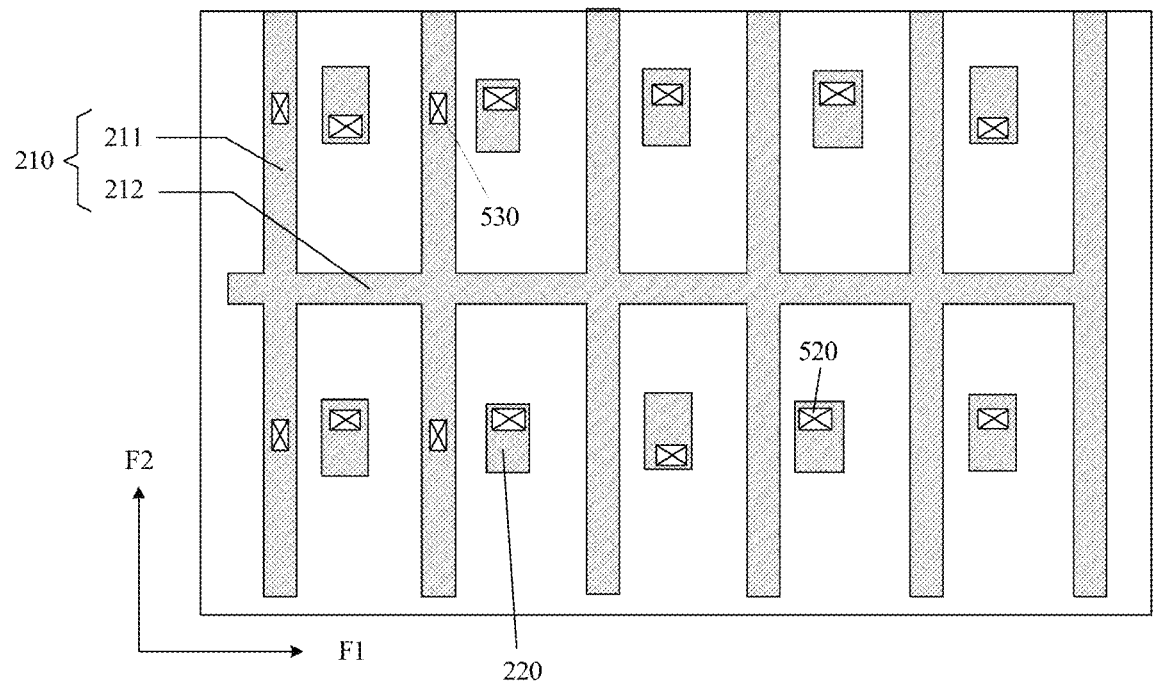
FIG. 5B is a schematic structural diagram of a first conductive layer, a second hole, and a third hole of a display panel provided by other embodiments of the present disclosure.

Illustratively, in a specific implementation, in the embodiments of the present disclosure, as shown in FIG. 3C and FIG. 5B, the first power line 210 may include a plurality of sub-power lines 211 arranged in the first direction F1 and extending, in the second direction F2, and a conductive line 212 electrically connecting the respective sub-power lines 211, thereby further reducing the resistance of the first power line 210. Illustratively, the first direction F1 is perpendicular to the second direction F2. Of course, the embodiments of the present disclosure comprise but are not limited thereto.

Illustratively, in a specific implementation, in the embodiments of the present disclosure, as shown in FIG. 3C and FIG. 5B, the sub-power lines 211 and the conduction line 212 generally form a structure of grids, one first connection line 220 is disposed inside each of the grids, there is a gap between the first connection line 220 and each sub-power line 211 and a gap between the first connection line 220 and the conduction line 212.

Generally in a display field, a pixel usually comprises a plurality of sub-pixels, each of the sub-pixels can display a single color (for example, red, green, or blue), the display of different colors is achieved by controlling the ratio of sub-pixels of different colors, and thus the above sub-pixels may be monochrome sub-pixels. In a specific implementation, in the embodiments of the present disclosure, as shown in FIG. 3A to FIG. 4, each repeat unit of the plurality of repeat units 001 may comprise a first color sub-pixel 010, a second color sub-pixel pair 020, and a third color sub-pixel 030 which are arranged in the second direction F2. The second color sub-pixel pair 020 may comprise two second color sub-pixels 021 and 022 arranged in the first direction F1. The first color sub-pixel 010 is configured to emit light of a first color, the second color sub-pixels 021 and 022 are configured to emit light of a second color, and the third color sub-pixel 030 is configured to emit light of a third color. In some examples, the first color, the second color, and the third color may be selected from the group consisting of red, green, and blue. For example, the first color is red, the second color is green, and the third color is blue. Thus, the repeat unit 001 has an arrangement structure of a red sub-pixel, green sub-pixels, and a blue sub-pixel. Of course, the embodiments of the present disclosure comprise but are not limited thereto. The first color, the second color, and the third color described above may also be other colors.

In a specific implementation, in the embodiments of the present disclosure, as shown in FIG. 3A to FIG. 4, the plurality of repeat units 001 are arranged in the second direction F2 to form repeat unit groups, the repeat unit groups are arranged in the first direction F1, and repeat units 001 in one repeat unit group of two adjacent repeat units and repeat units 001 in the other repeat unit group of two adjacent repeat units are misaligned. Illustratively, the repeat units in one repeat unit group of two adjacent repeat units and the repeat units in the other repeat unit group of two adjacent repeat units differ by a size of ½ of the repeat unit 001. It should be noted that the size of the above one repeat unit 001 may be a distance between centers of the same color sub-pixels in two adjacent repeat units 001 in the second direction F2. For example, the size of the above one repeat unit 001 may be a distance between centers of the first color star-pixels 010 in two adjacent repeat units 001 in the second direction F2.

Alternatively, for example, the repeat units in one repeat unit group of two adjacent repeat units and the repeat units in the other repeat unit group of two adjacent repeat units are staggered from each other in the second direction, that is, adjacent repeat units in adjacent repeat unit groups have a certain offset in the second direction. Therefore, the same color sub-pixels in adjacent repeat unit groups are not aligned in the second direction. In some examples, the offsets of the same color sub-pixels in the adjacent repeat unit groups in the second direction may be half a size of the repeat unit in the second direction. For example, the size of the repeat unit in the second direction may be a pith of the repeat unit in the second direction.

In a specific implementation, in the embodiments of the present disclosure, as shown in FIG. 3A to FIG. 4, because the second color sub-pixel pair 020 can comprise two second color sub-pixels 021 and 022 arranged in the first direction F1, when the light emitting, layer is manufactured by a FMM evaporation process, light emitting layers of the two second color sub-pixels 021 and 022 of each second color sub-pixel pair 020 may be connected, and the light emitting layers of the two second color sub-pixels 021 and 022 of each second color sub-pixel pair 020 are formed by one evaporation hole of the FMM. In a case where the second color is green, the process difficulty of forming the light-emitting layer of the green sub-pixel can be reduced to some extent.

In addition, although a shape of a main portion of each sub-pixel in the drawings comprises a strict angle formed by two line segments, in some embodiments, a shape of an effective light emitting region of each sub-pixel may be a fillet shape. That is, on the basis of the above various shapes, corners of the effective light emitting region of each sub-pixel are rounded. For example, in a case where a light emitting layer is evaporated through a mask, a portion of the light emitting layer located at a corner may naturally form fillet shape.

In some examples, as shown in FIGS. 3a to 4, a shape of the main portion of the first color sub-pixel 010 and a shape of the main portion of the third color sub-pixel 030 may both be hexagon, and two opposite edges in each of three sets of opposite edges of the hexagon are parallel. A shape of the main portion of each of the second color sub-pixels 021, 022 may be a pentagon, and the pentagon comprises two edges that are not orthogonally intersected, a set of parallel opposite edges, and a vertical edge, the vertical edge is perpendicular to the set of parallel opposite edges, and the two edges that are not orthogonally intersected are used to connect the set of parallel opposite edges. The vertical edges of the second color sub-pixels 021, 022 of each second color sub-pixel pair 020 are disposed adjacent to each other.

In some examples, as shown in FIGS. 3a to 4, a set of longer parallel opposite edges of the main portion of the first color sub-pixel 010 and a set of longer parallel opposite edges of the main portion of the third color sub-pixel 030 are respectively parallel to the set of parallel opposite edges of the main portion of the second color sub-pixel 021 and the set of parallel opposite edges of the main portion of the second color sub-pixel 022. Further, illustratively, a set of longer parallel edges of the effective light emitting region 90-010 of the first color sub-pixel 010 and a set of longer parallel edges of the effective light emitting region 90-030 of the third color sub-pixel 030 are respectively parallel to a set of parallel opposite edges of the effective light emitting region 90-021 of the second color sub-pixel 021 and a set of parallel opposite edges of the effective light emitting region 90-022 of the second color sub-pixel 022.

In some examples, as shown in FIGS. 3a to 4, an area of the first color sub-pixel 010 is larger than an area of one second color sub-pixel 020, and an area of the third color sub-pixel 030 is larger than an area of one second color sub-pixel 020. For example, an area of the effective light emitting region 90-010 of the first color sub-pixel 010 is larger than an area of the effective light emitting region 90-021, 90-022 of one second color sub-pixel 020, and an area of the effective light emitting region 90-030 of the third color sub-pixel 030 is larger than an area of the effective light emitting region 90-021, 90-022 of one second color sub-pixel 020.

In a specific implementation, in the embodiments of the present disclosure, as shown in FIG. 3A to FIG. 4, a staggered distance in the second direction F2 of two repeat units which are adjacent in the first direction F1 is larger than one or a combination of several selected from the group consisting of the maximum span the first color sub-pixel 010, the maximum span of the second color sub-pixel 021, the maximum span of the second color sub-pixel 022, and the maximum span of the third color sub-pixel 030. For example, a staggered distance in the second direction F2 of two repeat units which are adjacent in the first direction F1 is larger than one or a combination of several selected from the group consisting of the maximum span d010 of the effective light emitting region 90-010 of the first color sub-pixel 010, the maximum span d020 of the effective light emitting region 90-021 of the second color sub-pixel 021, the maximum span d020 of the effective light emitting region 90-022 of the second color sub-pixel 022, and the maximum span d030 of the effective light emitting region 90-030 of the third color sub-pixel 030.

In a specific implementation, in the embodiments of the present disclosure, as shown in FIG. 3A to FIG. 4, in a repeat unit 001, the farthest distance between the second color sub-pixel 021 and the second color sub-pixel 022 in the second color sub-pixel pair 020 in the first direction F1 is larger than the farthest distance between any two points in the first color sub-pixel 010 in the first direction F1. For example, in a repeat unit 001 the farthest distance between the effective light emitting region 90-021 of the second color sub-pixel 021 of the second color sub-pixel pair 020 and the effective light emitting region 90-022 of the second color sub-pixel 022 of the second color sub-pixel pair 020 in the first direction F1 is greater than the farthest distance between any two points in the effective light emitting region 90-010 of the first color sub-pixel 010 in the first direction F1.

In a specific implementation, in the embodiments of the present disclosure, as shown in FIG. 3A to FIG. 4, in a repeat unit 001, the farthest distance between the second color sub-pixel 021 and the second color sub-pixel 022 of the second color sub-pixel pair 020 in the first direction F1 is greater than the farthest distance between any two points in the third color sub-pixel 030 in the first direction F1. For example, in a repeat unit 001, the farthest distance between the effective light emitting region 90-021 of the second color sub-pixel 021 of the second color sub-pixel pair 020 and the effective light emitting region 90-022 of the second color sub-pixel 022 of the second color sub-pixel pair 020 in the first direction F1 is greater than the fluffiest distance between any two points in the effective light emitting region 90-030 of the third color sub-pixel 030 in the first direction F1.

In a specific implementation, in the embodiments of the present disclosure, as shown in FIG. 3A to FIG. 4, adjacent sub-pixels of the first color sub-pixel do not comprise the first color sub-pixel, and adjacent sub-pixels of the second color sub-pixel pair do not comprise the second color sub-pixel, and adjacent sub-pixels of the third color sub-pixel do not comprise the third color sub-pixel.

In a specific implementation, in the embodiments of the present disclosure, as shown in FIG. 3A to FIG. 4, in the first direction F1 and the second direction F2, two first color sub-pixels 010 are separated by other sub-pixels other than the first color sub-pixel, two third color sub-pixels 030 are separated by other sub-pixels other than the third color sub-pixel, and two second color sub-pixel pairs are separated by other sub-pixels other than the second color sub-pixel.

In a specific implementation, in the embodiments of the present disclosure, as shown in FIG. 3A to FIG. 4, two adjacent repeat units arranged in the first direction F1 are taken as one repeat group. Illustratively, in the same repeat group, the second color sub-pixel pair in one repeat unit is in the maximum span between the first color sub-pixel and the third color sub-pixel in the other repeat unit in the second direction F2. For example, in the same repeat group, the effective light emitting regions of the second color sub-pixel pair in one repeat unit is in the maximum span between an effective light emitting region of the first color sub-pixel of the other one repeat unit and an effective light emitting region of the third color sub-pixel of the other one repeat unit in the second direction F2.

In a specific implementation, in the embodiments of the present disclosure, as shown in FIG. 3A to FIG. 4, two adjacent repeat units arranged in the first direction F1 are taken as one repeat group. Illustratively, in the same repeat group, the first color sub-pixel in one repeat unit is in the maximum span between the second color sub-pixel pair in the other repeat unit and the third color sub-pixel in the other repeat unit in the second direction F2. For example, in the same repeat group, the effective light emitting region of the first color sub-pixel in one repeat unit is in the maximum span between the effective light emitting regions of the second color sub-pixel pair of the other one repeat unit and the effective light emitting region of the third color sub-pixel of the other one repeat unit in the second direction F2.

In a specific implementation, in the embodiments of the present disclosure, as shown in FIG. 3A to FIG. 4, two adjacent repeat units arranged in the first direction F1 are taken as one repeat group. Illustratively, in the same repeat group, the third color sub-pixel in one repeat unit is in the maximum span between the second color sub-pixel pair in the other repeat unit and the first color sub-pixel in the other repeat unit in the second direction F2. For example, in the same repeat group, the effective light emitting region of the third color sub-pixel in one repeat unit is in the maximum span between the effective light emitting regions of the second color sub-pixel pair of the other one repeat unit and the effective light emitting region of the first color sub-pixel of the other one repeat unit in the second direction F2.

In a specific implementation, in the embodiments of the present disclosure, as shown in FIG. 3A to FIG. 4, in the same repeat unit 001, the minimum distance between the two second color sub-pixels 021, 022 of the same second color sub-pixel pair 020 in the first direction F1 is smaller than the maximum span of the first color sub-pixel 010 in the first direction F1. For example, in the same repeat unit 001, the minimum distance between the effective light emitting region 90-021 of the second color sub-pixel 021 in the same second color sub-pixel pair 020 and the effective light emitting region 90-022 of the second color sub-pixel 022 in the same second color sub-pixel pair 020 in the first direction F1 is less than the maximum span d010 of the effective light emitting region 90-010 of the first color sub-pixel 010 in the first direction F1.

In a specific implementation, in the embodiments of the present disclosure, as shown in FIG. 3A to FIG. 4, in the same repeat unit 001, the minimum distance between the two second color sub-pixels 021, 022 of the same second color sub-pixel pair 020 in the first direction F1 is smaller than the maximum span of the third color sub-pixel 030 in the first direction F1. For example, in the same repeat unit 001, the minimum distance between the effective light emitting region 90-021 of the second color sub-pixel 021 in the same second color sub-pixel pair 020 and the effective light emitting region 90-022 of the second color sub-pixel 022 in the same second color sub-pixel pair 020 in the first direction F1 is less than the maximum span d030 of the effective light emitting region 90-030 of the third color sub-pixel 030 in the first direction F1.

In a specific implementation, in the embodiments of the present disclosure, as shown in FIG. 3A to FIG. 4, sub-pixel arrangement manners of repeat units in the odd-numbered repeat unit group are the same, and sub-pixel arrangement manners of repeat units in the even-numbered repeat unit group are the same. For example, except for an edge portion of a display region of the substrate, a line of centers of two green sub-pixels in each repeat unit is located between centers of a red sub-pixel and a blue sub-pixel which are adjacent in an adjacent repeat unit group. In addition, edges of the two green sub-pixels are inside the outer edges of the red sub-pixel and the blue sub-pixel which are adjacent, and the outer edges here refer to the edges, that are opposite to each other, of the two sub-pixels in the first direction F1. That is, in the first direction F1, an extending range of one green sub-pixel pair in the first direction F1 is not greater than an extending range of the red sub-pixel and the blue sub-pixel which are adjacent in the first direction F1. In addition, in the embodiments of the present disclosure, unless otherwise specified, "center" of a sub-pixel refers to a geometric center of a shape of the sub-pixel (e.g., a first color sub-pixel, a second color sub-pixel, or a third color sub-pixel).

It should be noted that, in a case of designing a sub-pixel arrangement structure, the sub-pixel is generally designed to have a regular shape, such as a hexagon, a pentagon, a trapezoid, or other shape. In a case of designing, the center of the sub-pixel may be the geometric center of the regular shape described above. However, in the actual manufacturing process, the shape of the formed sub-pixel generally deviates from the above designed regular shape. For example, the corners of the above regular shape may become fillet corners, and therefore, the shape of the sub-pixel may be a fillet shape. In addition, the shape of the actually formed sub-pixel may also have other variations from the design shape. For example, the shape of a sub-pixel designed to have a hexagon may become an approximately elliptical shape in actual manufacturing. Therefore, the center of the sub pixel may not be the strict geometric center of the irregular shape of the formed sub-pixel. In the embodiment of the present disclosure, the center of the sub-pixel may have a certain offset from the geometric center of the shape of the sub-pixel. The center of the sub-pixel refers to any point in an area enclosed by specific points on the radiant line segments from the geometric center of the sub-pixel to the edge points of the sub-pixel, and the specific point on the radiant line segment is at ⅓ of a length of the radiant line segment from the geometric center. The definition of the center of the sub-pixel can be applied to the center of the sub-pixel having a regular shape, and can also be applied to the center of the sub-pixel having an irregular shape.

In a specific implementation, in the embodiments of the present disclosure, as shown in FIG. 3A to FIG. 4, in each three adjacent repeat unit groups which are in three adjacent columns, the three adjacent columns sequentially comprise a first column, a second column, and a third column along a row direction (i.e., the first direction F1). The shortest distance between the centers of the two second color sub-pixels 021, 022 of the second color sub-pixel pair 020 in the second column in the row direction is smaller than the minimum distance between the center of the first color sub-pixel 010 in the first column and the center of the first color sub-pixel 010 in the third column in the row direction.

In a specific implementation, in the embodiments of the present disclosure, as shown in FIG. 3A to FIG. 4, an edge of the first color sub pixel 010 in the second direction F2 is arranged in parallel with an edge of the third color sub-pixel 030 in the second direction F2.

In a specific implementation, in the embodiments of the present disclosure, is shown in FIG. 3A to FIG. 4, in each repeat unit 001, the first color sub-pixel 010, the second color sub-pixel pair 020, and the third color sub-pixel 030 are arranged in the same order.

In a specific implementation, in the embodiments of the present disclosure, as shown in FIG. 3A to FIG. 4, a size of the main portion 411 of the first color sub-pixel 010 in the second direction F2 is smaller than a size of the main portion 413 of the third color sub-pixel 030 in the second direction F2. Also, a size of the main portion 411 of the first color sub-pixel 010 in the first direction F1 is larger than a size of the main portion 413 of the third color sub-pixel 030 in the first direction F1. Illustratively, a size of the main portion 413 of the third color sub-pixel 030 in the second direction F2 is smaller than a size of the main portion 413 of the third color sub-pixel 030 in the first direction F1, and the size of the main portion 411 of the first color sub-pixel 010 in the second direction F2 is smaller than the size of the main portion 411 of the first color sub-pixel 010 in the first direction F1. Of course, the embodiments of the present disclosure comprise but are not limited thereto, and the relationship among the above various sizes may also be in other forms.

In a specific implementation, in the embodiments of the present disclosure, as shown in FIG. 3A to FIG. 8C, each sub-pixel further comprises: a pixel driving circuit located on a side of the first conductive layer 200 facing the substrate 100; and pixel driving circuits in respective sub-pixels are arranged in an array. It should be noted that the structures of respective layers of the pixel driving circuit can refer to the structures shown in FIG. 2A to FIG. 2G, and details are not described herein.

In a specific implementation, in the embodiments of the present disclosure, as shown in FIG. 2G and FIG. 3B, a pixel driving circuit in the third color sub-pixel 030, a pixel driving circuit in a second color sub-pixel of number one 021, a pixel driving circuit in the first color sub-pixel 010, and a pixel driving circuit in a second color sub-pixel of number two 022 are sequentially arranged in the first direction F1. Of course, the present disclosure comprises but is not limited thereto.

In a specific implementation, in the embodiments of the present disclosure, as shown in FIG. 2G and FIG. 3B, a size of a region where each layer pattern in each pixel driving circuit is located in the second direction F2 is larger than a size of the region where each layer pattern in etch pixel driving circuit is located in the first direction F1. Of course, the present disclosure comprises but is not limited thereto.

In a specific implementation, in the embodiments of the present disclosure, as shown in FIG. 2G and FIG. 3B, there is a first angle $\theta1$ between an extending direction S1 of the main portion 411 of the first color sub-pixel 010 and a length direction S2 of a region where a pixel driving circuit of the first color sub-pixel 010 is located, and the first angle is between 45 degrees and 165 degrees. Illustratively, $\theta1$ may be approximately 90 degrees, that is, the extending direction S1 (e.g., the extending direction of the main portion 411 of the first color sub-pixel 010 may be the first direction F1) of the main portion 411 of the first color sub-pixel 010 is substantially perpendicular to the length direction (for example, the length direction of the region where the pixel driving circuit of the first color sub-pixel 010 is located may be the second direction F2) of the region where the pixel driving circuit of the first color sub-pixel 010 is located. Of course, $\theta1$ can also be approximately between 45 degrees and 135 degrees, between 75 degrees and 115 degrees, or 50 degrees, 80 degrees, 100 degrees, 120 degrees, and 140 degrees. The present disclosure comprises but is not limited thereto.

In a specific implementation, in the embodiments of the present disclosure, as shown in FIG. 2G and FIG. 3B, there is a second angle $\theta2$; between an extending direction S3 of the main portion 413 of the third color sub-pixel 030 and a length direction S2 of a region where a pixel driving circuit of the third color sub-pixel 030 is located, and the second angle $\theta2$ is between 45 degrees and 165 degrees. Illustratively, $\theta2$ may be approximately 90 degrees, that is, the extending direction S3 (for example, the extending direction S3 of the main portion 413 of the third color sub-pixel 030 is the first direction F1) of the main portion 413 of the third color sub-pixel 030 is substantially perpendicular to the length direction S2 (for example, the length direction of the region where the pixel driving circuit of the third color sub-pixel 030 is located is the second direction F2) of the region where the pixel driving circuit of the third color sub-pixel 030 is located. Of course, $\theta2$ can also be approximately 45 degrees, 75 degrees, 115 degrees, and 135 degrees. The present disclosure comprises but is not limited thereto.

In a specific implementation, in the embodiments of the present disclosure, as shown in FIG. 2G and FIG. 3B, there is a third angle $\theta3$ between an extending direction S4 of the second color sub-pixel pair 020 and a length direction S2 of a region where pixel driving circuits of the second color sub-pixel pair 020 are located, and the third angle $\theta3$ is between 45 degrees and 165 degrees. Illustratively, $\theta3$ may be approximately 90 degrees, that is, the extending direction S4 (for example, the extending direction S4 of the second color sub-pixel pair 020 is the first direction F1) of the second color sub-pixel pair 020 is substantially perpendicular to the length direction S2 (for example, the length direction of the region where the pixel driving circuits of the second color sub-pixel pair 020 are located is the second direction F2) of the region where the pixel driving circuits of the second color sub-pixel pair 020 are located. Of course, θ3 can also be approximately between 45 degrees and 135 degrees, between 75 degrees and 115 degrees, or 50 degrees, 80 degrees, 100 degrees, 120 degrees, and 140 degrees. The present disclosure comprises but is not limited thereto.

In a specific implementation, for example, a rectangular region is defined to comprise a pattern of each film layer of a pixel driving circuit of a sub-pixel, for example, as shown by a dotted line frame in FIG. 2G, rectangular regions for defining pixel driving circuits of the respective sub-pixels are arranged in a matrix on the substrate, and a long edge direction of the rectangular region is substantially perpendicular to the extending direction of the main portion of the first color sub-pixel.

In a specific implementation, for example, a rectangular region is defined to comprise a pattern of each film layer of a pixel driving circuit of a sub-pixel, for example, as shown by a dotted line frame in FIG. 2G, rectangular regions for defining, pixel driving circuits of the respective sub-pixels are arranged in a matrix on the substrate, and a long edge direction of the rectangular region is substantially perpendicular to the extending direction of the main portion of the third color sub-pixel.

In a specific implementation, in the embodiments of the present disclosure, as shown in FIG. 2A to FIG. 6C, in the third color sub-pixel 030, an orthographic projection of the main portion 413 on the substrate 100 does not overlap the driving transistor in the pixel driving circuit, and the orthographic projection of the main portion 413 on the substrate 100 overlaps with orthographic projections of a reset control signal line that is, a first reset control signal line Rst1a or a second reset control signal line Rst2a of the next row) and a reset power signal line (that is, a first reset power signal line Init1a or a second reset power signal line Init2a of the next row), which are electrically connected to pixel driving circuits in a next row (which is adjacent to a row where the pixel driving circuit of the third color sub-pixel is located), on the substrate 100, the orthographic projection of the main portion 413 on the substrate 100 overlaps with orthographic projections of two data lines Vd on the substrate 100, and the orthographic projection of the main portion 413 on the substrate 100 overlaps with orthographic projections of two second power lines 610 on the substrate 100. Illustratively, the data line Vd and the power source fine 610 whose orthographic projections overlaps with the main portion 413 are alternately arranged. Of course, the present disclosure comprises but is not limited thereto.

In a specific implementation, in the embodiments of the present disclosure, as shown in FIG. 3A to FIG. 5B in the third color sub-pixel 030, the orthographic projection of the main portion 413 on the substrate 100 covers orthographic projections of two sub-power lines 211 on the substrate 100. And the two sub-power lines 211 overlapping the orthographic projection of the main portion 413 on the substrate 100 are disposed in parallel on both sides of a center of the main portion 413. Illustratively, the orthographic projections of the two sub-power lines 211 overlapping the orthographic projection of the main portion 413 on the substrate 100 passes through the orthographic projection of the main portion 413.

In a specific implementation, in the embodiments of the present disclosure, as shown in FIG. 3A to FIG. 5B, in the first color sub-pixel 010, the orthographic projection of the main portion 411 on the substrate 100 covers orthographic projections of two sub-power lines 211 on the substrate 100. And the two sub-power lines 211 overlapping the orthographic projection of the main portion 411 on the substrate 100 are disposed in parallel on both sides of a center of the main portion 411. Illustratively, the orthographic projections of the two sub-power lines 211 overlapping the orthographic projection of the main portion 411 on the substrate 100 passes through the orthographic projection of the main portion 411.

In a specific implementation, in the embodiments of the present disclosure, as shown in FIG. 3A to FIG. 6C, in the first color sub-pixel 010, the orthographic projection of the main portion 411 on the substrate 100 overlaps with the driving transistor in the pixel driving circuit, the orthographic projection of the main portion 411 on the substrate 100 overlaps with an orthographic projection of a light emitting control sigma lisle (the light emitting control signal line EM1a or the second light emitting control signal line EM2a), which is electrically connected to the pixel driving circuit of the first color sub-pixel, on the substrate 100 the orthographic projection of the main portion 411 on the substrate 100 overlaps with orthographic projections of two data lines Vd on the substrate 100, and the orthographic projection of the main portion 411 on the substrate 100 overlaps with orthographic projections of two second power lines 610 on the substrate 100. Of course, the present disclosure comprises but is not limited thereto.

In a specific implementation, in the embodiments of the present disclosure, as shown in FIG. 3C to FIG. 5B, in the second color sub-pixel, an orthographic projection of the main portion on the substrate at least partially overlaps orthographic projections of one sub-power line and a conduction line electrically connected to the sub-power line on the substrate. Illustratively, as shown in FIG. 3C and FIG. 5B, the second color sub-pixel pair 020 can comprise a second color sub-pixel of number one 021 and a second color sub-pixel of number two 022. In the second color sub-pixel of number one 021, the orthographic projection of the main portion 4121 on the substrate 100 partially overlaps orthographic projections of a sub-power line 211 and a conduction line 212 electrically connected to the sub-power line 211 on the substrate 100. Illustratively, the sub-power line 211 and the conduction line 212 overlapping the orthographic projection of the main portion 4121 on the substrate 100 may be arranged in a cross shape. Of course, the present disclosure comprises but is not limited thereto. The above-described sub-power line 211 and the conduction line 212 overlapping the orthographic projection of the main portion 4121 on the substrate 100 may also be disposed in other modes.

Figure 6B:
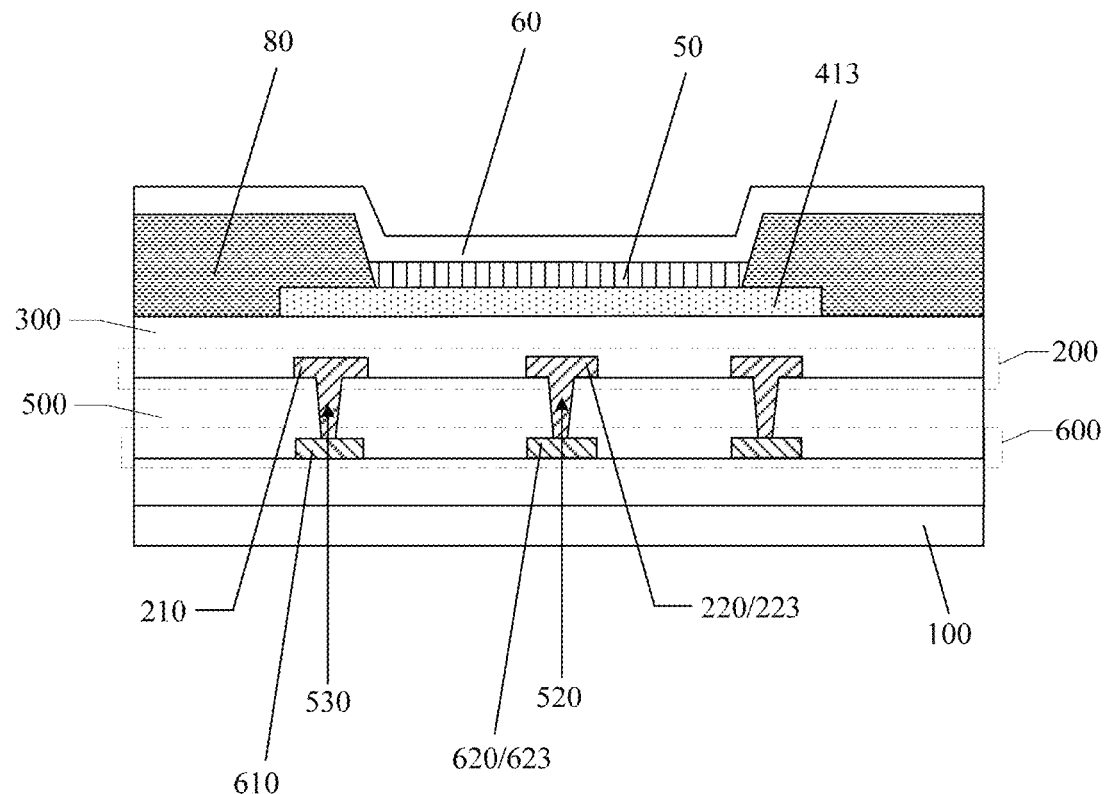
FIG. 6B is a schematic cross-sectional structural view of the display panel shown in FIG. 3A along a BB' direction.
Figure 6C:
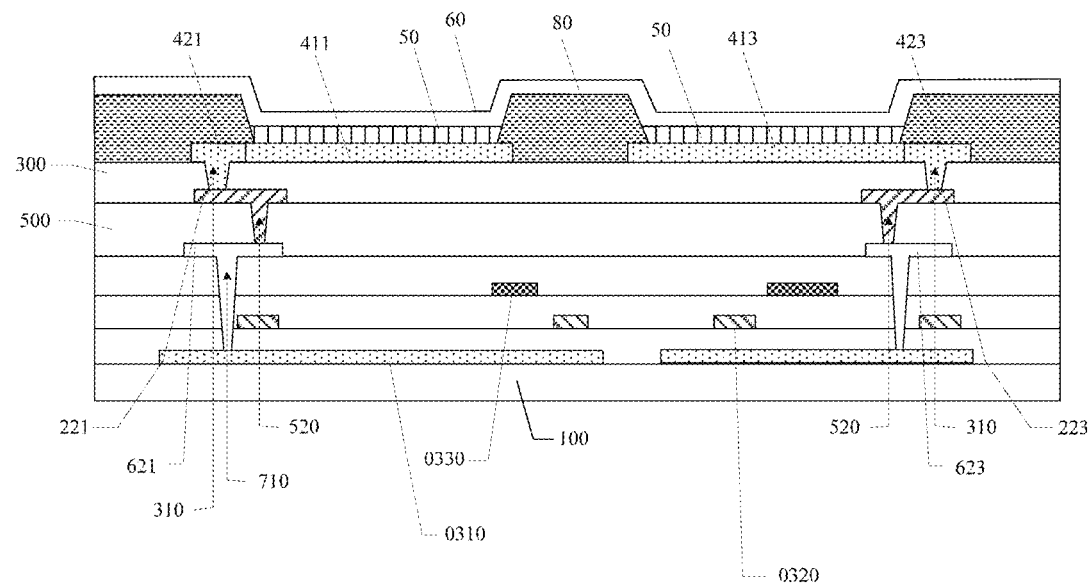
FIG. 6C is a schematic cross-sectional structural view of the display panel shown in HG. 3B along an AA' direction.

In a specific implementation, in the embodiments of the present disclosure, as shown in FIG. 3B, FIG. 5B, and FIG. 6C, in the second color sub-pixel of number one 021, the orthographic projection of the main portion 4121 on the substrate 100 does not overlap the driving transistor in the pixel driving circuit, and the orthographic projection of the main portion 4121 on the substrate 100 overlaps with orthographic projections of a reset control signal line (that is, a first reset control signal line Rst1a or a second reset control signal line Rst2a of the next row) and a scan signal line (that is, a first scan signal line Ga1a or a second scan signal line Ga2a of the next row), which are electrically connected to pixel driving circuits in a next row (which is adjacent to a row where the pixel driving circuit of the second color sub-pixel of number one is located), on the substrate. Of course, the present disclosure comprises but is not limited thereto.

In a specific implementation, in the embodiments of the present disclosure, as shown in FIG. 3B, FIG. 5B, and FIG. 6C, in the second color sub-pixel of number two 022, an orthographic projection of the main portion 4122 on the substrate 100 does not overlap a driving transistor in the pixel driving circuit, and the orthographic projection of the main portion 4122 on the substrate 100 overlaps with orthographic projections of a reset control signal line (that is, a first reset control signal line Rst1a or a second reset control signal line Rst2a of the next row) and a scan signal line (that is, a first scan signal line Ga1a or a second scan signal line Ga1a of the next row), which are electrically connected to pixel driving circuits in a next row (which is adjacent to a row where the pixel driving circuit of the second color sub-pixel of number two is located), on the substrate 100. Of course, the present disclosure comprises but is not limited thereto.

Illustratively, as shown in FIG. 3C and FIG. 5B, in the second color sub-pixel of number two 022, the orthographic projection of the main portion 4122 on the substrate 100 partially overlaps an orthographic projection of one sub-power line 211 and an orthographic projection of a conduction line 212 electrically connected to the one sub-power line 211 on the substrate 100. Illustratively, the sub-power line 211 and the conduction line 212 overlapping the orthographic projection of the main portion 4122 on the substrate 100 may be arranged in a cross shape. Of course, the present disclosure comprises but is not limited thereto. The above-described sub-power line 211 and the conduction line 212 overlapping the orthographic projection of the main portion 4122 on the substrate 100 may also be disposed in other modes.

In a specific implementation, in the embodiments of the present disclosure, as shown in FIG. 3C and FIG. 5B, the sub-power line 211 and the conduction line 212 are electrically connected to each other, such that the first power line 210 form a grid structure. Illustratively, the conductive lines 212 are arranged in an array on the substrate 100. For example, as shown in FIG. 3C and FIG. 5B, for the third color sub-pixel 030 and the first color sub-pixel 010, which are adjacent, in the same repeat unit group, a conduction line 212 is disposed between the main portion 413 of the third color sub-pixel 030 and the main portion 411 of the first color sub-pixel 010. The conduction line 212 covered by the main portion 4121 and the main portion 4122 in the second color sub-pixel pair 020 extend in the first direction F1 the same straight line.

In a specific implementation, in the embodiments of the present disclosure, as shown in FIG. 3A to FIG. 6C, in each third color sub-pixel 030, the main portion 413 and the auxiliary portion 423 are electrically connected to each other, the auxiliary portion 423 is electrically connected to a first connection line 223 through the first hole 310, the first connection line 223 is electrically connected to a second connection line 623 through the second hole 520, the second connection line 623 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

In a specific implementation, in the embodiments of the present disclosure, as shown in FIG. 3A to FIG. 4, FIG. 6A, and FIG. 6C, in each third color sub-pixel 030, the orthographic projection of the main portion 413 on the substrate 100 does not overlap the orthographic projection of the first hole 310 on the substrate 100, so that the main portion 413 of each third color sub-pixel 030 can be prevented from being affected by the first hole 310, thereby avoiding the occurrence of unevenness of the main portion 413 due to the first hole 310, thereby alleviating color shift phenomenon of the display panel.

Generally, a distance between the first hole 310 and the second hole 520 should not be too far or too close. In a specific implementation, in the embodiments of the present disclosure, in each third color sub-pixel 030, the minimum value of the distance W between the first hole 310 and the second hole 520 in the second direction F2 may be in a range of 1 micrometer to 2 micrometers. The minimum value of the distance W between the first hole 310 and the second hole 520 in the second direction F2 may be; or the minimum value of the distance W between the first hole 310 and the second hole 520 in the second direction F2 may be; or the minimum value of the distance W between the first hole 310 and the second hole 520 in the second direction F2 may be. Of course, in practical applications, the distance W between the first hole 310 and the second hole 520 can be determined according to the actual application environment, and is not limited herein.

Alternatively, the first insulation layer may be configured as a flat layer such that the main portion on the first insulation layer may have a higher flatness.

In a specific implementation, in the embodiments of the present disclosure, as shown in FIG. 3A to FIG. 4, FIG. 6A, and FIG. 6C, in the third color sub-pixel 030, the orthographic projection of the main portion 413 on the substrate 100 and the orthographic projection of the second hole 520 on the substrate 100 at least partially overlap. For example, the orthographic projection of the main portion 413 on the substrate 100 covers the orthographic projection of the second hole 520 on the substrate 100. Because the second hole 520 is located in the second insulation layer 500, the first insulation layer 300 and the first conductive layer 200 are disposed between the second insulation layer 500 and the main portion 413, so that the influence of the second hole 520 on the main portion 413 is small and even may be negligible.

In a specific implementation, in the embodiments of the present disclosure, as shown in FIG. 3B and FIG. 6C, in the third color sub-pixel 030, the first hole 310 is disposed closer to a driving transistor in the pixel driving circuit than the second hole 520. Of course, the present disclosure comprises but is not limited thereto.

In a specific implementations in the embodiments of the present disclosure, as shown in FIG. 3B, each sub-pixel further comprises: a fourth hole 710. Optionally, the fourth holes 710 are arranged on a straight line along the first direction F1, and a spacing between any adjacent two fourth holes on a same straight line is substantially constant. The fourth hole 710 may be a hole 388a.

In a specific implementation, in the embodiments of the present disclosure, as shown in FIG. 3B and FIG. 6C, in the third color sub-pixel 030, an orthographic projection of the fourth hole 710 on the substrate 100 overlaps the orthographic projection of the second hole 520 cart the substrate 100. Of course, the present disclosure comprises but is not limited thereto.

In a specific implementation, in the embodiments of the present disclosure, as shown in FIG. 3B to FIG. 8C, in the third color sub-pixel 030, an orthographic projection of the first hole 310 on the substrate 100 overlaps an orthographic projection of as light emitting control signal line (that is, the first light emitting control signal line EM1a or the second light emitting control signal line EM2a of the current row) electrically connected to the pixel driving circuit on the substrate 100, an orthographic projection of the second hole 520 on the substrate 100 does not overlap the orthographic projection of the light emitting control signal line (that is, the first light emitting control signal line EM1a or the second light emitting control signal line EM2a of the current row) electrically connected to the pixel driving circuit on the substrate 100, and an orthographic projection of the fourth hole 710 on the substrate 100 does not overlap the orthographic projection of the light emitting control signal line (that is, the first light emitting control signal line EM1a or the second light emitting control signal line EM2a of the current row) electrically connected to the pixel driving circuit on the substrate 100.

In a specific implementation, in the embodiments of the present disclosure, as shown in FIG. 3A and FIG. 6B, in the third color sub-pixel 030, the orthographic projection of the main portion 413 on the substrate 100 at least partially overlaps orthographic projections of two third holes 530 on the substrate 100. For example, in the third color sub-pixel 030, the orthographic projection of the main portion. 413 on the substrate 100 partially overlaps the orthographic projections of the two third holes 530 on the substrate 100.

In a specific implementation, in the embodiments of the present disclosure, as shown in FIG. 3A, FIG. 3C, and FIG. 6B, in the third color sub-pixel 030, the first hole 310 is disposed close to a side of a center line LZ1 of the two third holes 530 overlapping the orthographic projection of the main portion 413 on the substrate 100, and the second hole 520 is disposed close to the other side of the center line LZ1 of the two third holes 530 that overlap the orthographic projection of the main portion 413 on the substrate 100. In this way, the first hole 310 and the second hole 520 in the third color sub-pixel 030 can be disposed closer to each other. It should be noted that the center line LZ1 is parallel to the first direction F1. Also, the center line LZ1 is a line passing through centers of the two third holes 530, and is virtual and not a real line.

It should be noted that, the embodiments of the present disclosure, in a plane surface parallel to a plane surface where the substrate is located, a cross section of a hole may be a regular pattern, such as a rectangle, a regular polygon (square, regular pentagon, regular hexagon, etc.), a round, an ellipse, and the like, in this case, the center of the hole may refer to a geometric center of the regular pattern. Of course, in the plane surface parallel to the plane surface where the substrate is located, the cross section of the hole may also be art irregular pattern, and the center of the hole may also refer to an equivalent geometric center of the irregular pattern.

In a specific implementation, in the embodiments of the present disclosure, as shown in FIG. 3A to FIG. 4, in the third color sub-pixel 030, the main portion 413 may be an axisymmetric pattern, and the first hole 310 may be located on a symmetry axis of the main portion 413 along the second direction F2. Illustratively, the main portion 413 in the third color sub-pixel 030 may have a first symmetry axis along the second direction F2, the first hole 310 in the third color sub-pixel 030 is disposed substantially symmetrically about the first symmetry axis, illustratively, the shape of the main portion 413 in the third color sub-pixel 030 is substantially a hexagon or an ellipse, a long symmetry axis of the hexagon or a long axis of the ellipse is substantially parallel to the first direction F1, a short symmetry axis of the hexagon or a short axis of the ellipse is substantially parallel to the second direction F2, and the short symmetry axis of the hexagon or the short axis of the ellipse may be used as the first symmetry axis. Illustratively, the first hole 310 in the third color sub-pixel 030 may be disposed substantially symmetrically about the first symmetry axis, or the first hole 310 in the third color sub-pixel 030 may only intersect the first symmetry axis but is not disposed substantially symmetrically about the first symmetry axis. Certainly, in an actual application, an implementation manner of the first hole 310 in the third color sub-pixel 030 may be designed and determined according to an actual application environment, and is not limited herein.

In a specific implementation, in the embodiments of the present disclosure, as shown in FIG. 3A to FIG. 4, in the third color sub-pixel 030, the second hole 520 may be located on the symmetry axis of the main portion 413 in the second direction F2. Illustratively, the second hole 520 in the third color sub-pixel 030 may be disposed substantially symmetrically with respect to the first symmetry axis. Illustratively, the second hole 520 in the third color sub-pixel 030 may be disposed substantially symmetrically about the first symmetry axis, or the second hole 520 in the third color sub-pixel 030 may only intersect the first symmetry axis but is not disposed substantially symmetrically about the first symmetry axis. Certainly, in an actual application, an implementation manner of the second hole 520 in the third color sub-pixel 030 may be designed and determined according to an actual application environment, and is not limited herein.

Figure 7A:
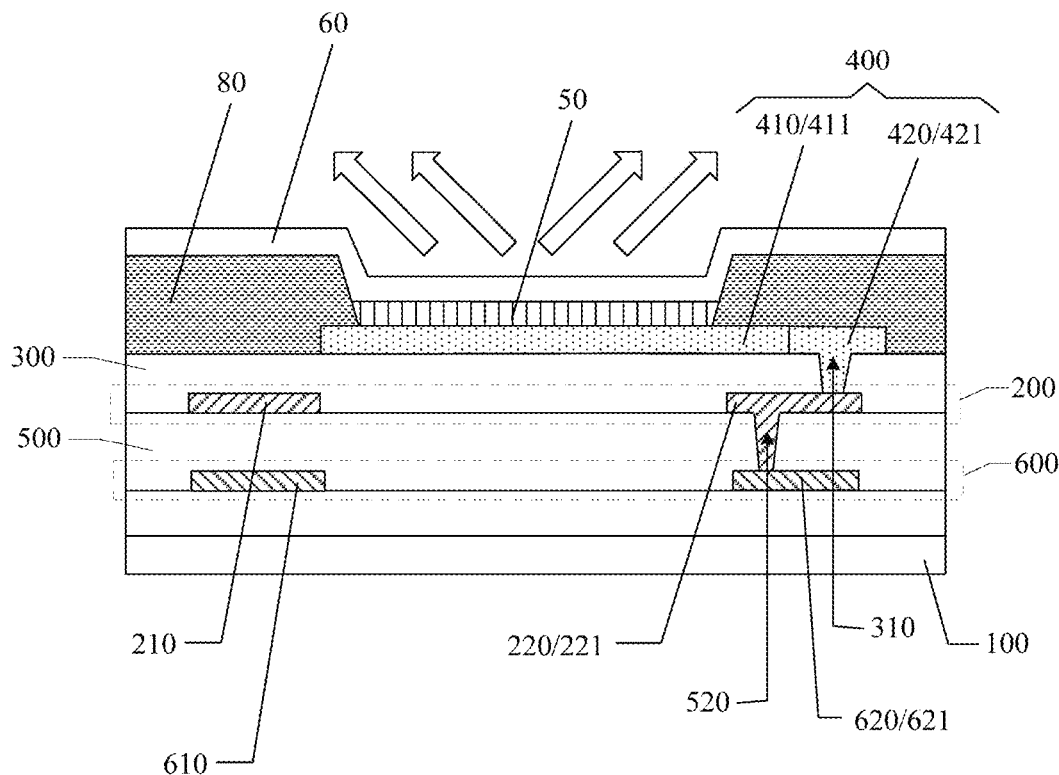
FIG. 7A is a schematic cross-sectional structural view of the display panel shown in FIG. 3A along a CC' direction.
Figure 7B:
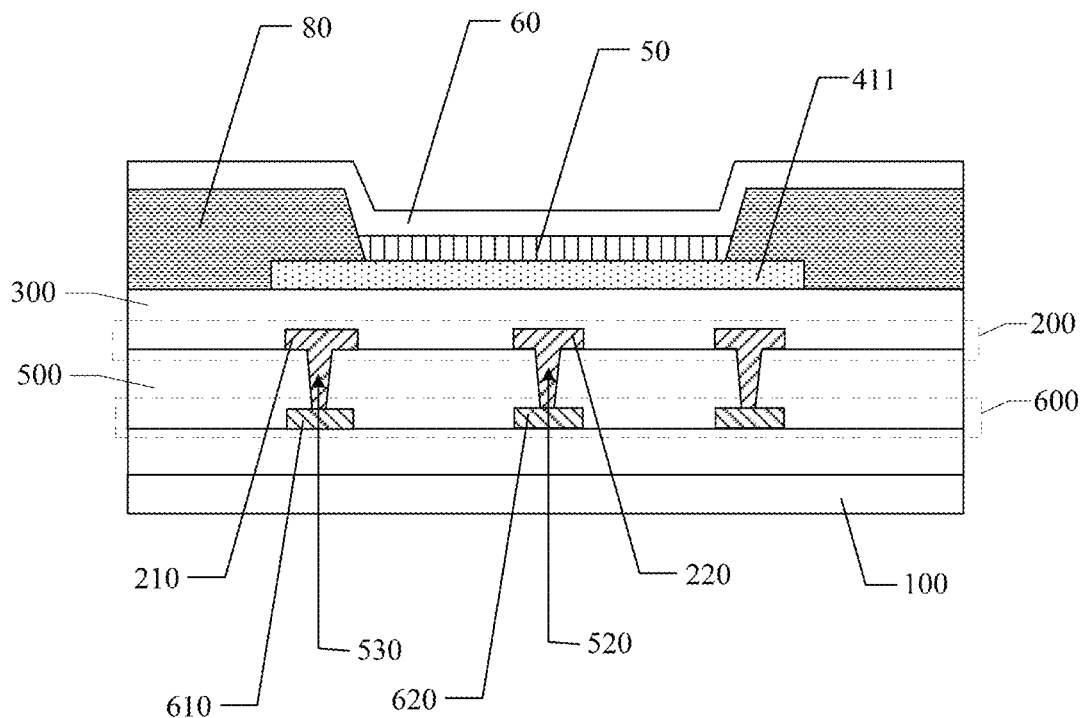
FIG. 7B is a schematic cross-sectional structural view of the display panel shown in FIG. 3A along a DD' direction.

In a specific implementation, in the embodiments of the present disclosure, as shown in FIG. 3A to FIG. 3C. FIG. 6C, and FIG. 7A, in each first color sub-pixel 010, the main portion 411 and the auxiliary portion 421 are electrically connected to each other, the auxiliary portion 421 is electrically connected to the first connection line 221 through the first hole 310, the first connection line 221 is electrically connected to a second connection line 621 through the second hole 520, the second connection line 621 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

In a specific implementation, in the embodiments of the present disclosure, as shown in FIG. 3A to FIG. 4, FIG. 6C, and FIG. 7A, in each first color sub-pixel 010, the orthographic projection of the main portion 411 on the substrate 100 does not overlap the orthographic projection of the first hole 310 on the substrate 100. In this way, the main portion 411 of each first color sub-pixel 010 can be prevented from being affected by the first bole 310, thereby avoiding the occurrence of unevenness of the main portion 411 due to the first hole 310, thereby alleviating color shift phenomenon of the display panel.

In a specific implementation, in the embodiments of the present disclosure, as shown in FIG. 3A to FIG. 4 and FIG. 6C to FIG. 7A, in each first color sub-pixel 010, the orthographic projection of the main portion 411 on the substrate 100 at least partially overlaps the orthographic projection of the second hole 520 on the substrate 100. Illustratively, the orthographic projection of the main portion 411 on the substrate 100 covers the orthographic projection of the second hole 520 on the substrate 100. Because the second hole 520 is located in the second insulation layer 500, the first insulation layer 300 and the first conductive layer 200 are disposed between the second insulation layer 500 and the main portion 411, so that the influence of the second hole 520 on the main portion 411 is small and even may be negligible.

In a specific implementation, in the embodiments of the present disclosure, as shown in FIG. 3B, in the first color sub-pixel 010, the first hole 310 is disposed father from a driving transistor in the pixel driving circuit than the second hole 520. Of course, the present disclosure comprises but is not limited thereto.

In a specific implementation, in the embodiments of the present disclosure, as shown in FIG. 3B and FIG. 6C, in the first color sub-pixel 010, the orthographic projection of the fourth hole 710 on the substrate 100 overlaps the orthographic projection of the first hole 310 on the substrate 100. Of course, the present disclosure comprises but is not limited thereto.

In a specific implementation, in the embodiments of the present disclosure, as shown in FIG. 3B and FIG. 6C, in the first color sub-pixel 010, an orthographic projection of the first hole 310 on the substrate 100 does not overlap an orthographic projection of a light emitting control signal line (that is, the first light emitting control signal line EM1*a* or the second light emitting control signal line EM2*a* of the current row) electrically connected to the pixel driving circuit on the substrate 100, an orthographic projection of the second hole 520 on the substrate 100 overlaps the orthographic projection of the light emitting control signal line (that is, the first light emitting control signal line EM1*a* or the second light emitting control signal line EM2*a* of the current row) electrically connected to the pixel driving circuit on the substrate 100, and an orthographic projection of the fourth hole 710 on the substrate 100 does not overlap the orthographic projection of the light emitting control signal line (that is, the first light emitting control signal line EM1*a*, or the second light emitting control signal line EM2*a* of the current row) electrically connected to the pixel driving circuit on the substrate 100. Of course, the present disclosure comprises but is not limited thereto.

In a specific implementation, in the embodiments of the present disclosure, as shown in FIG. 3A to FIG. 4, FIG. 6C, and FIG. 7B, in the first color sub-pixel 010, the orthographic projection of the main portion 411 on the substrate 100 at least partially overlaps orthographic projections of two third holes 530 on the substrate 100. Illustratively, in the first color sub-pixel 010, the orthographic projection of the main portion 411 on the substrate 100 partially overlaps the orthographic projections of the two third holes 530 on the substrate 100.

In a specific implementation, in the embodiments of the present disclosure, as shown in FIG. 3A to FIG. 4, in the first color sub-pixel 010, the first hole 310 is disposed close to a side of a center line LZ2 of the two third holes 530 overlapping the orthographic projection of the main portion 411 on the substrate 100, and the second hole 520 is disposed close to the other side of the center line LZ2 of the two third holes 530 that overlap the orthographic projection of the main portion 411 on the substrate 100. In this way, the first hole 310 and the second hole 520 in the first color sub-pixel 010 can be disposed closer to each other. It should be noted that the center line LZ2 is parallel to the first direction F1. Also, the center line LZ2 is a line passing through centers of the two third holes 530, and is virtual and not a real line.

In a specific implementation, in the embodiments of the present disclosure, as shown in FIG. 3A to FIG. 4, in the first color sub-pixel 010, the main portion 411 may be an axisymmetric pattern, and the first hole 310 may be located on a symmetry axis of the main portion 411 along the second direction F2. Illustratively, the main portion 411 in the first color sub-pixel 010 may have a second symmetry axis along the second direction F2. Illustratively, the shape of the main portion 411 in the first color sub-pixel 010 is substantially a hexagon or an ellipse, a long symmetry axis of the hexagon or a long axis of the ellipse is substantially parallel to the first direction F1, a short symmetry axis of the hexagon or a short axis of the ellipse is substantially parallel to the second direction F2, and the short symmetry axis of the hexagon or the short axis of the ellipse may be used as the second symmetry axis. Illustratively, the first hole 310 in the first color sub-pixel 010 may be disposed substantially symmetrically about the second symmetry axis, or the first hole 310 in the first color sub-pixel 010 may only intersect the second symmetry axis but is not disposed substantially symmetrically about the second symmetry axis. Certainly, in an actual application, an implementation manner of the first hole 310 in the first color sub-pixel 010 may be designed and determined according to an actual application environment, and is not limited herein.

In a specific implementation, in the embodiments of the present disclosure, as shown in FIG. 3A to FIG. 4, in the first color sub-pixel 010, the second hole 520 may be located on the symmetry axis of the main portion 411 in the second direction F2. Illustratively, the second hole 520 in the first color sub-pixel 010 may be disposed substantially symmetrically with respect to the first symmetry axis, or the second hole 520 in the first color sub-pixel 010 may only intersect the second symmetry axis but is not disposed substantially symmetrically about the second symmetry axis. Certainly, in an actual application, an implementation manner of the second hole 520 in the first color sub-pixel 010 may be designed and determined according to an actual application environment, and is not limited herein.

In a specific implementation, in the embodiments of the present disclosure, as shown in FIG. 3A to FIG. 4, FIG. 5A, and FIG. 8C, in each second color sub-pixel of number one 021, the main portion 4121 and the auxiliary portion 4221 are electrically connected to each other, the auxiliary portion 4221 is electrically connected to the first connection line 2221 through the first hole 310, the first connection line 2221 is electrically connected to a second connection line 6221 through the second hole 520, the second connection line 6221 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

In a specific implementation, in the embodiments of the present disclosure, as shown in FIG. 3A to FIG. 4, FIG. 8B, and FIG. 5C, in each second color sub-pixel of number two 022, the main portion 4122 and the auxiliary portion 4222 are electrically connected to each other, the auxiliary portion 4222 is electrically connected to the first connection line 2222 through the first hole 310, the first connection line 222.2 is electrically connected to a second connection line 62.22 through the second hole 520, the second connection line 6.222 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

Figure 8A:
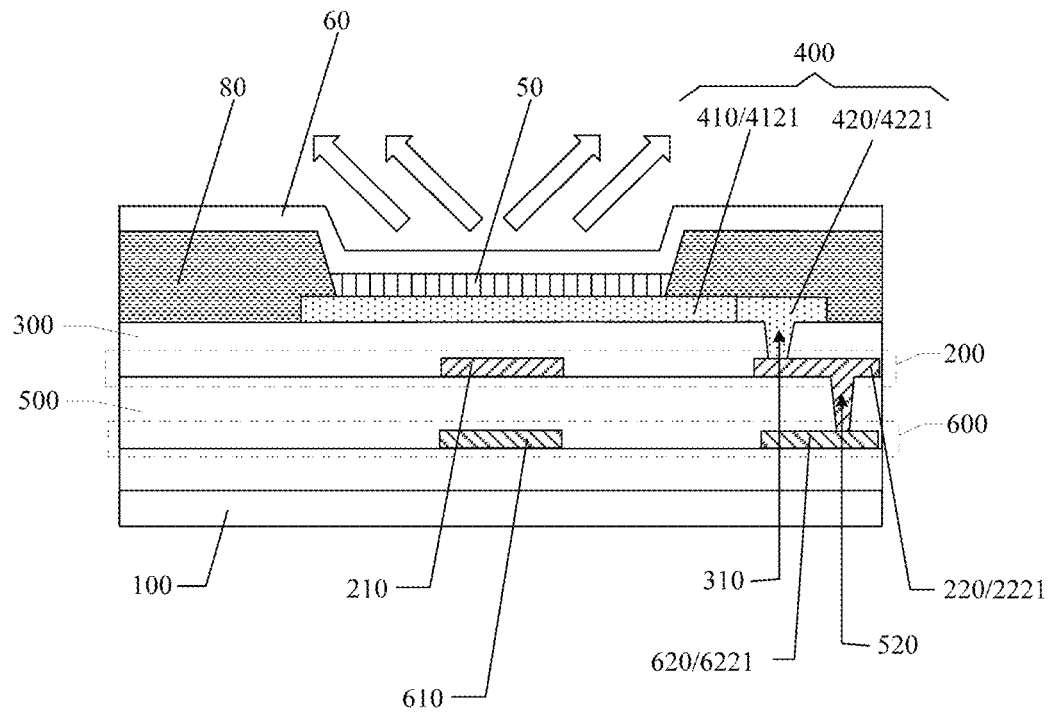
FIG. 8A is a schematic cross-sectional structural view of the display panel shown in FIG. 3A along a EE' direction.
Figure 8B:
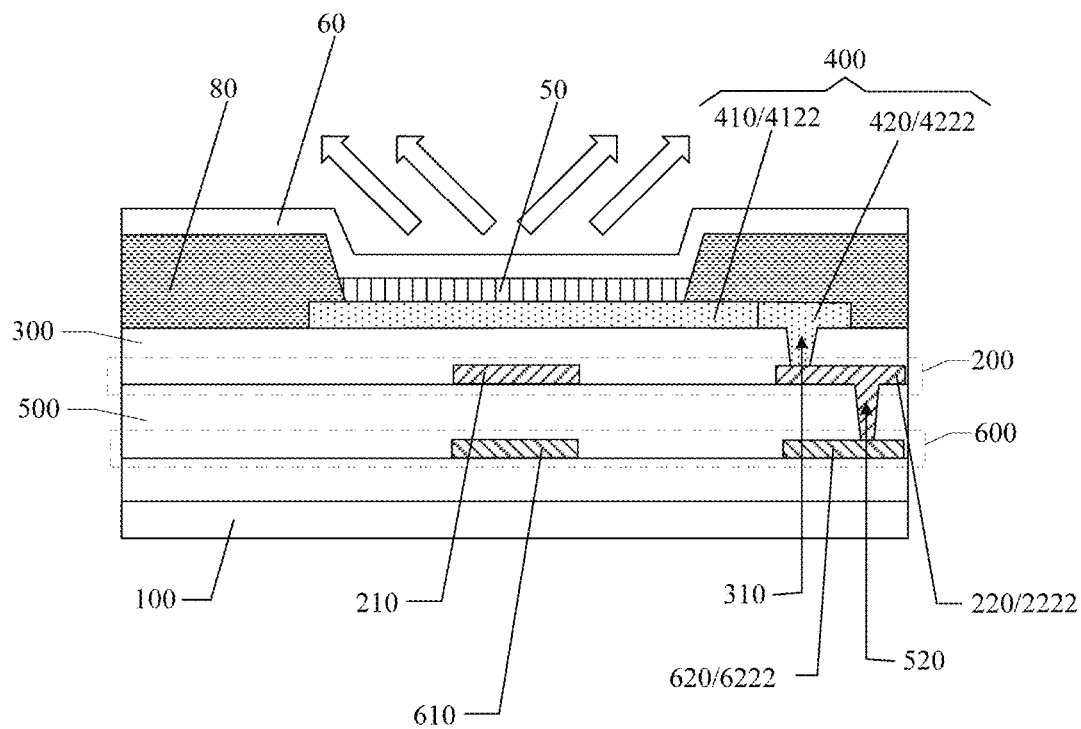
FIG. 8B is a schematic cross-sectional structural view of the display panel shown in FIG. 3A along a FF' direction.
Figure 8C:
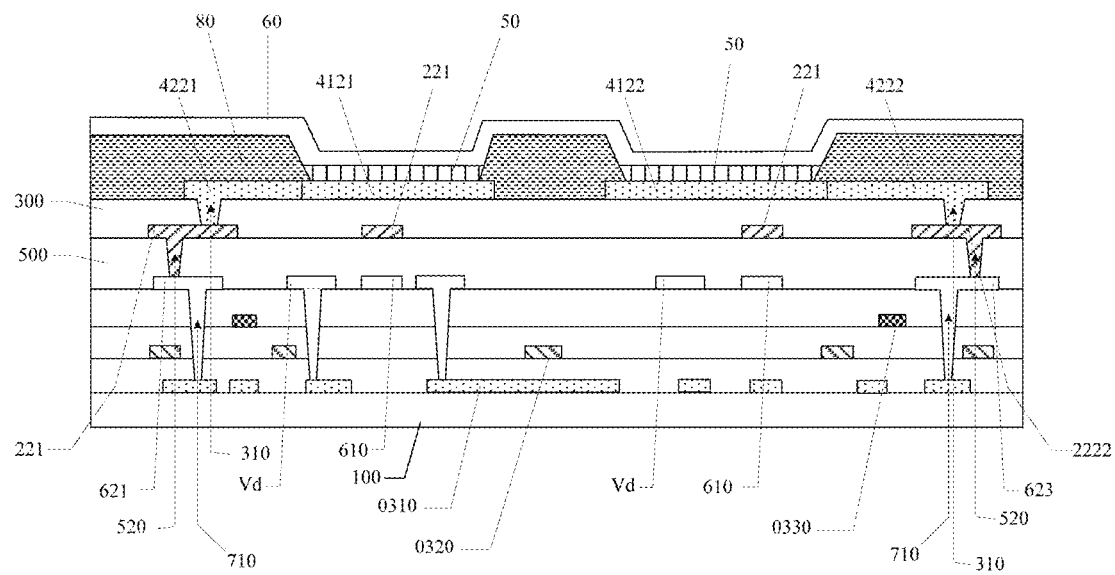
FIG. 8C is a schematic cross-sectional structural view of the display panel shown in FIG. 3B along a BB' direction.

Optionally, as shown in FIG. 3A to FIG. 4 and FIG. 5A to FIG. 8C, in each second color sub-pixel, the orthographic projection of the main portion on the substrate does not overlap the orthographic projection of the first hale on the substrate. Illustratively, as shown in FIG. 3A to FIG. 4. FIG. 8A, and FIG. 8C, in the second color sub-pixel of number one 021, the orthographic projection of the main portion 4121 on the substrate 100 does not overlap the orthographic projection of the first hole 310 on the substrate 100. In this way the main portion 4121 of each second color sub-pixel of number one 021 can be prevented from being affected by the first hole 310, thereby avoiding the occurrence of unevenness of the main portion 4121 due to the first hole 310, thereby alleviating color shift phenomenon of the display panel.

Illustratively, as shown in FIG. 3A to FIG. 4. FIG. 8A, and FIG. 8C, in each second color sub-pixel of number two 021, the orthographic projection of the main portion 4122 on the substrate 100 does not overlap the orthographic projection of the first hole 310 on the substrate 100. In this way, the main portion 4122 of each second color sub-pixel of number two 022 can be prevented from being affected by the first hole 310, thereby avoiding the occurrence of unevenness of the main portion 4122 due to the first hole 310, thereby alleviating color shift phenomenon of the display panel.

In a specific implementation, in the embodiments of the present disclosure, as shown in FIG. 3A to FIG. 4, the second color sub-pixel pair 020 comprises a second color sub-pixel of number one 021 and a second color sub-pixel of number two 022; in the same repeat unit 001, the first hole 310 of the second color sub-pixel of number one 021 is located on a side of the second color sub-pixel of number one 021 away from the third color sub-pixel 030. Moreover, in the same repeat unit 001, the first hole 310 of the second color sub-pixel of number two 022 is located on a side of the second color sub-pixel of number two 022 away from the third color sub-pixel 030.

In a specific implementation, in the embodiments of the present disclosure, as shown in FIG. 3A to FIG. 4, for the first color sub-pixel 010 and the second color sub-pixel of number one 021 in the same repeat unit 001, and for a third color sub-pixel 030 that is closest to both the first color sub-pixel 010 and the second color sub-pixel of number one 021 in the same repeat unit 001, the first hole 310 of the second color sub-pixel of number one 021 is located in a gap between the first color sub-pixel 010 and the third color sub-pixel 030. Moreover, for the first color sub-pixel 010 and the second color sub-pixel of number two 022 in the situate repeat unit 001, and for a third color sub-pixel 030 that is closest to both the first color sub-pixel 010 and the second color sub-pixel of number two 022 in the same repeat unit 001, the first hole 310 of the second color sub-pixel of number two 022 is located in a gap between the first color sub-pixel 010 and the third color sub-pixel 030.

In a specific in implementation, in the embodiments of the present disclosure, as shown in FIG. 3A to FIG. 4, for the first color sub-pixel 010 and the second color sub-pixel of number one 021 in the same repeat unit 001, and for a third color sub-pixel 030 that is closest to both the first color sub-pixel 010 and the second color sub-pixel of number one 021 in the same repeat unit 001, the second hole 520 of the second color sub-pixel of number one 021 is located in a gap between the first color sub-pixel 010 and the third color sub-pixel 030. Moreover, for the first color sub-pixel 010 and the second color sub-pixel of number two 022 in the same repeat unit 001, and for a third color sub-pixel 030 that is closest to both the first color sub-pixel 010 and the second color sub-pixel of number two 022 in the same repeat unit 001, the second hole 520 of the second color sub-pixel of number two 022 is located in a gap between the first color sub-pixel 010 and the third color sub-pixel 030.

In a specific implementation, in the embodiments of the present disclosure, as shown in FIG. 3A to FIG. 4, first holes 310 in the same color sub-pixels are located on the same sides of the same color sub-pixels, respectively. Illustratively, the first holes 310 of the first color sub-pixels 010 are respectively located on the same sides of the first color sub-pixels 010 where the first holes 310 are located. The first holes 310 of the second color sub-pixels 021, 022 are respectively located on the same sides of the second color sub-pixels 021, 022 where the first holes 310 are located. The first holes 310 of the third color sub-pixels 030 are respectively located on the same sides of the third color sub-pixels 030 where the first holes 310 are located.

In a specific implementation, in the embodiments of the present disclosure, as shown in FIG. 3A to FIG. 4, in the same repeat unit 001, the first hole 310 and the second hole 520 of the second color sub-pixel of number one 021 are disposed close to one side of the first color sub-pixel 010, and the first hole 310 and the second hole 520 of the second color sub-pixel of number two 022 are disposed close to the other side of the first color sub-pixel 010. That is, the first hole 310 of the second color sub-pixel of number one 021 and the first hole 310 of the second color sub-pixel of number two 022 are respectively located on both sides of the first color sub-pixel 010. The second hole 520 of the second color sub-pixel of number one 021 and the second hole 520 of the second color sub-pixel of number two 022 are respectively located on both sides of the first color sub-pixel 010. Exemplarily, in the same repeat unit 001, the first hole 310 and the second hole 520 of the second color sub-pixel of number one 021 may be disposed between the main portion 411 in the first color sub-pixel 010 in the repeat unit 001 and the main portion 413 in the third color sub-pixel 030 adjacent to the left side of the main portion 411. Moreover, in the same repeat unit 001, the first hole 310 and the second hole 520 of the second color sub-pixel of number two 022 may be disposed between the main portion 411 in the first color sub-pixel 010 in the repeat unit 001 and the main portion 413 in the third color sub-pixel 030 adjacent to the right side of the main portion 411.

Optionally, in a specific implementation, in the embodiments of the present disclosure, as shown in FIG. 3A to FIG. 4, in the second color sub-pixel of number one 021, the second hole 520 can be located on a side of the first hole 310 away from the main portion 4121. Of course, the embodiments of the present disclosure comprise but are not limited thereto.

Optionally, in a specific implementation, in the embodiments of the present disclosure, as shown in FIG. 3A to FIG. 4, in the second color sub-pixel of number one 021, the first hole 310 and the second hole 520 may be arranged on the same straight line in the second direction F2. Of course, the embodiments of the present disclosure implementation but are not limited thereto.

Optionally, in a specific implementation, in the embodiments of the present disclosure, as shown in FIG. 3B, in the second color sub-pixel of number one 021, the first hole 310 is disposed away from the driving transistor in the pixel driving circuit with respect to the second hole 520. Of course, the embodiments of the present disclosure implementation but are not limited thereto.

Optionally, in a specific implementation, in the embodiments of the present disclosure, as shown in FIG. 3B and FIG. 8C, in the second color sub-pixel of number one 021, the orthographic projection of the fourth hole 710 on the substrate 100 overlaps the orthographic projection of the first hole 310 on the substrate 100. Of course, the embodiments of the present disclosure implementation but are not limited thereto.

Optionally, in a specific implementation, in the embodiments of the present disclosure, as shown in FIG. 3B and FIG. 8C, in the second color sub-pixel of number one 021, the orthographic projection of the first hole 310 on the substrate 100 does not overlap the orthographic projection of a light emitting control signal line (that is, the first light emitting control signal line EM1*a* or the second light emitting control signal line EM2*a* of the current row) electrically connected to the pixel driving circuit on the substrate 100, the orthographic projection of the second hole 510 on the substrate 100 overlaps the orthographic projection of the light emitting control signal line (that is, the first light emitting control signal line EM1*a* or the second light emitting control signal line EM2*a* of the current row) electrically connected to the pixel driving circuit on the substrate 100, and the orthographic projection of the fourth hole 710 on the substrate 100 does not overlap the orthographic projection of the light emitting control signal line (that is, the first light emitting control signal line EM1*a* or the second light emitting control signal line EM2*a* of the current row) electrically connected to the pixel driving circuit on the substrate 100. Of course, the embodiments of the present disclosure implementation but are not limited thereto.

Optionally, in a specific implementation, in the embodiments of the present disclosure, as shown in FIG. 3A to FIG. 4, FIG. 8B, and FIG. 8C, in the second color sub-pixel of number two 022, the second hole 520 may be located on the side of the first hole 310 away from the main portion 4122. Of course, the embodiments of the present disclosure implementation but are not limited thereto.

Optionally, in a specific implementation, in the embodiments of the present disclosure, as shown in FIG. 3A to FIG. 4, FIG. 8B, and FIG. 8C, in the second color sub-pixel of number two 022, the first hole 310 and the second hole 520 may be arranged on the same straight line in the second direction F2. Of course, the embodiments of the present disclosure implementation but are not limited thereto.

Optionally, in a specific implementation, in the embodiments of the present disclosure, as shown in FIG. 3B, in the second color sub-pixel of number two 022, the first hole 310 is disposed away from the driving transistor in the pixel driving circuit with respect to the second hole 520. Of course, the embodiments of the present disclosure implementation but are not limited thereto.

Optionally, in a specific implementation, in the embodiments of the present disclosure, as shown in FIG. 3B and FIG. 8C, in the second color sub-pixel of number two 022, the orthographic projection of the fourth hole 710 on the substrate 100 overlaps the orthographic projection of the first hole 310 on the substrate 100. Of course, the embodiments of the present disclosure implementation b it are not limited thereto.

Optionally, in a specific implementation, in the embodiments of the present disclosure, as shown in FIG. 3B and FIG. 8C, in the second color sub-pixel of number two 022, the orthographic projection of the first hole 310 on the substrate 100 does not overlap the orthographic projection of a light emitting control signal line (that is, the first light emitting control signal line EM1*a* or the second light emitting control signal line. EM2*a* of the current row) electrically connected to the pixel driving circuit on the substrate 100, the orthographic projection of the second hole 520 on the substrate 100 overlaps the orthographic projection of the light emitting control signal line (that is, the first light emitting control signal line EM1*a* or the second light emitting control signal line EM2*a* of the current row) electrically connected to the pixel driving circuit on the substrate 100, and the orthographic projection of the fourth hole 710 on the substrate 100 does not overlap the orthographic projection of the light emitting control signal line (that is, the first light emitting control signal line EM1*a* or the second light emitting control signal line EM2*a* of the current row) electrically connected to the pixel driving circuit on the substrate 100. Of course, the embodiments of the present disclosure implementation but are not limited thereto.

Optionally, in a specific implementation, in the embodiments of the present disclosure, as shown in FIG. 3A to FIG. 4, in the same repeat unit 001, the first hole 310 of the second color sub-pixel of number one 021 of the second color sub-pixel pair 020, the first hole 310 of the first color sub-pixel 010, and the first hole 310 of the second color sub-pixel of number two 022 of the second color sub-pixel pair 020 are sequentially arranged on the same first sub-fold line Z1 along the first direction F1. Illustratively, in a repeat unit 001 of the repeat unit group in a second column, for the first hole 310 of the second color sub-pixel of number one 021 of the second color sub-pixel pair 020, the first hole 310 of the first color sub-pixel 010, and the first hole 310 of the second color sub-pixel of number two 022 of the second color sub-pixel pair 020, the three first holes 310 may be sequentially arranged on the first sub-fold line Z1 in a direction indicated by an arrow in the first direction F1, so that the design difficulty of the mask used when manufacturing the three first holes 310 can be reduced.

Optionally, in a specific implementation, in the embodiments of the present disclosure, as shown in FIG. 3A to FIG. 4, for a first color sub-pixel 010 in one repeat unit group and a third color sub-pixel 030 that is in an adjacent repeat unit group and is closest to the first color sub-pixel 010 in the one repeat unit group, the first hole 310 of the first color sub-pixel 010 and the first hole 310 of the third color sub-pixel 030 are arranged on the same second sub-fold line Z2 along a third direction; and the third direction intersects the first direction and is not perpendicular to the first direction.

Optionally, in a specific implementation, in the embodiments of the present disclosure, as shown in FIG. 3A to FIG. 4, a fold line comprises the first sub-fold line Z1 and the second sub-fold line Z2. In two adjacent repeat units 001 in different columns, the first hole 310 of the third color sub-pixel 030 in a first repeat unit of the two repeat units, the first hole 310 of the second color sub-pixel of number one 021 in a second repeat unit of the two repeat units, the first hole 310 of the first color sub-pixel 010 in the second repeat unit of the two repeat units, and the first hole 310 of the second color sub-pixel of number two 022 in the second repeat unit of the two repeat units are sequentially arranged on the fold line. That is, in the two adjacent repeat units 001 in different columns, the first hole 310 of the third color sub-pixel 030 in a first repeat unit of the two repeat units, the first hole 310 of the second color sub-pixel of number one 021 in a second repeat unit of the two repeat units, the first hole 310 of the first color sub-pixel 010 in the second repeat unit of the two repeat units, and the first hole 310 of the second color sub-pixel of number two 022 in the second repeat unit of the two repeat units are repeatedly arranged. In this way, the design difficulty of the mask used when manufacturing these first holes 310 can also be reduced.

Optionally, in a specific implementation, in the embodiments of the present disclosure, as shown in FIG. 3A to FIG. 4, the first hole 310 of the third color sub-pixel 030 and the first hole 310 of the first color sub-pixel 010 in the same repeat unit 001 are arranged on the same straight line in the second direction F2. In this way, the design difficulty of the mask used when manufacturing these first holes 310 can also be reduced.

Optionally, in a specific implementation, in the embodiments of the present disclosure, as shown in FIG. 3A to FIG. 4, in two repeat units 001 which are located in different columns and adjacent, the first hole 310 of the second color sub-pixel of number one 021 of one repeat unit 001 of the two repeat units 001 and the first hole 310 of the second color sub-pixel of number two 022 of the other repeat unit 001 of the two repeat units 001 are arranged on the same straight line in the second direction F2. In this way, the design difficulty of the mask used when manufacturing these first holes 310 can also be reduced.

In a specific implementation, in the embodiments of the present disclosure, as shown in FIG. 3A to FIG. 4, the second hole 520 of the third color sub-pixel 030 in the odd-numbered column repeat unit group, the first hole 310 of the first color sub-pixel 010 in the even-numbered column repeat unit group, the first hole 310 of the second color sub-pixel of number one 021 in the even-numbered column repeat unit group, the first hole 310 of the second color sub-pixel of number two 022 in the even-numbered column repeat unit group are arranged on the same straight line in the first direction F1. Illustratively, the second hole 520 of the third color sub-pixel 030 in the first column repeat unit group, the second hole 520 of the third color sub-pixel 030 in the third column repeat unit group, the first, hole 310 of the first color sub-pixel 010 in the second column repeat unit group, the first hole 310 of the second color sub-pixel of number one 021 in the second column repeat unit group, and the first hole 310 of the second color sub-pixel of number two 022 in the second column repeat unit group are arranged on the same straight line in the first direction F1.

In a specific implementation, in the embodiments of the present disclosure, as shown in FIG. 3A to FIG. 4, in the odd-numbered repeat unit groups, in the repeat units 001 of the same row, the first holes 310 of the first color sub-pixels 010, and the first holes 310 of the second color sub-pixels of number one 021 in the second color sub-pixel pairs 020, the first holes 310 of the second color sub-pixels of number two 022 in the second color sub-pixel pairs 020 are arranged on the same straight line in the first direction F1. In this way, the design difficulty of the mask used when manufacturing these first holes 310 can also be reduced.

In a specific implementation, in the embodiments of the present disclosure, as shown in FIG. 3A to FIG. 4, in the odd-numbered repeat unit groups, in the repeat units 001 of the same raw, the first holes 310 of the third color sub-pixels 030 are arranged on the same straight line in the first direction F1. In this way, the design difficulty of the mask used when manufacturing these first holes 310 can also be reduced.

In a specific implementation, in the embodiments of the present disclosure, as shown in FIG. 3A to FIG. 4, in the even-numbered repeat unit groups, in the repeat units 001 of the same row, the first holes 310 of the first color sub-pixels 010, the first holes 310 of the second color sub-pixels of number one 021 in the second color sub-pixel pairs 020, and the first holes 310 of the second color sub-pixels of number two 022 in the second color sub-pixel pairs 020 are arranged on the same straight line in the first direction F1. In this way, the design difficulty of the mask used when manufacturing these first holes 310 can also be reduced.

In a specific implementation, in the embodiments of the present disclosure, as shown in FIG. 3A to FIG. 4, in the even-numbered repeat unit groups, in the repeat units 001 of the same row, the first holes 310 of the third color sub-pixels 030 are arranged on the same straight line in the first direction F1. In this way, the design difficulty of the mask used when manufacturing these first holes 310 can also be reduced.

In a specific implementation, in the embodiments of the present disclosure, as shown in FIG. 3A to FIG. 4, a spacing between any adjacent two first holes 310 in the first direction F1 may be substantially constant. Of course, the embodiments of the present disclosure comprise but are not limited, thereto.

In a specific implementation, in the embodiments of the present disclosure, as shown in FIG. 3A to FIG. 4, a spacing between any adjacent two first holes 310 in the second direction F2 may be substantially constant. Of course, the embodiments of the present disclosure comprise bat are not limited thereto.

In a specific implementation, in the embodiments of the present disclosure, as shown in FIG. 3A to FIG. 4, a spacing between any adjacent two second holes 520 in the first direction F1 may be substantially constant. Of course, the embodiments of the present disclosure comprise but are not limited thereto.

In a specific implementation, in the embodiments of the present disclosure, as shown in FIG. 3A to FIG. 4, a spacing between any adjacent two second holes 520 in the second direction F2 may be substantially constant. Of course, the embodiments of the present disclosure comprise but are not limited thereto.

Based on the same inventive concept, the embodiments of the present disclosure further provide other electroluminescent display panel, as shown in FIG. 9A to FIG. 15, some implementations of the above embodiments have been modified. Only the differences between the present embodiment and the above embodiment will be described below, and the similar portions are not described again herein.

In a specific implementation, in the embodiments of the present disclosure, as shown in FIG. 9A to FIG. 15, an electroluminescent display panel can comprise a plurality of repeat units 001, and each repeat unit 001 comprises a plurality of sub-pixels, each sub-pixel may comprise a first conductive layer 200 located on the substrate 100, a first insulation layer 300 located on the first conductive layer 200, and an anode 400 located on the first insulation layer 300. The first insulation layer 300 comprises a first hole 310, and the a first hole 310 exposes a portion of the first conductive layer 200. The anode 400 comprises a main portion 410 and an auxiliary portion 420 that are electrically connected to each other, and the auxiliary portion 420 is electrically connected to the first conductive layer 200 through the first hole 310. In at least one of the plurality of sub-pixels, the orthographic projection of the main portion 410 on the substrate 100 does not overlap the orthographic projection of the first hole 310 on the substrate 100. Moreover, in at least one of the plurality of sub-pixels, a size of the main portion 410 in the first direction F1 is larger than a size of the main portion 410 in the second direction F2, and in at least one of the plurality of sub-pixels, the first hole 310 and the main portion 410 are arranged in the second direction F2; and the first direction F1 is different from the second direction F2.

In the electroluminescent display panel provided by the embodiments of the present disclosure, the anode comprises the main portion and the auxiliary portion that are electrically connected to each other, the auxiliary portion is electrically connected to the first conductive layer through the first hole, so as to electrically connect the anode to the pixel driving circuit through the first conductive layer. And, because in at least one sub-pixel, the orthographic projection of the main portion on the substrate does not overlap the orthographic projection of the first hole on the substrate, and thus, the first hole in the sub-pixel can be kept away from the main portion such that the main portion of the anode in the sub-pixel is not affected by the depth of the first hole, thereby avoiding the main portion of the anode from having recesses, avoiding the occurrence of the unevenness of the anode caused by the first hole, and thereby alleviating the color shift phenomenon of the display panel.

In a specific implementation) in the embodiments of the present disclosure, as shown in FIG. 9A FIG. 9B, FIG. 11, and FIG. 12, the first conductive layer 200 may comprise: a first power line 210, a first connection line 220, and a data line 230 that are spaced apart from each other. In each sub-pixel, the auxiliary portion 420 is electrically connected to the first connection line 220 through the first hole 310. The first connection line 220 is electrically connected to a drain electrode of a transistor in the pixel driving circuit to achieve signal transmission. It should be noted that the above description is illustrated only by taking the third color sub-pixel 030 as an example, and the settings in the remaining sub-pixels are deduced by analogy and are not described herein.

Further, in a specific implementation, in the embodiments of the present disclosure, as shown in FIG. 9A, FIG. 9B, FIG. 11, and FIG. 12, the first conductive layer 200 may further comprise a bridge line 240 disposed at intervals from the first power line 210, the first connection line 220, and the data line 230, respectively. The bridge line 240 is configured to electrically connect two selected from the group consisting of a gate electrode, a source electrode, and a drain electrode of each transistor in portion transistors in the pixel driving circuit. And the setting manner of the bridge line can be substantially the same as the setting manner in the related art, and details are not described herein.

Illustratively, the first conductive layer 200 may be, for example, the source-drain metal layer 0340 described above. The first power line 210 can be, for example, the first power signal line VDD1 described above, the data line 230 may be, for example, the data line Vd described above, and the first connection line 220 may be, for example, the connection portion 343a described above, and the bridge line 240 may be, for example, at least one selected from the group consisting of the connection portion 341a and the connection portion 342a described above. That is, compared with the above embodiment, the auxiliary metal layer 0350 is not disposed in this embodiment, and for the corresponding relationship between the holes and the insulation layers as well as the remaining layers, reference may be made to the implementations of the active semiconductor layer 0310, the gate conductive layer 0320, and the reference conductive layer 0330 described above, and similar portions are not described herein.

Figure 12:
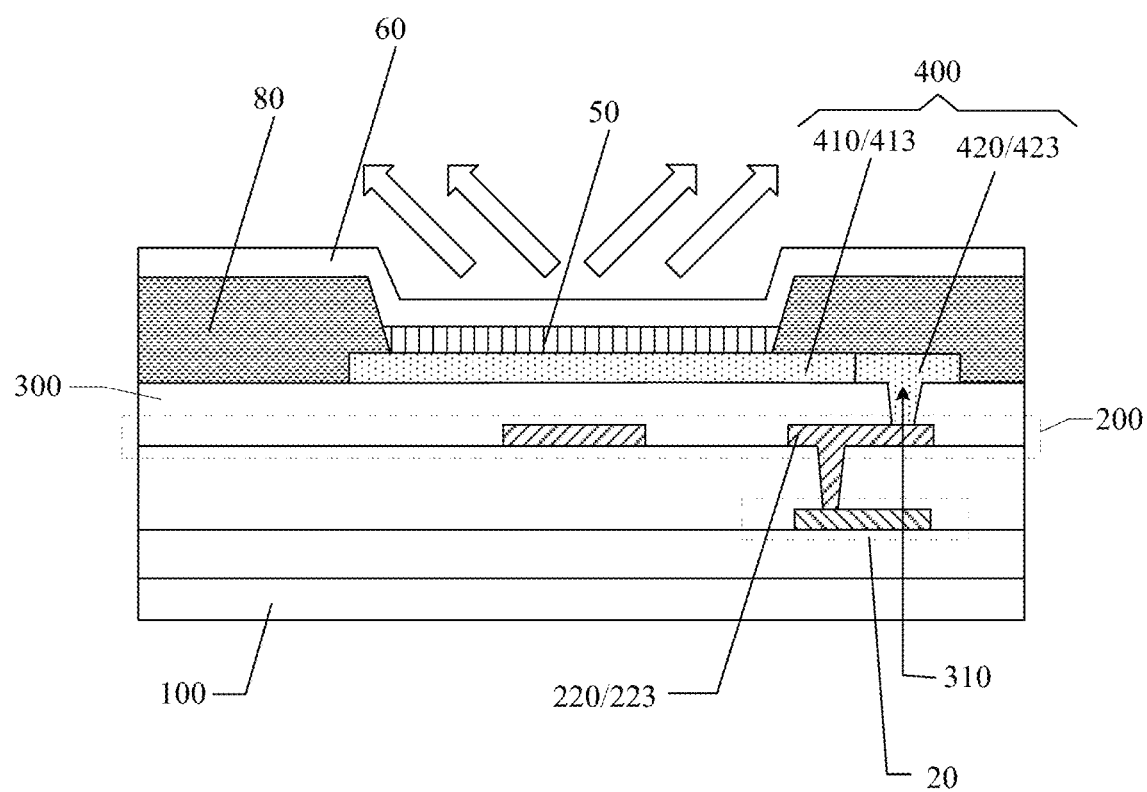
FIG. 12 is a schematic cross-sectional structural view of the display panel shown in FIG. 9A along an AA' direction.
Figure 13:
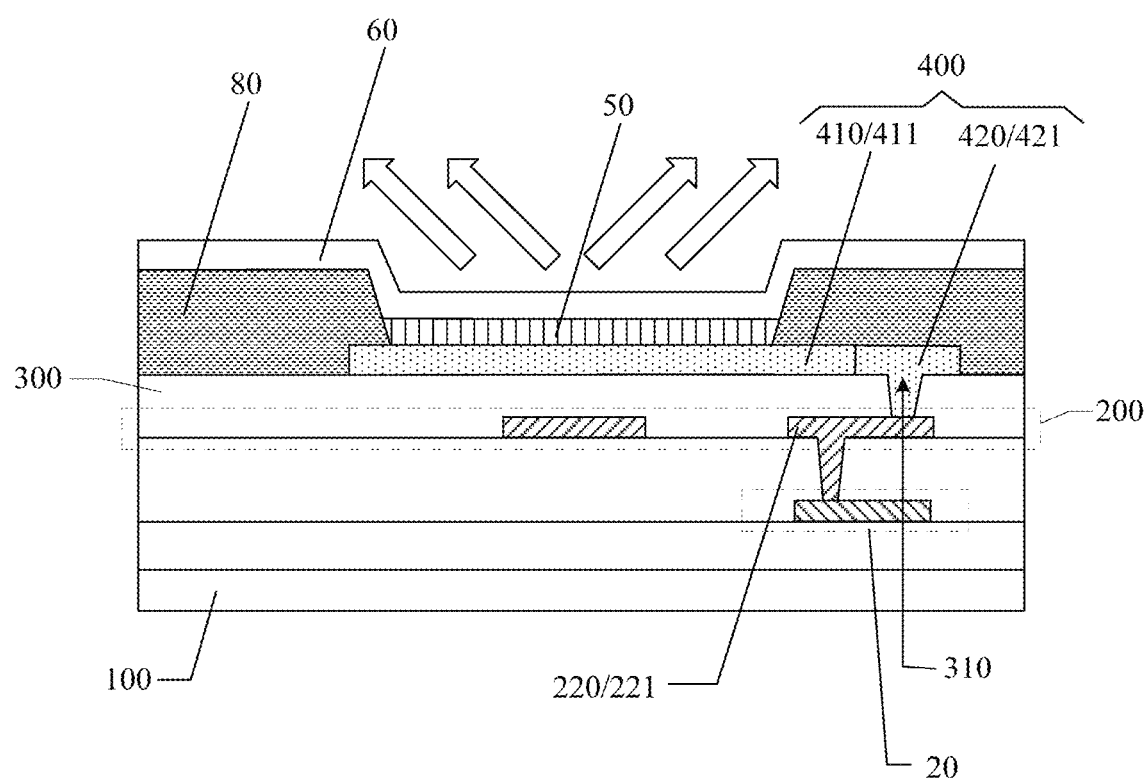
FIG. 13 is a schematic cross-sectional structural view of the display panel shown in FIG. 9A along a BB' direction.
Figure 14:
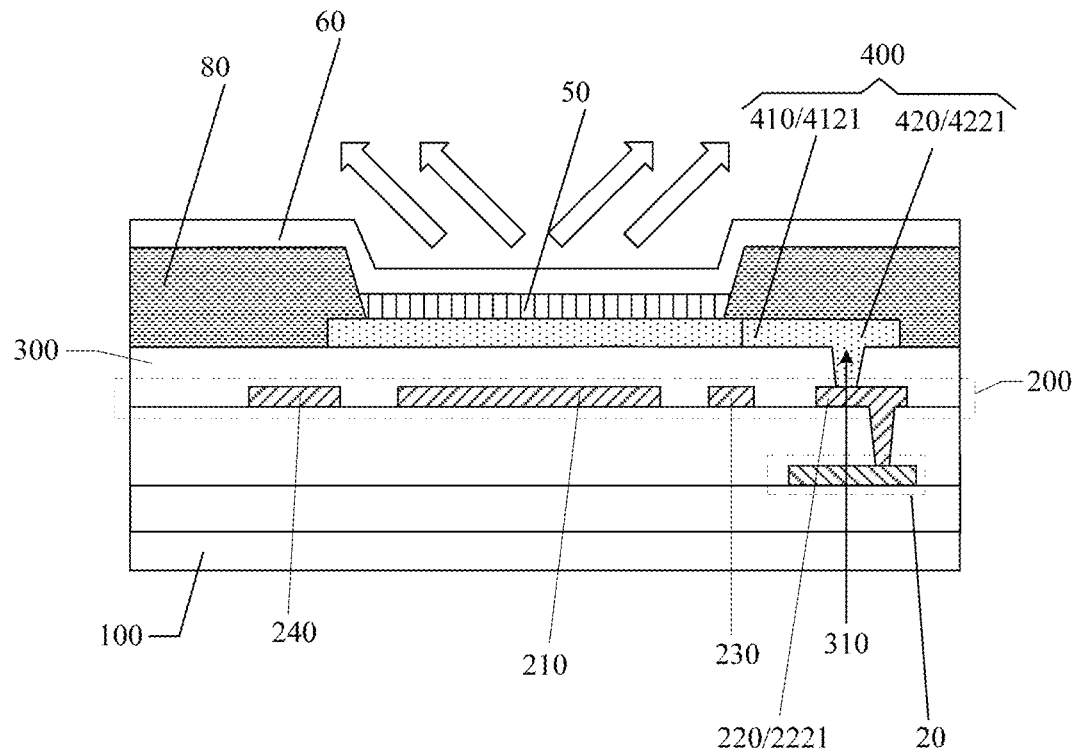
FIG. 14 is a schematic cross-sectional structural view of the display panel shown in FIG. 9A along a CC' direction.
Figure 15:
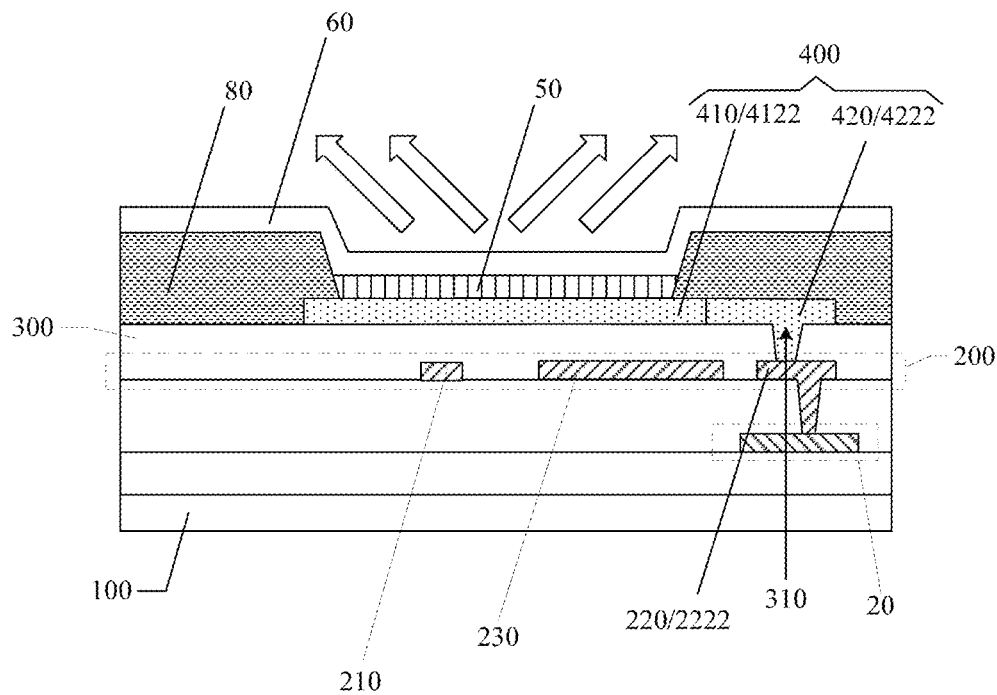
FIG. 15 is a schematic cross-sectional structural view of the display panel shown in FIG. 9A along a DD' direction.
Figure 16:
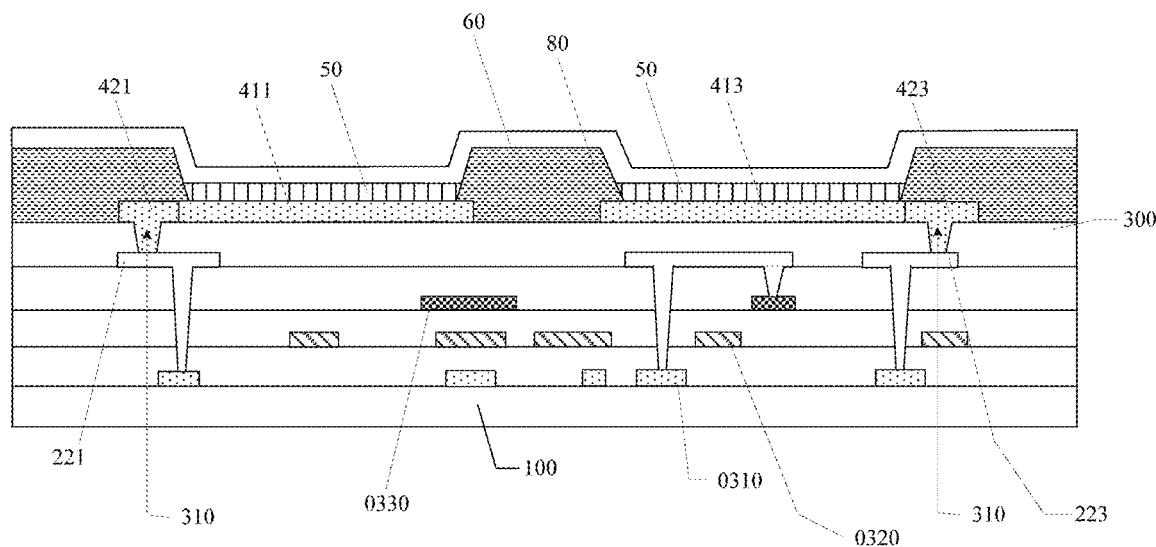
FIG. 16 is a schematic cross-sectional structural view of e display panel shown in FIG. 9B along an AA' direction.
Figure 17:
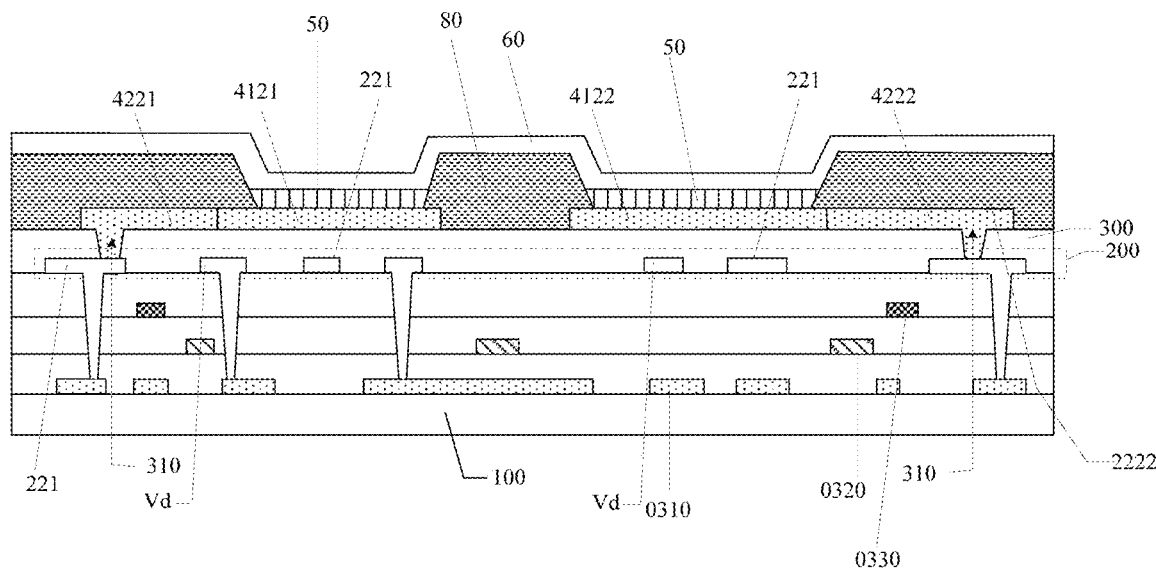
FIG. 17 is a schematic cross-sectional structural view of the display panel shown in FIG. 9B along a BB' direction.

In a specific implementation, in the embodiments of the present disclosure, as shown in FIG. 12, each sub-pixel may further comprise a pixel defining layer 80 located on a side of the anode 400 away from the substrate 100, a light emitting layer 50 located on the side of the anode 400 away from the substrate 100, and a cathode 60 located on a side of the anode away from the light emitting layer 50. The pixel defining layer 80 has an opening, and the opening exposes at least a portion region of the main portion 410 of the anode 400, the light emitting layer 50 is located within the opening and is in contact with the portion region of the main portion 410 exposed by the opening, so the region of the light emitting layer 50 in the opening is used to emit light, so that an effective light emitting region 90 can be defined by the opening. It should be noted that, for the implementation of the effective light emitting area 90 of each sub-pixel, reference may be made to the above embodiment, and details are not described herein.

Figure 9A:
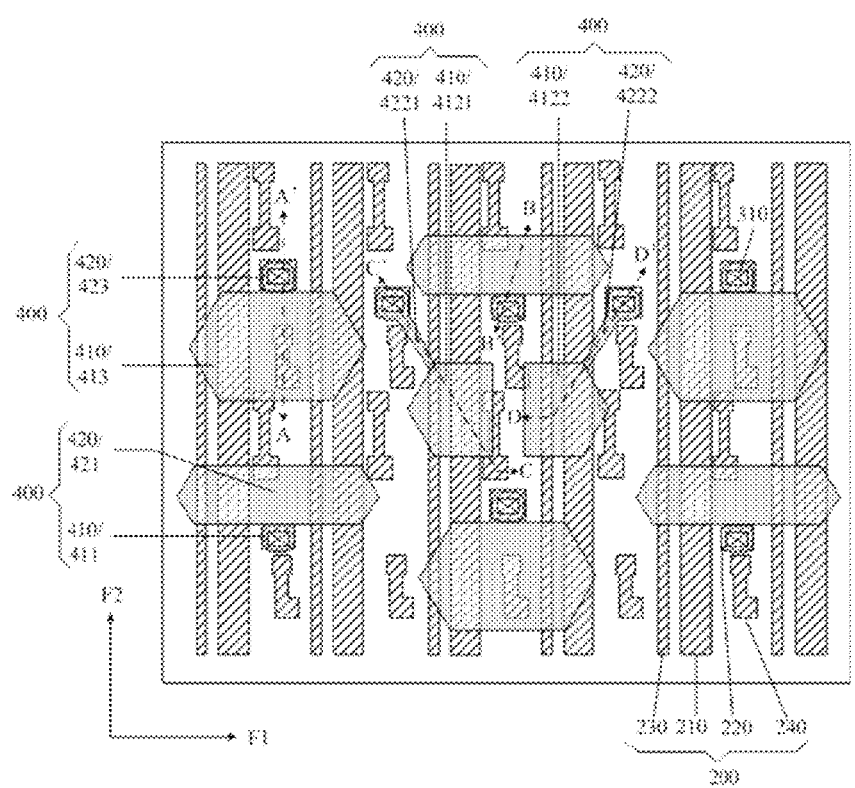
FIG. 9A is a schematic diagram showing a top structure of a display panel provided by yet other embodiments of the present disclosure.
Figure 9B:
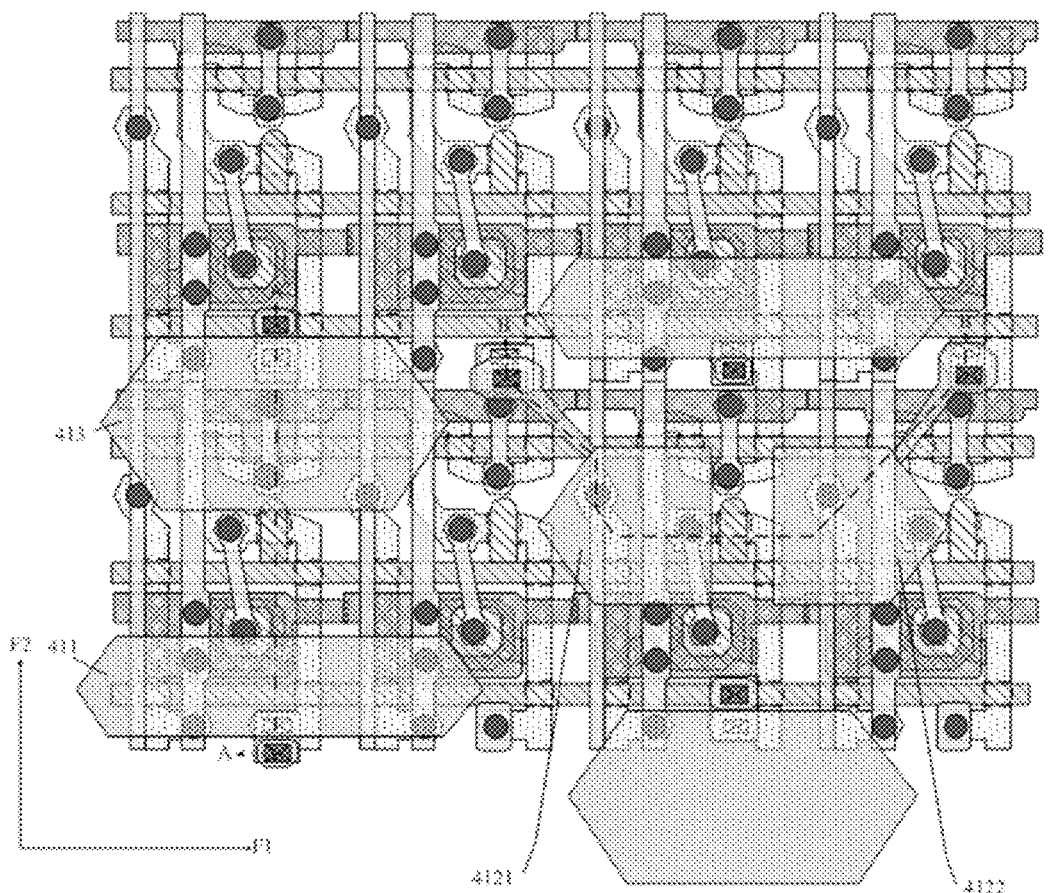
FIG. 9B is a schematic diagram showing a top structure of a display panel provided by still yet other embodiments of the present disclosure.
Figure 11:
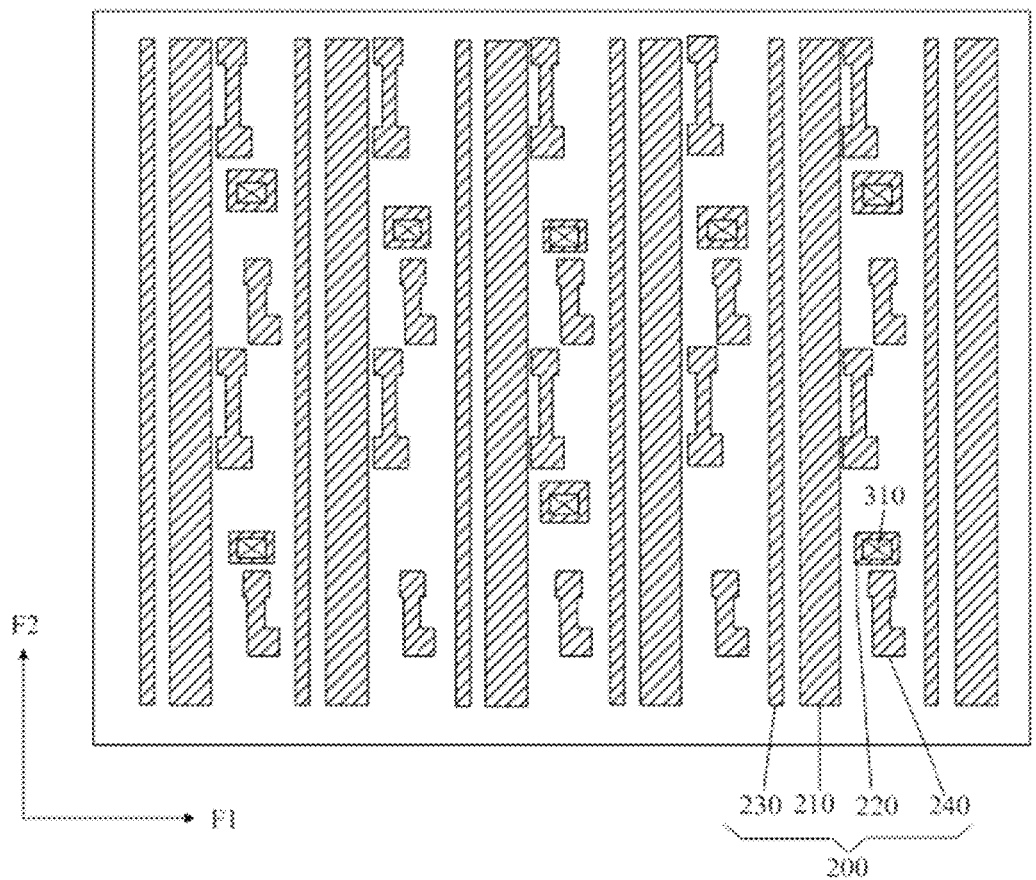
FIG. 11 is a schematic structural diagram of a first conductive layer and a first hole of the display panel shown in FIG. 9A.

In a specific implementation, the first power line may be configured as a power line that transmits a driving voltage. The data line may be configured as a signal line that transmits a data voltage. In the embodiments of the present disclosure, as shown in FIG. 9A, FIG. 9B, and FIG. 11, the first power line 210 and the data line 230 are arranged in the first direction F1 and extend along the second direction F2; and the first direction F1 and the second direction F2 are different. Illustratively, the first direction F1 is perpendicular to the second direction F2. Illustratively, the first direction F1 may be a row direction of the display panel, that is, a direction in which the gate lines extend, the second direction F2 may be a column direction of the display panel, that is, a direction in which the data lines extend. Of course, the embodiments of the present disclosure comprise but are not limited thereto.

Figure 10:
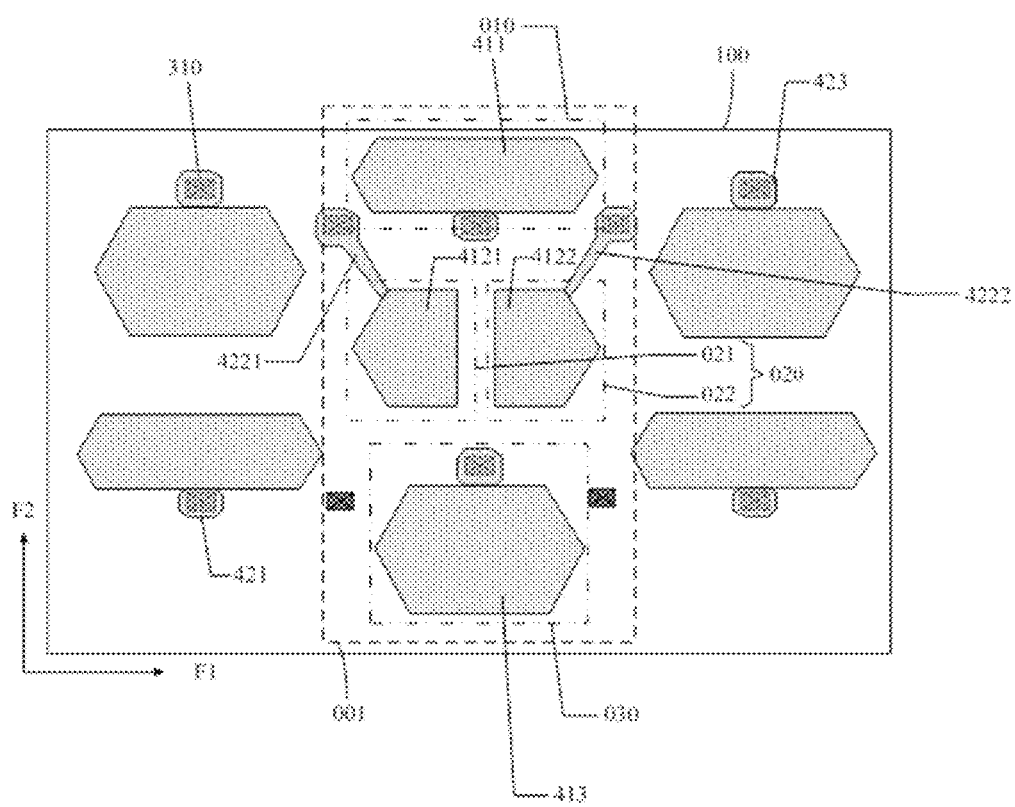
FIG. 10 is a schematic structural diagram of an anode and a first hole of the display panel shown in FIG. 9A.

Generally in a display field, a pixel usually comprises a plurality of sub-pixels, each of the sub-pixels can display a single color (for example, red, green, or blue), the display of different colors is achieved by controlling the ratio of sub-pixels of different colors, and thus the above sub-pixels may be monochrome sub-pixels. In a specific implementation, in the embodiments of the present disclosure, as shown in FIG. 9A to FIG. 10, each repeat unit of the plurality of repeat units 001 may comprise a first color sub-pixel 010, a second color sub-pixel pair 020, and a third color sub-pixel 030 which are arranged in the second direction F2. The second color sub-pixel pair 020 may comprise two second color sub-pixels 021 and 022 arranged in the first direction F1. The first color sub-pixel 010 is configured to emit light of a first color, the second color sub-pixels 021 and 022 are configured to emit light of a second color, and the third color sub-pixel 030 is configured to emit light of a third color. In some examples, the first color, the second color, and the third color may be selected from a group consisting of red, green, and blue. For example, the first color is red, the second color is green, and the third color is blue. Thus, the repeat unit 001 has an arrangement structure of a red sub-pixel, a green sub-pixel, and a blue sub-pixel. Of course, the embodiments of the present disclosure comprise but are not limited thereto. The first color, the second color, and the third color described above may also be other colors. It should be noted that the arrangement manner of the respective sub-pixels can refer to the above embodiments, and details are not described herein.

In a specific implementation, in the embodiments of the present disclosure, as shown in FIG. 9A to FIG. 10, the plurality of repeat units 001 are arranged in the second direction F2 to form repeat unit groups, the repeat unit groups are arranged in the first direction F1, and repeat units in one repeat unit group of two adjacent repeat units and repeat units in the other repeat unit group of two adjacent repeat units are misaligned. Illustratively, the repeat units in one repeat unit group of two adjacent repeat units and the repeat units in the other repeat unit group of two adjacent repeat units differ by a size of ½ of the repeat unit 001. It should be noted that the size of the above one repeat unit 001 may be a distance between centers of the same color sub-pixels in two adjacent repeat units 001 in the second direction F2. For example, the size of the above one repeat unit 001 may be a distance between centers of the first color sub-pixels 010 in two adjacent repeat units 001 in the second direction F2.

In a specific implementation, in the embodiments of the present disclosure, as shown in FIG. 9A to FIG. 10, a size of the main portion 411 of the first color sub-pixel 010 in the second direction F2 is smaller than a size of the main portion 413 of the third color sub-pixel 030 in the second direction F2. Also, a size of the main portion 411 of the first color sub-pixel 010 in the first direction F1 is larger than a size of the main portion 413 of the third color sub-pixel 030 in the first direction F1. Illustratively, a size of the main portion 413 of the third color sub-pixel 030 in the second direction F2 is smaller than a size of the main portion 413 of the third color sub-pixel 030 in the first direction F1, and the size of the main portion 411 of the first color sub-pixel 010 in the second direction F2 is smaller than the size of the main portion 411 of the first color sub-pixel 010 in the first direction F1. Of course, the embodiments of the present disclosure comprise but are not limited thereto, and the relationship among the above various sizes may also be in other forms.

In a specific implementation, as shown in FIG. 9A to FIG. 11, taking a first power line 210 and a data line 230 which are adjacent as a signal line group, in the embodiments of the present disclosure, in the third color sub-pixel 030, the orthographic projection of the main portion 413 on the substrate 100 covers the orthographic projections of the two signal line groups on the substrate 100. Further, the two signal line groups overlapping the orthographic projection of the main portion 413 on the substrate 100 are disposed in parallel on both sides of a center of the main portion 413. Illustratively, in the third color sub-pixel 030, the orthographic projection of the main portion 413 on the substrate 100 covers the orthographic projections of two first power lines 210 and two data lines 230 on the substrate 100. Moreover, one first power line 210 of the two first power lines 210 and one data line 230 of the two data lines 230 are disposed in parallel on one side of the main portion 413, and the other first power line 210 of the two first power lines 210 and the other data line 230 of the two data lines 230 are disposed in parallel on the other side of the main portion 413.

Further, in a specific implementation, in the embodiments of the present disclosure, as shown in FIG. 9A to FIG. 11, in the third color sub-pixel 030, the orthographic projection of the main portion 413 on the substrate 100 at least partially overlaps the orthographic projections of two bridge lines 240 on the substrate 100. Illustratively, the orthographic projection of the main portion 413 on the substrate 100 covers an orthographic projection of a bridge line 240 of the two bridge lines 240 on the substrate 100, and the orthographic projection of the main portion 413 on the substrate 100 overlaps an edge of an orthographic projection of the other bridge line 240 of the two bridge lines 240 on the substrate 101.

In a specific implementation, as shown in FIG. 9A to FIG. 11, in the first color sub-pixel 010, the orthographic projection of the main portion 411 on the substrate 100 covers the orthographic projections of two signal line groups on the substrate 100. Further, the two signal line groups overlapping the orthographic projection of the main portion 411 on the substrate 100 are disposed in parallel on both sides of a center of the main portion 411. Illustratively, in the first, color sub-pixel 010 the orthographic projection of the main portion 411 on the substrate 100 covers the orthographic projections of two first power lines 210 and two data lines 230 on the substrate 100. Moreover, one first power line 210 of the two first power lines 210 and one data line 230 of the two data lines 230 are disposed in parallel on one side of the main portion 411, and the other first power line 210 of the two first power lines 210 and the other data line 230 of the two data lines 230 are disposed in parallel on the other side of the main portion 411.

Further, in a specific implementation, in the embodiments of the present disclosure, as shown in FIG. 9A to FIG. 11, in the first color sub-pixel 010, the orthographic projection the main portion 411 on the substrate 100 overlaps an orthographic projection of a bridge line 240 on the substrate 100. Illustratively, the orthographic projection of the main portion 411 on the substrate 100 overlaps an edge of the orthographic projection of the bridge line 240 on the substrate 100.

In a specific implementation, as shown in FIG. 9A to FIG. 11, in each second color sub-pixel, the orthographic projection of the main portion on the substrate 100 overlaps the orthographic projection of one signal line group on the substrate 100. Further, in the same second color sub-pixel pair 020, signal line groups respectively overlapping the orthographic projections of the main portions of the two second color sub pixels on the substrate 100 are disposed adjacent to each other. Illustratively, the second color sub-pixel pair 020 can comprise a second color sub-pixel of number one 021 and a second color sub-pixel of number two 022. In the second color sub-pixel of number one 021, the orthographic projection of the main portion 4121 on the substrate 100 overlaps the orthographic projection of a first power line 210 and the orthographic projection of a data line 220 on the substrate 100. In the second color sub-pixel of number two 022, the orthographic projection of the main portion 4122 on the substrate 100 overlaps the orthographic projection of the other first power supply line 210 and the orthographic projection of the other data line 220 on the substrate 100.

Further, in a specific implementation, as shown in FIG. 9A to FIG. 11, the orthographic projection of the main portion 4121 in the second color sub-pixel of number one 021 on the substrate 100 may also overlap an edge of an orthographic projection of a bridge line 240 on the substrate 100.

Further, in a specific implementation, as shown in FIG. 9A to FIG. 11, the orthographic projection of the main portion 4122 in the second color sub-pixel of number two 022 on the substrate 100 may also overlap edges of orthographic projections of two bridge lines 240 on the substrate 100.

In a specific implementation, in the embodiments of the present disclosure, as shown in FIG. 9A, FIG. 9B, FIG. 12, and FIG. 16, in each third color sub-pixel 030, the main portion 413 and the auxiliary portion 423 are electrically connected to each other, and the auxiliary portion 423 is electrically connected to the first connection line 223 through the first hole 310, the first connection line 223 is electrically connected to a drain electrode of a transistor in the pixel driving circuit 20 to input an electrical signal generated by the pixel driving circuit 20 to the anode 400, and the cathode 60 is applied with a corresponding voltage, thereby driving the light emitting layer 50 to emit light.

In a specific implementation, in the embodiments of the present disclosure, as shown in FIG. 9A, FIG. 9B, FIG. 12, and FIG. 16, in each third color sub-pixel 030, the orthographic projection of the main portion 413 on the substrate 100 does not overlap the orthographic projection of the first hole 310 on the substrate 100, so that the main portion 413 of each third color sub-pixel 030 can be prevented from being affected by the first hole 310, thereby avoiding the occurrence of unevenness of the main portion 413 due to the first hole 310, thereby alleviating color shift phenomenon of the display panel.

Alternatively, the first insulation layer may be configured as a flat layer such that the body portion on the first insulation layer may have a higher flatness.

In a specific implementation, in the embodiments of the present disclosure, as shown in FIG. 9A to FIG. 10, FIG. 12, and FIG. 16, in the third color sub-pixel 030, the main portion 413 may be an axisymmetric pattern, and the first hole 310 may be located on a symmetry axis of the main portion 413 along the second direction F2. Illustratively, the main portion 413 in the third color sub-pixel 030 may have a first symmetry axis along the second direction F2. Illustratively, the shape of the main portion 413 in the third color sub-pixel 030 is substantially a hexagon or an ellipse, a long symmetry axis of the hexagon or a long axis of the ellipse is substantially parallel to the first direction F1, a short symmetry axis of the hexagon or a short axis of the ellipse is substantially parallel to the second direction F2, and the short symmetry axis of the hexagon or the short axis of the ellipse may be used as the first symmetry axis. Illustratively, the first hole 310 in the third color sub-pixel 030 may be disposed substantially symmetrically about the first symmetry axis, or the first hole 310 in the third color sub-pixel 030 may only intersect the first symmetry axis but is not disposed substantially symmetrically about the first symmetry axis. Certainly, in an actual application, an implementation manner of the first hole 310 in the third color sub-pixel 030 may be designed and determined according to an actual application environment, and is not limited herein.

In a specific implementation, in the embodiments of the present disclosure, as shown in FIG. 9A, FIG. 9B, FIG. 13, and FIG. 16, in each first color sub-pixel 010, the main portion 411 and the auxiliary portion 421 are electrically connected to each other, the auxiliary portion 421 is electrically connected to the first connection line 221 through the first hole 310, the first connection line 221 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

In a specific implementation, in the embodiments of the present disclosure, as shown in FIG. 9A, FIG. 9B, FIG. 13, and FIG. 16, in each first color sub-pixel 010, the orthographic projection of the main portion 411 on the substrate 100 does not overlap the orthographic projection of the first hole 310 on the substrate 100. In this way, the main portion 411 of each first color sub-pixel 010 can be prevented from being affected by the first hole 310, thereby avoiding the occurrence of unevenness of the main portion 411 due to the first hole 310, thereby alleviating color shift phenomenon of the display panel.

In a specific implementation, in the embodiments of the present disclosure, as shown in FIG. 9A, FIG. 9B, and FIG. 10, in the first color sub-pixel 010, the main portion 411 may be an axisymmetric pattern, and the first hole 310 may be located on a symmetry axis of the main portion 411 along the second direction F2. Illustratively, the main portion 411 in the first color sub-pixel 010 may have a second symmetry axis along the second direction F2. Illustratively, the shape of the main portion 411 in the first color sub-pixel 010 is substantially a hexagon or an ellipse, a long symmetry axis of the hexagon or a long axis of the ellipse is substantially parallel to the first direction F1, a short symmetry axis of the hexagon or a short axis of the ellipse is substantially parallel to the second direction F2, and the short symmetry axis of the hexagon or the short axis of the ellipse may be used as the second symmetry axis. Illustratively, the first hole 310 in the first color sub-pixel 010 may be disposed substantially symmetrically about the second symmetry axis, or the first hole 310 in the first color sub-pixel 010 may only intersect the second symmetry axis but is not disposed substantially symmetrically about the second symmetry axis. Certainly, in an actual application, an implementation manner of the first hole 310 in the first color sub-pixel 010 may be designed and determined according to an actual application environment, and is not limited herein.

In a specific implementation, in the embodiments of the present disclosure, as shown in FIG. 9A, FIG. 9B, FIG. 10, FIG. 14, and FIG. 17, in each second color sub-pixel of number one 021, the main portion 4121 and the auxiliary portion 4221 are electrically connected to each other, the auxiliary portion 4221 is electrically connected to the first connection line 2221 through the first hole 310, the first connection line 2221 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

In a specific implementation, in the embodiments of the present disclosure, as shown in FIG. 9A, FIG. 9B, FIG. 10, FIG. 15, and FIG. 17, in each second color sub-pixel of number two 022, the main portion 4122 and the auxiliary portion 4222 are electrically connected to each other, the auxiliary portion 4222 is electrically connected to the first connection line 2222 through the first hole 310, the first connection line 2222 is electrically connected to a drain electrode of a transistor in the pixel driving circuit to input an electric signal generated by the pixel driving circuit to the anode 400, and the cathode 60 is applied with a corresponding voltage, thereby driving the light emitting layer 50 to emit light.

Optionally, as shown in FIG. 9A, FIG. 9B, FIG. 10, and FIG. 14 to FIG. 17, in each second color sub-pixel, the orthographic projection of the main portion on the substrate does not overlap the orthographic projection of the first hole on the substrate. Illustratively, as shown in FIG. 9A, FIG. 9B, FIG. 10, and FIG. 14 to FIG. 17, in the second color sub-pixel of number one 021, the orthographic projection of the main portion 4121 on the substrate 100 does not overlap the orthographic projection of the first hole 310 on the substrate 100. In this way, the main portion 4121 of each second color sub-pixel of number one 021 can be prevented from being affected by the first hole 310, thereby avoiding the occurrence of unevenness of the main portion 4121 due to the first hole 310 thereby alleviating color shift phenomenon of the display panel.

Illustratively, as shown in FIG. 9A, FIG. 9B, FIG. 10, FIG. 15, and FIG. 17, in the second color sub-pixel of number two 022, the orthographic projection of the main portion 4122 on the substrate 100 does not overlap the orthographic projection of the first hole 310 on the substrate 100. In this way, the main portion 4122 of each second color sub-pixel of number two 022 can be prevented from being affected by the first hole 310, thereby avoiding the occurrence of unevenness of the main portion 4122 due to the first hole 310, thereby alleviating color shift phenomenon of the display panel.

In a specific implementation, in the embodiments of the present disclosure, as shown in FIG. 9A to FIG. 10, in the same repeat unit 001, the first hole 310 of the second color sub-pixel of number one 021 is disposed close to one side of the first color sub-pixel 010, and the first hole 310 of the second color sub-pixel of number two 022 is disposed close to the other side of the first color sub-pixel 010. That is, the first hole 310 of the second color sub-pixel of number one 021 and the first hole 310 of the second color sub-pixel of number two 022 are respectively located on both sides of the first color sub-pixel 010. Exemplarily, in the same repeat unit 001, the first hole 310 of the second color sub-pixel of number one 021 may be disposed between the main portion 411 in the first color sub-pixel 010 in the repeat unit 001 and the main portion 413 in the third color sub-pixel 030 adjacent to the left side of the main portion 411. Moreover, in the same repeat unit 001, the first hole 310 of the second color sub-pixel of number two 022 may be disposed between the main portion 411 in the first color sub-pixel 010 in the repeat unit 001 and the main portion 413 in the third color sub-pixel 030 adjacent to the right side of the main portion 411.

Optionally, in a specific implementation, in the embodiments of the present disclosure, as shown in FIG. 9A to FIG. 10, in the same repeat unit 001, the first hole 310 of the first color sub-pixel 010, the first hole 310 of the second color sub-pixel of number one 021 of the second color sub-pixel pair 020, and the first hole 310 of the second color sub-pixel of number two 022 of the second color sub-pixel pair 020 are arranged on the same straight line in the first direction F1. Illustratively, in a repeat unit 001 of the repeat unit group in a second column, for the first hole 310 of the first color sub-pixel 010, the first hole 310 of the second color sub-pixel of number one 021 of the second color sub-pixel pair 020, and the first hole 310 of the second color sub-pixel of number two 022 of the second color sub-pixel pair 020, the three first holes 310 may be arranged on the same straight line in the first direction F1, so that the design difficulty of the mask used when manufacturing the three first holes 310 can be reduced.

Optionally, in a specific implementation, in the embodiments of the present disclosure, as shown in FIG. 9A to FIG. 10, in the same repeat unit 001, the first hole 310 of the third color sub-pixel 030 and the first hole 310 of the first color sub-pixel 010 are arranged on the same straight line in the second direction F2. In this way, the design difficulty of the mask used when manufacturing these first holes 310 can also be reduced.

Optionally, in a specific implementation, in the embodiments of the present disclosure, as shown in FIG. 9A to FIG. 10, in the same repeat unit group, the first holes 310 of the third color sub-pixels 030 and the first holes 310 of the first color sub-pixels 010 are arranged on the same straight line the second direction F2. Further, in the same repeat unit group, the first holes 310 of the second color sub-pixels of number one 021 of respective second color sub-pixel pairs 020 are arranged on the same straight line in the second direction F2. And in the same repeat unit group, the first holes 310 of the second color sub-pixels of number two 022 of the respective second color sub-pixel pairs 020 are arranged on the same straight line in the second direction F2. In this way, the design difficulty of the mask used when manufacturing these first holes 310 can also be reduced.

In a specific implementation, in the embodiments of the present disclosure, as shown in FIG. 9A to FIG. 10, in the odd-numbered repeat unit groups, in the repeat units 001 of the same row, the first holes 310 of the first color sub-pixels 010, and the first holes 310 of the second color sub-pixels of number one 021 in the second color sub-pixel pairs 020, the first holes 310 of the second color sub-pixels of number two 022 in the second color sub-pixel pairs 020 are arranged on the same straight line in the first direction F1. In this way, the design difficulty of the mask used when manufacturing these first holes 310 can also be reduced.

In a specific implementation, in the embodiments of the present disclosure, as shown in FIG. 9A to FIG. 10, in the odd-numbered repeat unit groups, the first holes 310 of the third color sub-pixels 030 in the repeat units 001 of the same row are arranged on the same straight line in the first direction F1. In this way, the design difficulty of the mask used when manufacturing these first holes 310 can also be reduced.

In a specific implementation, in the embodiments of the present disclosure, as shown in FIG. 9A to FIG. 10, in the even-numbered repeat unit groups, in the repeat units 001 of the same row, the first holes 310 of the first color sub-pixels 010, and the first holes 310 of the second color sub-pixels of number one 021 in the second color sub-pixel pairs 020, the first holes 310 of the second color sub-pixels of number two 022 in the second color sub-pixel pairs 020 are arranged on the same straight line in the first direction F1. In this way, the design difficulty of the mask used when manufacturing these first holes 310 can also be reduced.

In a specific implementation, in the embodiments of the present disclosure, as shown in FIG. 9A to FIG. 10, in the even-numbered repeat unit groups, in the repeat units 001 of the same row, the first holes 310 of the third color sub-pixels 030 are arranged on the same straight line in the first direction F1. In this way, the design difficulty of the mask used when manufacturing these first holes 310 can also be reduced.

In addition, it should be noted that for the implementations of the first holes in the embodiment, reference may also be made to the implementations of the first holes in the above embodiments, and details are not described herein.

It should be noted that due to limitations of process conditions or other factor, the "same" in the above features may not be completely identical, and there may be some deviation, and therefore, the same relationship between the above features is only required to substantially satisfy the above conditions, and is within the protection scope of the present disclosure. For example, the "same" described above may indicate the same as allowed within the allowed error range.

Moreover, due to limitations of process conditions or other factors, it is not possible to strictly arrange the different holes in a straight line along, the first direction or the second direction, there may be some deviation, and therefore, the above relationship of arranging on a straight line may be within the protection scope of the present invention as long as the above relationship of arranging on the straight line satisfies substantially the above conditions.

Embodiments of the present disclosure provide an electroluminescent display panel. As shown in FIG. 9A to FIG. 15, the electroluminescent display panel includes: a base substrate 100; a plurality of sub-pixels. Each sub-pixel includes a pixel driving circuit including a semiconductor layer (such as 0310) and a first conductive layer (such as 200) located on the base substrate 100. The first conductive layer 200 includes an anode connection portion 220, a data line 230 and a power line 210 that are spaced apart from each other; a size of the data line in a second direction F2 is larger than a size of the data line in a first direction F1, and a size of the power line in the second direction F2 is larger than a size of the power line in the first direction F1; and the first direction F1 is different from the second direction F2. The display panel further includes an anode 400, located on a side of the first conductive layer 200 away from the base substrate 100. At least one film layer is arranged between a layer where the anode 400 is located and the first conductive layer 200; and the anode 400 is directly connected to the anode connection portion (such as 220) through a first hole 310 penetrating through the at least one film layer; wherein, the plurality of sub-pixels include first sub-pixels (such as 010) and second sub-pixels (such as 022), wherein each first sub-pixel (such as 010) includes a first pixel driving circuit, and each second sub-pixel (such as 022) includes a second pixel driving circuit; the first pixel driving circuit includes a first semiconductor pattern on the semiconductor layer, and the second pixel driving circuit includes a second semiconductor pattern on the semiconductor layer; the first pixel driving circuit and the second pixel driving circuit are arranged in the first direction F1; the anode includes a first anode, wherein the first anode (such as an anode 400 of a first color sub-pixel 010) is electrically connected to the first pixel driving circuit, and a size of the first anode in the first direction is larger than a size of the first anode in the second direction; the data line includes a first data line and a second data line, wherein the first data line is electrically connected to the first pixel driving circuit, and the second data line is electrically connected to the second pixel driving circuit the power line includes a first power line and a second power line, wherein an orthographic projection of the first power line on the base substrate 100 overlaps with an orthographic projection of the first semiconductor pattern on the base substrate 100, and an orthographic projection of the second power line on the base substrate 100 overlaps with an orthographic projection of the second semiconductor pattern on the base substrate 100; the pixel driving circuit includes a capacitance pole plate, wherein the first pixel driving circuit includes a first capacitance pole plate (such as a second electrode CC2a of a third capacitor C2 in a first sub-pixel (such as 010)), the second pixel driving circuit includes a second capacitance pole plate (such as a second CC2a of a third capacitor C2 in a second sub-pixel), and the first capacitance pole plate and the second capacitance pole plate are arranged on a same layer; and an orthographic projection of the first anode (such as an anode 400 of a first color sub-pixel 010) electrically connected to the first pixel driving circuit on the base substrate 100 overlaps with an orthographic projection of the first capacitance pole plate on the base substrate 100, an orthographic projection of the second capacitance pole plate on the base substrate 100, an orthographic projection of the first data line on the base substrate 100, an orthographic projection of the second data line on the base substrate 100, the orthographic projection of the first power line on the base substrate 100, and the orthographic projection of the second power line on the base substrate 100 respectively; and an overlapping area of orthographic projections of the first anode and the first capacitance pole plate on the base substrate 100 is larger than an overlapping area of orthographic projections of the first anode and the second capacitance pole plate on the base substrate 100.

In some embodiments, as shown in FIG. 9A to FIG. 15, the pixel driving circuit includes a driving transistor T1 including a gate electrode; the first capacitance pole plate serves as the gate electrode of the driving transistor T1 in the first pixel driving circuit and the second capacitance pole plate serves as the gate electrode of the driving transistor T1 in the second pixel driving circuit.

In some embodiments, as shown in FIG. 9A to FIG. 15, an orthographic projection of the power line (such as 210) on the base substrate 100 overlaps with an orthographic projection of the gate electrode of the driving transistor T1 on the base substrate 100.

In some embodiments, as shown in FIG. 9A to FIG. 15, an overlapping area of orthographic projections of the first anode (such as an anode 400 of a first color sub-pixel 010) and the first data line (i.e., a data line connected with a first pixel driving circuit of a first sub-pixel (such as 010)) on the base substrate 100 is approximately equal to an overlapping area of orthographic projections of the first anode (such as an anode 400 of a first color sub-pixel 010) and the second data line (i.e., a data line connected with a second pixel driving circuit of a second sub-pixel) on the base substrate100.

In some embodiments, as shown in FIG. 9A to FIG. 15, the anode 400 includes a main portion 410 and an auxiliary portion 420 which are electrically connected to each other; an orthographic projection of an effective light emitting region 90 of the anode on the base substrate 100 is located in an orthographic projection of the main portion 410 on the base substrate 100; a boundary of the main portion 410 and a boundary of the anode 400 at least partially coincide; an orthographic projection of the first hole 310 on the base substrate 100 is located in an orthographic projection of the auxiliary portion 410 on the base substrate 100; the auxiliary portion 420 and the anode have at least partially the same boundary; and an overlapping area of orthographic projections of the main portion 410 of the first anode (such as an anode 400 of a first color sub-pixel 010) and the first data line (i.e., a data line connected with a first pixel driving circuit of a first sub-pixel (such as 010)) on the base substrate 100 is approximately equal to an overlapping area of orthographic projections of the main portion 410 of the first anode (such as an anode 400 of a first color sub-pixel 010) and the second data line (i.e., a data line connected to a second pixel driving circuit of a second sub-pixel) on the base substrate 100.

In some embodiments, as shown in FIG. 9A to FIG. 15, a distance between the first data line (i.e., a data line connected with a first pixel driving circuit of a first sub-pixel (such as 010)) and the first power line (i.e., i.e., a power line connected with a first pixel driving circuit of a first sub-pixel (such as 010)) is smaller than a distance between the first power line and the second power line (i.e., a power line connected to a second pixel driving circuit of a second sub-pixel).

In some embodiments, as shown in FIG. 9A to FIG. 15, an overlapping area of orthographic projections of an effective light emitting region (such as 90-010) corresponding to the first anode (such as an anode 400 of a first color sub-pixel 010) and the first data line (i.e., a data line connected with a first pixel driving circuit of a first sub-pixel (such as 010)) on the base substrate 100 is approximately equal to an overlapping area of orthographic projections of the effective light emitting region (such as 90-010) corresponding to the first anode (such as an anode 400 of a first color sub-pixel 010) and the second data line (i.e., a data line connected to a second pixel driving circuit of a second sub-pixel) on the base substrate 100.

In some embodiments, as shown in FIG. 9A to FIG. 15, the pixel driving circuit includes a storage capacitor including a reference pole plate (such as a first electrode CC1a of a third capacitor C2) arranged between the capacitance pole plate (such as a second electrode CC2a of a third capacitor C2) and the first conductive layer 200; the reference pole plate (such as a first electrode CC1a of a third capacitor C2) has a pole plate hole; and the orthographic projection of the first anode (such as an anode 400 of a first color sub-pixel 010) on the base substrate 100 overlaps with an orthographic projection of the pole plate hole of the reference pole plate (such as a first electrode CC1a of a third capacitor C2) in the first sub-pixel (such as 010) on the base substrate 100.

In some embodiments, as shown in FIG. 9A to FIG. 15, an edge portion of the first anode (such as an anode 400 of a first color sub-pixel 010) in the first direction F1 has a first anode size in the second direction F2; a middle portion of the first anode (such as an anode 400 of a first color sub-pixel 010) in the first direction F1 has a second anode size in the second direction F2; and the first anode (such as an anode 400 of a first color sub-pixel 010) size is smaller than the second anode (such as 4122) size.

In some embodiments, as shown in FIG. 9A to FIG. 15, an edge portion of the anode in the second sub-pixel in the second direction F2 has a third anode size in the first direction F1; a middle portion of the anode in the second sub-pixel in the second direction F2 has a fourth anode size in the first direction F1; and the third anode size is smaller than the fourth anode (such as 4121) size.

In some embodiments, as shown in FIG. 9A to FIG. 15, a minimum distance between effective light emitting regions of two sub-pixels with a first light emitting color is a first minimum distance; and a minimum distance between effective light emitting regions of two sub-pixels with a second light emitting color is a second minimum distance, wherein the first minimum distance is smaller than the second minimum distance, and the second light emitting color is any light emitting color other than the first light emitting color.

In some embodiments, as shown in FIG. 9A to FIG. 15, the plurality of sub-pixels further include third sub-pixels (such as 030); a direction where an auxiliary portion 420 in the first sub-pixel (such as 010) protrudes from a main portion 410 in the first sub-pixel 010 is a first protruding direction; a direction where an auxiliary portion 420 in the second sub-pixel protrudes from a main portion 410 in the second sub-pixel is a second protruding direction; a direction where an auxiliary portion 420 in the third sub-pixel protrudes from a main portion 410 in the third sub-pixel is a third protruding direction; and an angle between the first protruding direction and the third protruding direction is smaller than an angle between the first protruding direction and the second protruding direction.

In some embodiments, as shown in FIG. 9A to FIG. 15, a minimum distance between an anode 411 in the first sub-pixel 010 and an anode in the second sub-pixel (such as 021, 022) is smaller than a length of the auxiliary portion 420 in the second sub-pixel (such as 021, 022).

In some embodiments, as shown in FIG. 9A to FIG. 15, a distance between a first hole 310 in the second sub-pixel (such as 021, 022) and a first hole 310 in the third sub-pixel 030 is smaller than a length of an anode in the third sub-pixel 030 in the first direction F1.

In some embodiments, as shown in FIG. 9A to FIG. 15, an overlapping area of orthographic projections of the main portion 410 of the first anode (such as an anode 400 of a first color sub-pixel 010) and the first power line (i.e., a power line connected with a first pixel driving circuit of a first sub-pixel (such as 010)) on the base substrate 100 is approximately equal to an overlapping area of orthographic projections of the main portion 410 of the first anode (such as an anode 400 of a first color sub-pixel 010) and the second power line (i.e., a power line connected with a second pixel driving circuit of a second sub-pixel) on the base substrate 100.

In some embodiments, as shown in FIG. 9A to FIG. 15, a sum of an overlapping area of orthographic projections of the main portion 410 of the first anode (such as an anode 400 of a first color sub-pixel 010) and the first power line (i.e., a power line connected with a first pixel driving circuit of a first sub-pixel (such as 010)) on the base substrate 100 and the overlapping area of orthographic projections of the main portion 410 of the first anode (such as an anode 400 of a first color sub-pixel 010) and the first data line (i.e., a data line connected with a first pixel driving circuit of a first sub-pixel (such as 010)) on the base substrate 100 is a first area sum; a sum of an overlapping area of orthographic projections of the main portion 410 of the first anode (such as an anode 400 of a first color sub-pixel 010) and the second power line (i.e., a power line connected with a second pixel driving circuit of a second sub-pixel) on the base substrate 100 and the overlapping area of orthographic projections of the main portion 410 of the first anode (such as an anode 400 of a first color sub-pixel 010) and the second data line (i.e., a data line connected with a second pixel driving circuit of a second sub-pixel) on the base substrate 100 is a second area sum; and the first area sum is approximately equal to the second area sum.

In some embodiments, as shown in FIG. 9A to FIG. 15, a sum of an overlapping area of orthographic projections of an effective light emitting region (such as 90-010) corresponding to the first anode (such as an anode 400 of a first color sub-pixel 010) and the first power line (i.e., a power line connected with a first pixel driving circuit of a first sub-pixel (such as 010)) on the base substrate 100 and an overlapping area of orthographic projections of the effective light emitting region corresponding to the first anode (such as an anode 400 of a first color sub-pixel 010) and the first data line (i.e., a data line connected with a first pixel driving circuit of a first sub-pixel (such as 010)) on the base substrate 100 is a third area sum; a sum of an overlapping area of orthographic projections of the effective light emitting region (such as 90-010) corresponding to the first anode (such as an anode 400 of a first color sub-pixel 010) and the second power line (i.e., a power line connected with a second pixel driving circuit of a second sub-pixel) on the base substrate 100 and an overlapping area of orthographic projections of the effective light emitting region (such as 90-010) corresponding to the first anode (such as an anode 400 of a first color sub-pixel 010) and the second data line (i.e., a data line connected with a second pixel driving circuit of a second sub-pixel) on the base substrate 100 is a fourth area sum; and the third area sum is approximately equal to the fourth area sum.

In some embodiments, as shown in FIG. 9A to FIG. 15, an orthographic projection of the anode 400 on the base substrate 100 overlaps with an orthographic projection of a scan signal line (such as a second scan signal line Ga2a) on the base substrate 400, an orthographic projection of a reset control signal line (such as a first reset control signal line Rst1a/a second reset control signal line Rst2a) on the base substrate 100, and an orthographic projection of a reset power signal line (such as a first reset power signal line Init1a/a second reset power signal line Init2a) on the base substrate 100 respectively; the scan signal line (such as a second scan signal line Ga2a) is configured to control a threshold compensation transistor T3 in the pixel driving circuit the reset control signal line (such as a first reset control signal line Rst1a/a second reset control signal line Rst2a) is configured to control a first reset transistor T6 in the pixel driving circuit and the reset power signal line (such as a first reset power signal line Init1a/a second reset power signal line Init2a) is configured to provide an initialization voltage.

In some embodiments, as shown in FIG. 9A to FIG. 15, a second electrode of the first reset transistor T6 is electrically connected to a gate electrode of a driving transistor T1; and the reset power signal line (such as a first reset power signal line Init1a/a second reset power signal line Init2a) is electrically connected to the gate electrode of the driving transistor T1 through the first reset transistor T6.

In some embodiments, as shown in FIG. 9A to FIG. 15, a first connection block (such as 341a) arranged on a conductive layer is electrically connected to the gate electrode of the driving transistor T1 and a source electrode region or a drain electrode region of the threshold compensation transistor T3 in the semiconductor layer; and the conductive layer (such as 200) is arranged between the anode 400 and the semiconductor layer (such as 0310).

In some embodiments, as shown in FIG. 9A to FIG. 15, an orthographic projection of the scan signal line on the base substrate 100 overlaps with an orthographic projection of the first connection block on the base substrate 100.

In some embodiments, as shown in FIG. 9A to FIG. 15, a second connection block arranged on the conductive layer is electrically connected to the reset power signal line and a source electrode region of the first reset transistor T6 in the semiconductor layer.

In some embodiments, as shown in FIG. 9A to FIG. 15, the orthographic projection of the reset control signal line (such as a first reset control signal line Rst1a/a second reset control signal line Rst2a) on the base substrate is located between the orthographic projection of the scan signal line (such as a second scan signal line Ga2a) on the base substrate 100 and the orthographic projection of the reset power signal line (such as a first reset power signal line Init1a/a second reset power signal line Init2a) on the base substrate 100.

In some embodiments, as shown in FIG. 9A to FIG. 15, the power line is electrically connected to a reference pole plate (such as a first electrode CC1a of a third capacitor C2) arranged in a reference conductive layer 0330.

In some embodiments, as shown in FIG. 9A to FIG. 15, at least one film layer is arranged on a side of the first conductive layer 200 away from a layer where the anode 400 is located; the power line (such as 210) is electrically connected to a corresponding pixel driving circuit through a connection hole (such as 3832a) penetrating through the at least one film layer; the first anode (such as an anode 400 of a first color sub-pixel 010) respectively overlaps with a connection hole (such as 3832a) corresponding to the first power line (such as a power line connected with a first pixel driving circuit of a first sub-pixel (such as 010)) and a connection hole (such as 3832a) corresponding to the second power line (such as a power line connected with a second pixel driving circuit of a second sub-pixel); and an overlapping area of orthographic projections of the first anode (such as an anode 400 of a first color sub-pixel 010) and the connection hole (such as 3832a) corresponding to the first power line (such as a power line connected with a first pixel driving circuit of a first sub-pixel (such as 010)) on the base substrate 100 is approximately equal to an overlapping area of orthographic projections of the first anode (such as an anode 400 of a first color sub-pixel 010) and the connection hole corresponding to the second power line (such as a power line connected with a second pixel driving circuit of a second sub-pixel) on the base substrate 100.

In some embodiments, as shown in FIG. 9A to FIG. 15, the main portion 410 and an effective light emitting region (such as 90-010) of the first anode (such as an anode 400 of a first color sub-pixel 010) overlap with a light emitting control signal line (such as EM1a/EM2a); and the light emitting control signal line (such as EM1a/EM2a) is configured to control light emitting control transistors in the first pixel driving circuit and the second pixel driving circuit.

In some embodiments, as shown in FIG. 9A to FIG. 15, an orthographic projection of the capacitance pole plate (such as a first electrode CC1a of a third capacitor C2) on the base substrate 100 is arranged between an orthographic projection of the light emitting control signal line (such as EM1a/EM2a) on the base substrate 100 and an orthographic projection of a scan signal line (such as a second scan signal line Ga2a) on the base substrate 100.

In some embodiments, as shown in FIG. 9A to FIG. 15, main portions 410 of anodes 400 in the sub-pixels of at least two colors do not overlap with corresponding capacitance pole plates (such as a second electrode CC2a of a third capacitor C2).

In some embodiments, as shown in FIG. 9A to FIG. 15, the at least two colors are different from a light emitting color of the sub-pixel where the first pixel driving circuit is located.

In some embodiments, as shown in FIG. 9A to FIG. 15, extension directions of auxiliary portions 420 of at least two anodes 400 are different.

In some embodiments, as shown in FIG. 9A to FIG. 15, the anode further includes a fourth anode (such as 4121); a size of the fourth anode (such as 4121) in the first direction F1 is greater than the size of the fourth anode (such as 4121) in the second direction F2; the fourth anode (such as 4121) overlaps with the first data line (i.e., a data line connected with a first pixel driving circuit of a first sub-pixel (such as 010)), the second data line (i.e., a data line connected with a second pixel driving circuit of a second sub-pixel), the first power line (i.e., a power line connected with a first pixel driving circuit of a first sub-pixel (such as 010)), and the second power line (i.e., a power line connected with a second pixel driving circuit of a second sub-pixel) respectively; and an orthographic projection of an effective light emitting region (such as 90-010) corresponding to the first anode (such as an anode 400 of a first color sub-pixel 010) on the base substrate 100 and an orthographic projection of an effective light emitting region (such as 90-010) corresponding to the fourth anode (such as 4121) on the base substrate 100 do not coincide after translation.

In some embodiments, as shown in FIG. 9A to FIG. 15, an overlapping area of orthographic projections of the fourth anode (such as 4121) and the first power line (i.e., a power line connected with a first pixel driving circuit of a first sub-pixel (such as 010)) on the base substrate 100 is larger than an overlapping area of orthographic projections of the fourth anode (such as 4121) and the second power line (i.e., a power line connected with a second pixel driving circuit of a second sub-pixel) on the base substrate 100.

In some embodiments, as shown in FIG. 9A to FIG. 15, main portions 410 of anodes in the plurality of sub-pixels do not overlap with corresponding anode connection portions (such as 220).

In some embodiments, as shown in FIG. 9A to FIG. 15, the plurality of sub-pixels include green sub-pixels (such as 021, 022); and anode connection portions (such as 220) in the green sub-pixels (such as 021, 022) do not overlap with main portions (such as 4121 in 021, 4122 in 022) of corresponding anodes (such as an anode in 021, an anode in 022).

In some embodiments, as shown in FIG. 9A to FIG. 15, in each green sub-pixel (such as 021, 022), the first hole 310 and the main portion (such as 4121 in 021, 4122 in 022) of a corresponding anode do not overlap in the first direction F1, and the first hole 310 and a corresponding effective light emitting region (such as 90-021 in 021, 90-022 in 022) do not overlap in the first direction F1.

In some embodiments, as shown in FIG. 9A to FIG. 15, first holes 310 in the plurality of sub-pixels are located on a same straight line extending along the first direction F1; and orthographic projections of effective light emitting regions corresponding to at least two of the first holes 310 on the base substrate 100 do not coincide after translation.

In some embodiments, as shown in FIG. 9A to FIG. 15, first holes 310 in the plurality of sub-pixels are located on a same straight line extending along the first direction F1; and at least two of the first holes 310 and main portions 410 of corresponding anodes do not overlap in the second direction F2, and the at least two of the first holes 310 and corresponding effective light emitting regions do not overlap in the second direction F2.

In some embodiments, as shown in FIG. 9A to FIG. 15, an auxiliary portion (such as 4221 in 021, 4222 in 022) in each green sub-pixel (such as 021, 022) includes an anode hole arrangement portion and an anode hole connection portion; the anode hole arrangement portion and the anode hole connection portion are strip-shaped; the anode hole connection portion is configured to electrically connect with the main portion 410 and the anode hole arrangement portion; and in each green sub-pixel (such as 021, 022), an orthographic projection of the first hole 310 on the base substrate 100 is located in an orthographic projection of the anode hole arrangement portion on the base substrate 100, and a maximum width of the anode hole arrangement portion is greater than a maximum width of the anode hole connection portion.

In some embodiments, as shown in FIG. 9A to FIG. 15, the plurality of sub-pixels include at least two sub-pixels, an overlapping area of orthographic projections of an anode and a corresponding capacitance pole plate in one of the at least two sub-pixels on the base substrate is approximately equal to an overlapping area of orthographic projections of an anode and a corresponding capacitance pole plate in another one of the at least two sub-pixels on the base substrate, orthographic projections of effective light emitting regions corresponding to at least two anodes of the at least two sub-pixels on the base substrate do not coincide after translation.

In some embodiments, as shown in FIG. 9A to FIG. 15, the at least two anodes correspond to green sub-pixels (such as 021, 022).

Based on the same invention concept, an embodiment of the present disclosure further provides a display device comprising the above-described electroluminescent display panel provided by the embodiments of the present disclosure. The principle of the display device for solving the problem is similar to the principle of the foregoing electroluminescent display panel for solving the problem, and therefore, for the implementation of the display device, reference may be made to the implementation of the foregoing electroluminescent display panel, and the repeated descriptions are not described herein again.

In a specific implementation, in the embodiments of the present disclosure, the display device may be a mobile phone, a tablet computer, a television, a display, a notebook computer, a digital photo frame, a navigator, or any product or component having a display function. Other indispensable components of the display device are understood by those skilled in the art, are not described herein, and should not be construed as limiting the present disclosure.

In the electroluminescent display panel and the display device provided by the embodiments of the present disclosure, the anode comprises the main portion and the auxiliary portion that are electrically connected to each other, the auxiliary portion is electrically connected to the first conductive layer through the first hole, so as to electrically connect the anode to the pixel driving circuit through the first conductive layer. And, because in at least one sub-pixel, the orthographic projection of the main portion on the substrate does not overlap the orthographic projection of the first hole on the substrate, and thus, the first hole in the sub pixel can be kept away from the main portion such that the main portion of the anode in the sub-pixel is not affected by the depth of the first hole, thereby avoiding the main portion of the anode from having recesses, avoiding the occurrence of the unevenness of the anode caused by the first hole, and thereby alleviating the color shift phenomenon of the display panel.

Apparently, those skilled in the art can make various modifications and variations to the embodiments of the present disclosure without departing from the spirit and scope of the embodiments of the present disclosure. Therefore, if these variations and modifications fall in the scope of the claims and their equivalents of the present disclosure, the present disclosure shall be also intended to cover such variations and modifications.

What is claimed is:

1. An electroluminescent display panel, comprising:
   a base substrate;
   a plurality of sub-pixels,
      wherein each sub-pixel comprises a pixel driving circuit comprising a semiconductor layer and a first conductive layer located on the base substrate;
         wherein the first conductive layer comprises an anode connection portion, a data line and a power line that are spaced apart from each other; a size of the data line in a second direction is larger than a size of the data line in a first direction, and a size of the power line in the second direction is larger than a size of the power line in the first direction; and the first direction is different from the second direction; and
   an anode, located on a side of the first conductive layer away from the base substrate, wherein at least one film layer is arranged between a layer where the anode is located and the first conductive layer; and the anode is directly connected to the anode connection portion through a first hole penetrating through the at least one film layer;
   wherein,
   the plurality of sub-pixels comprise first sub-pixels and second sub-pixels, wherein each first sub-pixel comprises a first pixel driving circuit, and each second sub-pixel comprises a second pixel driving circuit;
   the first pixel driving circuit comprises a first semiconductor pattern on the semiconductor layer, and the second pixel driving circuit comprises a second semiconductor pattern on the semiconductor layer;

the first pixel driving circuit and the second pixel driving circuit are arranged in the first direction;

the anode comprises a first anode, wherein the first anode is electrically connected to the first pixel driving circuit, and a size of the first anode in the first direction is larger than a size of the first anode in the second direction;

the data line comprises a first data line and a second data line, wherein the first data line is electrically connected to the first pixel driving circuit, and the second data line is electrically connected to the second pixel driving circuit;

the power line comprises a first power line and a second power line, wherein an orthographic projection of the first power line on the base substrate overlaps with an orthographic projection of the first semiconductor pattern on the base substrate, and an orthographic projection of the second power line on the base substrate overlaps with an orthographic projection of the second semiconductor pattern on the base substrate;

the pixel driving circuit comprises a capacitance pole plate, wherein the first pixel driving circuit comprises a first capacitance pole plate, the second pixel driving circuit comprises a second capacitance pole plate, and the first capacitance pole plate and the second capacitance pole plate are arranged on a same layer; and an orthographic projection of the first anode electrically connected to the first pixel driving circuit on the base substrate overlaps with an orthographic projection of the first capacitance pole plate on the base substrate, an orthographic projection of the second capacitance pole plate on the base substrate, an orthographic projection of the first data line on the base substrate, an orthographic projection of the second data line on the base substrate, the orthographic projection of the first power line on the base substrate, and the orthographic projection of the second power line on the base substrate respectively; and an overlapping area of orthographic projections of the first anode and the first capacitance pole plate on the base substrate is larger than an overlapping area of orthographic projections of the first anode and the second capacitance pole plate on the base substrate.

2. The electroluminescent display panel according to claim 1, wherein the pixel driving circuit comprises a driving transistor comprising a gate electrode;

the first capacitance pole plate serves as the gate electrode of the driving transistor in the first pixel driving circuit; and the second capacitance pole plate serves as the gate electrode of the driving transistor in the second pixel driving circuit.

3. The electroluminescent display panel according to claim 2, wherein an orthographic projection of the power line on the base substrate overlaps with an orthographic projection of the gate electrode of the driving transistor on the base substrate.

4. The electroluminescent display panel according to claim 2, wherein an overlapping area of orthographic projections of the first anode and the first data line on the base substrate is approximately equal to an overlapping area of orthographic projections of the first anode and the second data line on the base substrate.

5. The electroluminescent display panel according to claim 4, wherein the anode comprises a main portion and an auxiliary portion which are electrically connected to each other;

an orthographic projection of an effective light emitting region of the anode on the base substrate is located in an orthographic projection of the main portion on the base substrate;

a boundary of the main portion and a boundary of the anode at least partially coincide;

an orthographic projection of the first hole on the base substrate is located in an orthographic projection of the auxiliary portion on the base substrate;

the auxiliary portion and the anode have at least partially the same boundary; and an overlapping area of orthographic projections of the main portion of the first anode and the first data line on the base substrate is approximately equal to an overlapping area of orthographic projections of the main portion of the first anode and the second data line on the base substrate.

6. The electroluminescent display panel according to claim 1, wherein a distance between the first data line and the first power line is smaller than a distance between the first power line and the second power line.

7. The electroluminescent display panel according to claim 1, wherein an overlapping area of orthographic projections of an effective light emitting region corresponding to the first anode and the first data line on the base substrate is approximately equal to an overlapping area of orthographic projections of the effective light emitting region corresponding to the first anode and the second data line on the base substrate.

8. The electroluminescent display panel according to claim 1, wherein the pixel driving circuit comprises a storage capacitor comprising a reference pole plate arranged between the capacitance pole plate and the first conductive layer;

the reference pole plate has a pole plate hole; and the orthographic projection of the first anode on the base substrate overlaps with an orthographic projection of the pole plate hole of the reference pole plate in the first sub-pixel on the base substrate.

9. The electroluminescent display panel according to claim 1, wherein an edge portion of the first anode in the first direction has a first anode size in the second direction;

a middle portion of the first anode in the first direction has a second anode size in the second direction; and the first anode size is smaller than the second anode size.

10. The electroluminescent display panel according to claim 1, wherein an edge portion of the anode in the second sub-pixel in the second direction has a third anode size in the first direction;

a middle portion of the anode in the second sub-pixel in the second direction has a fourth anode size in the first direction; and the third anode size is smaller than the fourth anode size.

11. The electroluminescent display panel according to claim 1, wherein a minimum distance between effective light emitting regions of two sub-pixels with a first light emitting color is a first minimum distance; and a minimum distance between effective light emitting regions of two sub-pixels with a second light emitting color is a second minimum distance, wherein the first minimum distance is smaller than the second minimum distance, and the second light emitting color is any light emitting color other than the first light emitting color.

12. The electroluminescent display panel according to claim 5, wherein the plurality of sub-pixels further comprise third sub-pixels;
- a direction where an auxiliary portion in the first sub-pixel protrudes from a main portion in the first sub-pixel is a first protruding direction;
- a direction where an auxiliary portion in the second sub-pixel protrudes from a main portion in the second sub-pixel is a second protruding direction;
- a direction where an auxiliary portion in the third sub-pixel protrudes from a main portion in the third sub-pixel is a third protruding direction; and
- an angle between the first protruding direction and the third protruding direction is smaller than an angle between the first protruding direction and the second protruding direction.

13. The electroluminescent display panel according to claim 12, wherein a minimum distance between an anode in the first sub-pixel and an anode in the second sub-pixel is smaller than a length of the auxiliary portion in the second sub-pixel.

14. The electroluminescent display panel according to claim 12, wherein a distance between a first hole in the second sub-pixel and a first hole in the third sub-pixel is smaller than a length of an anode in the third sub-pixel in the first direction.

15. The electroluminescent display panel according to claim 5, wherein an overlapping area of orthographic projections of the main portion of the first anode and the first power line on the base substrate is approximately equal to an overlapping area of orthographic projections of the main portion of the first anode and the second power line on the base substrate.

16. The electroluminescent display panel according to claim 5, wherein
- a sum of an overlapping area of orthographic projections of the main portion of the first anode and the first power line on the base substrate and the overlapping area of orthographic projections of the main portion of the first anode and the first data line on the base substrate is a first area sum;
- a sum of an overlapping area of orthographic projections of the main portion of the first anode and the second power line on the base substrate and the overlapping area of orthographic projections of the main portion of the first anode and the second data line on the base substrate is a second area sum; and
- the first area sum is approximately equal to the second area sum.

17. The electroluminescent display panel according to claim 1, wherein
- a sum of an overlapping area of orthographic projections of an effective light emitting region corresponding to the first anode and the first power line on the base substrate and an overlapping area of orthographic projections of the effective light emitting region corresponding to the first anode and the first data line on the base substrate is a third area sum;
- a sum of an overlapping area of orthographic projections of the effective light emitting region corresponding to the first anode and the second power line on the base substrate and an overlapping area of orthographic projections of the effective light emitting region corresponding to the first anode and the second data line on the base substrate is a fourth area sum; and
- the third area sum is approximately equal to the fourth area sum.

18. The electroluminescent display panel according to claim 1, wherein
- an orthographic projection of the anode on the base substrate overlaps with an orthographic projection of a scan signal line on the base substrate, an orthographic projection of a reset control signal line on the base substrate, and an orthographic projection of a reset power signal line on the base substrate respectively;
- the scan signal line is configured to control a threshold compensation transistor in the pixel driving circuit;
- the reset control signal line is configured to control a first reset transistor in the pixel driving circuit; and
- the reset power signal line is configured to provide an initialization voltage.

19. The electroluminescent display panel according to claim 18, wherein
- a second electrode of the first reset transistor is electrically connected to a gate electrode of a driving transistor; and
- the reset power signal line is electrically connected to the gate electrode of the driving transistor through the first reset transistor.

20. The electroluminescent display panel according to claim 19, wherein
- a first connection block arranged on a conductive layer is electrically connected to the gate electrode of the driving transistor and a source electrode region or a drain electrode region of the threshold compensation transistor in the semiconductor layer; and
- the conductive layer is arranged between the anode and the semiconductor layer.

21. The electroluminescent display panel according to claim 20, wherein
- an orthographic projection of the scan signal line on the base substrate overlaps with an orthographic projection of the first connection block on the base substrate.

22. The electroluminescent display panel according to claim 20, wherein
- a second connection block arranged on the conductive layer is electrically connected to the reset power signal line and a source electrode region of the first reset transistor in the semiconductor layer.

23. The electroluminescent display panel according to claim 18, wherein
- the orthographic projection of the reset control signal line on the base substrate is located between the orthographic projection of the scan signal line on the base substrate and the orthographic projection of the reset power signal line on the base substrate.

24. The electroluminescent display panel according to claim 1, wherein
- the power line is electrically connected to a reference pole plate arranged in a reference conductive layer.

25. The electroluminescent display panel according to claim 1, wherein
- at least one film layer is arranged on a side of the first conductive layer away from a layer where the anode is located;
- the power line is electrically connected to a corresponding pixel driving circuit through a connection hole penetrating through the at least one film layer;
- the first anode respectively overlaps with a connection hole corresponding to the first power line and a connection hole corresponding to the second power line; and
- an overlapping area of orthographic projections of the first anode and the connection hole corresponding to the first power line on the base substrate is approximately equal to an overlapping area of orthographic projections of the first anode and the connection hole corresponding to the second power line on the base substrate.

26. The electroluminescent display panel according to claim 5, wherein
the main portion and an effective light emitting region of the first anode overlap with a light emitting control signal line; and
the light emitting control signal line is configured to control light emitting control transistors in the first pixel driving circuit and the second pixel driving circuit.

27. The electroluminescent display panel according to claim 26, wherein
an orthographic projection of the capacitance pole plate on the base substrate is arranged between an orthographic projection of the light emitting control signal line on the base substrate and an orthographic projection of a scan signal line on the base substrate.

28. The electroluminescent display panel according to claim 5, wherein
main portions of anodes in the sub-pixels of at least two colors do not overlap with corresponding capacitance pole plates.

29. The electroluminescent display panel according to claim 28, wherein
the at least two colors are different from a light emitting color of the sub-pixel where the first pixel driving circuit is located.

30. The electroluminescent display panel according to claim 5, wherein
extension directions of auxiliary portions of at least two anodes are different.

31. The electroluminescent display panel according to claim 1, wherein
the anode further comprises a fourth anode;
a size of the fourth anode in the first direction is greater than the size of the fourth anode in the second direction;
the fourth anode overlaps with the first data line, the second data line, the first power line, and the second power line respectively; and
an orthographic projection of an effective light emitting region corresponding to the first anode on the base substrate and an orthographic projection of an effective light emitting region corresponding to the fourth anode on the base substrate do not coincide after translation.

32. The electroluminescent display panel according to claim 31, wherein
an overlapping area of orthographic projections of the fourth anode and the first power line on the base substrate is larger than an overlapping area of orthographic projections of the fourth anode and the second power line on the base substrate.

33. The electroluminescent display panel according to claim 5, wherein
main portions of anodes in the plurality of sub-pixels do not overlap with corresponding anode connection portions.

34. The electroluminescent display panel according to claim 33, wherein
the plurality of sub-pixels comprise green sub-pixels; and anode connection portions in the green sub-pixels do not overlap with main portions of corresponding anodes.

35. The electroluminescent display panel according to claim 34, wherein in each green sub-pixel, the first hole and the main portion of a corresponding anode do not overlap in the first direction, and the first hole and a corresponding effective light emitting region do not overlap in the first direction.

36. The electroluminescent display panel according to claim 35, wherein
first holes in the plurality of sub-pixels are located on a same straight line extending along the first direction; and
orthographic projections of effective light emitting regions corresponding to at least two of the first holes on the base substrate do not coincide after translation.

37. The electroluminescent display panel according to claim 35, wherein
first holes in the plurality of sub-pixels are located on a same straight line extending along the first direction; and
at least two of the first holes and main portions of corresponding anodes do not overlap in the second direction, and the at least two of the first holes and corresponding effective light emitting regions do not overlap in the second direction.

38. The electroluminescent display panel according to claim 34, wherein an auxiliary portion in each green sub-pixel comprises an anode hole arrangement portion and an anode hole connection portion;
the anode hole arrangement portion and the anode hole connection portion are strip-shaped;
the anode hole connection portion is configured to electrically connect with the main portion and the anode hole arrangement portion; and
in each green sub-pixel, an orthographic projection of the first hole on the base substrate is located in an orthographic projection of the anode hole arrangement portion on the base substrate, and a maximum width of the anode hole arrangement portion is greater than a maximum width of the anode hole connection portion.

39. The electroluminescent display panel according to claim 35, wherein the plurality of sub-pixels comprise at least two sub-pixels,
an overlapping area of orthographic projections of an anode and a corresponding capacitance pole plate in one of the at least two sub-pixels on the base substrate is approximately equal to an overlapping area of orthographic projections of an anode and a corresponding capacitance pole plate in another one of the at least two sub-pixels on the base substrate,
orthographic projections of effective light emitting regions corresponding to at least two anodes of the at least two sub-pixels on the base substrate do not coincide after translation.

40. The electroluminescent display panel according to claim 39, wherein the at least two anodes correspond to green sub-pixels.

41. A display device comprising an electroluminescent display panel, wherein the electroluminescent display panel comprises:
a base substrate;
a plurality of sub-pixels,
wherein each sub-pixel comprises a pixel driving circuit comprising a semiconductor layer and a first conductive layer located on the base substrate;
wherein the first conductive layer comprises an anode connection portion, a data line and a power line that are spaced apart from each other; a size of the data line in a second direction is larger than a size of the data line in a first direction, and a size of the power line in the second direction is larger than a size of the power line in the first direction; and the first direction is different from the second direction; and an anode, located on a side of the first conductive layer away from the base substrate, wherein at least one film layer is arranged between a layer where the anode is located and the first conductive layer; and the anode is directly connected to the anode connection portion through a first hole penetrating through the at least one film layer;

wherein, the plurality of sub-pixels comprise first sub-pixels and second sub-pixels, wherein each first sub-pixel comprises a first pixel driving circuit, and each second sub-pixel comprises a second pixel driving circuit;

the first pixel driving circuit comprises a first semiconductor pattern on the semiconductor layer, and the second pixel driving circuit comprises a second semiconductor pattern on the semiconductor layer;

the first pixel driving circuit and the second pixel driving circuit are arranged in the first direction;

the anode comprises a first anode, wherein the first anode is electrically connected to the first pixel driving circuit, and a size of the first anode in the first direction is larger than a size of the first anode in the second direction;

the data line comprises a first data line and a second data line, wherein the first data line is electrically connected to the first pixel driving circuit, and the second data line is electrically connected to the second pixel driving circuit;

the power line comprises a first power line and a second power line, wherein an orthographic projection of the first power line on the base substrate overlaps with an orthographic projection of the first semiconductor pattern on the base substrate, and an orthographic projection of the second power line on the base substrate overlaps with an orthographic projection of the second semiconductor pattern on the base substrate;

the pixel driving circuit comprises a capacitance pole plate, wherein the first pixel driving circuit comprises a first capacitance pole plate, the second pixel driving circuit comprises a second capacitance pole plate, and the first capacitance pole plate and the second capacitance pole plate are arranged on a same layer; and an orthographic projection of the first anode electrically connected to the first pixel driving circuit on the base substrate overlaps with an orthographic projection of the first capacitance pole plate on the base substrate, an orthographic projection of the second capacitance pole plate on the base substrate, an orthographic projection of the first data line on the base substrate, an orthographic projection of the second data line on the base substrate, the orthographic projection of the first power line on the base substrate, and the orthographic projection of the second power line on the base substrate respectively; and an overlapping area of orthographic projections of the first anode and the first capacitance pole plate on the base substrate is larger than an overlapping area of orthographic projections of the first anode and the second capacitance pole plate on the base substrate.

* * * * *